(12) United States Patent
Yamazaki et al.

(10) Patent No.: US 10,069,014 B2
(45) Date of Patent: Sep. 4, 2018

(54) SEMICONDUCTOR DEVICE AND MANUFACTURING METHOD THEREOF

(71) Applicant: Semiconductor Energy Laboratory Co., Ltd., Atsugi-shi, Kanagawa-ken (JP)

(72) Inventors: Shunpei Yamazaki, Setagaya (JP); Teruyuki Fujii, Atsugi (JP); Sho Nagamatsu, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 309 days.

(21) Appl. No.: 14/492,559

(22) Filed: Sep. 22, 2014

(65) Prior Publication Data

US 2015/0008430 A1    Jan. 8, 2015

Related U.S. Application Data

(62) Division of application No. 13/355,950, filed on Jan. 23, 2012, now Pat. No. 8,865,555.

(30) Foreign Application Priority Data

Jan. 26, 2011 (JP) .................................. 2011-014620

(51) Int. Cl.
*H01L 23/00* (2006.01)
*H01L 29/36* (2006.01)
(Continued)

(52) U.S. Cl.
CPC ........ *H01L 29/7869* (2013.01); *H01L 23/564* (2013.01); *H01L 29/36* (2013.01);
(Continued)

(58) Field of Classification Search
CPC ......... H01L 2924/0002; H01L 2924/00; H01L 23/564; H01L 29/36; H01L 29/66742;
(Continued)

(56) References Cited

U.S. PATENT DOCUMENTS 5,528,032 A    6/1996  Uchiyama
5,731,856 A    3/1998  Kim et al.
(Continued)

FOREIGN PATENT DOCUMENTS

CN    001655365 A    8/2005
EP    1209748 A    5/2002
(Continued)

OTHER PUBLICATIONS

Taiwanese Office Action (Application No. 101102035) dated Mar. 18, 2016.
(Continued)

*Primary Examiner* — Tom Thomas
*Assistant Examiner* — Benjamin Tzu-Hung Liu
(74) *Attorney, Agent, or Firm* — Robinson Intellectual Property Law Office; Eric J. Robinson

(57) ABSTRACT

A base insulating film is formed over a substrate. A first oxide semiconductor film is formed over the base insulating film, and then first heat treatment is performed to form a second oxide semiconductor film. Then, selective etching is performed to form a third oxide semiconductor film. An insulating film is formed over the first insulating film and the third oxide semiconductor film. A surface of the insulating film is polished to expose a surface of the third oxide semiconductor film, so that a sidewall insulating film is formed in contact with at least a side surface of the third oxide semiconductor film. Then, a source electrode and a drain electrode are formed over the sidewall insulating film and the third oxide semiconductor film. A gate insulating film and a gate electrode are formed.

21 Claims, 30 Drawing Sheets

(51) Int. Cl.
*H01L 29/786* (2006.01)
*H01L 29/66* (2006.01)

(52) U.S. Cl.
CPC .. *H01L 29/66742* (2013.01); *H01L 29/66969* (2013.01); *H01L 29/78606* (2013.01); *H01L 29/78621* (2013.01); *H01L 2924/0002* (2013.01)

(58) Field of Classification Search
CPC ......... H01L 29/66969; H01L 29/78606; H01L 29/78621; H01L 29/7869
See application file for complete search history.

(56) References Cited

U.S. PATENT DOCUMENTS

| | | | |
|---|---|---|---|
| 5,744,864 A | 4/1998 | Cillessen et al. | |
| 5,913,111 A * | 6/1999 | Kataoka | H01L 21/3003 257/E21.212 |
| 6,242,788 B1 | 6/2001 | Mizuo | |
| 6,294,274 B1 | 9/2001 | Kawazoe et al. | |
| 6,350,655 B2 | 2/2002 | Mizuo | |
| 6,515,336 B1 * | 2/2003 | Suzawa | G02F 1/13454 257/347 |
| 6,563,174 B2 | 5/2003 | Kawasaki et al. | |
| 6,727,522 B1 | 4/2004 | Kawasaki et al. | |
| 6,878,606 B2 | 4/2005 | Ohnishi et al. | |
| 7,029,988 B2 | 4/2006 | Ohnishi et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,317,230 B2 | 1/2008 | Lee et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,598,520 B2 | 10/2009 | Hirao et al. | |
| 7,674,650 B2 | 3/2010 | Akimoto et al. | |
| 7,732,819 B2 | 6/2010 | Akimoto et al. | |
| 7,804,091 B2 | 9/2010 | Takechi et al. | |
| 7,821,002 B2 | 10/2010 | Yamazaki et al. | |
| 7,884,360 B2 | 2/2011 | Takechi et al. | |
| 7,910,490 B2 | 3/2011 | Akimoto et al. | |
| 7,932,521 B2 | 4/2011 | Akimoto et al. | |
| 7,993,964 B2 | 8/2011 | Hirao et al. | |
| 8,003,981 B2 | 8/2011 | Iwasaki et al. | |
| 8,193,045 B2 * | 6/2012 | Omura | H01L 29/78618 257/288 |
| 8,202,365 B2 | 6/2012 | Umeda et al. | |
| 8,232,124 B2 | 7/2012 | Takechi et al. | |
| 8,247,811 B2 | 8/2012 | Morosawa et al. | |
| 8,329,506 B2 | 12/2012 | Akimoto et al. | |
| 8,343,800 B2 | 1/2013 | Umeda et al. | |
| 8,420,442 B2 | 4/2013 | Takechi et al. | |
| 8,586,979 B2 | 11/2013 | Son et al. | |
| 8,643,011 B2 | 2/2014 | Akimoto et al. | |
| 8,785,240 B2 | 7/2014 | Watanabe | |
| 8,889,480 B2 | 11/2014 | Takechi et al. | |
| 8,936,963 B2 | 1/2015 | Ohara et al. | |
| 8,980,733 B2 | 3/2015 | Yamazaki et al. | |
| 9,012,918 B2 | 4/2015 | Yamazaki et al. | |
| 9,082,857 B2 | 7/2015 | Yamazaki et al. | |
| 9,209,026 B2 | 12/2015 | Takechi et al. | |
| 9,252,288 B2 | 2/2016 | Akimoto et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0020118 A1 * | 1/2003 | Kajiwara | H01L 27/1214 257/347 |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0281400 A1 * | 12/2007 | Yamazaki | H01L 21/28273 438/151 |
| 2007/0287296 A1 | 12/2007 | Chang | |
| 2008/0006877 A1 | 1/2008 | Mardilovich et al. | |
| 2008/0035933 A1 | 2/2008 | Nagata et al. | |
| 2008/0038882 A1 | 2/2008 | Takechi et al. | |
| 2008/0038884 A1 * | 2/2008 | Hwang | H01L 27/1255 438/155 |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0099803 A1 * | 5/2008 | Li | B82Y 10/00 257/291 |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0179675 A1 * | 7/2008 | Yamazaki | H01L 29/42384 257/347 |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0308796 A1 | 12/2008 | Akimoto et al. | |
| 2008/0308805 A1 | 12/2008 | Akimoto et al. | |
| 2008/0308806 A1 | 12/2008 | Akimoto et al. | |
| 2009/0008639 A1 | 1/2009 | Akimoto et al. | |
| 2009/0068773 A1 | 3/2009 | Lai et al. | |
| 2009/0073325 A1 | 3/2009 | Kuwabara et al. | |
| 2009/0108294 A1 | 4/2009 | Choi et al. | |
| 2009/0114910 A1 | 5/2009 | Chang | |

(56) References Cited

U.S. PATENT DOCUMENTS

| | | |
|---|---|---|
| 2009/0127552 A1 | 5/2009 | Li et al. |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0133533 A1 | 6/2010 | Umezaki |
| 2010/0136743 A1 | 6/2010 | Akimoto et al. |
| 2010/0155721 A1 | 6/2010 | Lee et al. |
| 2010/0159639 A1 | 6/2010 | Sakata |
| 2010/0224878 A1 | 9/2010 | Kimura |
| 2010/0295037 A1 | 11/2010 | Hironaka |
| 2011/0006301 A1 | 1/2011 | Yamazaki et al. |
| 2011/0012118 A1 | 1/2011 | Yamazaki et al. |
| 2011/0024740 A1 | 2/2011 | Yamazaki et al. |
| 2011/0024750 A1 | 2/2011 | Yamazaki et al. |
| 2011/0024751 A1 | 2/2011 | Yamazaki et al. |
| 2011/0027980 A1 | 2/2011 | Yamazaki et al. |
| 2011/0031491 A1 | 2/2011 | Yamazaki et al. |
| 2011/0037068 A1 | 2/2011 | Yamazaki et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0163311 A1 | 7/2011 | Akimoto et al. |
| 2011/0256684 A1 | 10/2011 | Iwasaki et al. |
| 2012/0049281 A1* | 3/2012 | Tsuchiya ........... H01L 29/66795 257/347 |
| 2012/0175609 A1 | 7/2012 | Yamazaki |
| 2015/0214379 A1 | 7/2015 | Yamazaki et al. |
| 2015/0303280 A1 | 10/2015 | Yamazaki et al. |

FOREIGN PATENT DOCUMENTS

| | | |
|---|---|---|
| EP | 1737044 A | 12/2006 |
| EP | 1850374 A | 10/2007 |
| EP | 2086013 A | 8/2009 |
| EP | 2159845 A | 3/2010 |
| EP | 2226847 A | 9/2010 |
| EP | 2259294 A | 12/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 11-307627 A | 11/1999 |
| JP | 2000-044236 A | 2/2000 |
| JP | 2000-150900 A | 5/2000 |
| JP | 2001-044443 A | 2/2001 |
| JP | 2002-076356 A | 3/2002 |
| JP | 2002-289859 A | 10/2002 |
| JP | 2003-050405 A | 2/2003 |
| JP | 2003-086000 A | 3/2003 |
| JP | 2003-086808 A | 3/2003 |
| JP | 2004-039831 A | 2/2004 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2007-250983 A | 9/2007 |
| JP | 2008-040343 A | 2/2008 |
| JP | 2008-042088 A | 2/2008 |
| JP | 2008-103666 A | 5/2008 |
| JP | 2008-281988 A | 11/2008 |
| JP | 2009-099847 A | 5/2009 |
| JP | 2009-167087 A | 7/2009 |
| JP | 2009-224479 A | 10/2009 |
| JP | 2010-080952 A | 4/2010 |
| JP | 2010-153802 A | 7/2010 |
| JP | 2010-182818 A | 8/2010 |
| JP | 2010-232651 A | 10/2010 |
| JP | 2010-239131 A | 10/2010 |
| JP | 2010-251735 A | 11/2010 |
| JP | 2010-272663 A | 12/2010 |
| JP | 2011-003856 A | 1/2011 |
| KR | 2008-0013804 A | 2/2008 |
| KR | 2008-0052107 A | 6/2008 |
| KR | 2008-0066678 A | 7/2008 |
| KR | 2009-0084642 A | 8/2009 |
| TW | 200812089 | 3/2008 |
| TW | 200915577 | 4/2009 |
| WO | WO-2004/114391 | 12/2004 |
| WO | WO-2007/119386 | 10/2007 |
| WO | WO-2007/142167 | 12/2007 |
| WO | WO-2008/126879 | 10/2008 |
| WO | WO-2008/149873 | 12/2008 |

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Dembo.H et al., "RFCPUs on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8,9, and 16) in the $In_2O_3$—$ZnGa_2O_4$—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

(56) References Cited

OTHER PUBLICATIONS

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Tsuda.K et al., "Ultra Low Power Consumption Technologies for Mobile TFT-LCDs", IDW '02 : Proceedings of the 9th International Display Workshops, Dec. 4, 2002, pp. 295-298.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUs on Flexible and Glass Substrates for Secure RFID Systems", Journal of Solid-State Circuits , 2008, vol. 43, No. 1, pp. 292-299.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transistion:The "Blue Phase"", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AM-OLED Driven by PEALD Grown ZnO TFT", IMID '07 Digest, 2007, pp. 1249-1252.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17- 22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Application", SID Digest '09 : SID International Symposium Digest of Technical Papers, May 31, 2009, pp. 578-581.
Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED ", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Nakamura.M, "Synthesis of Homologous Compound with New Long-Period Structure", NIRIM Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N et al., "Spinel, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures over 1000° C."Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

(56) References Cited

OTHER PUBLICATIONS

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study", Phys. Rev. B. (Phyiscal Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Korean Office Action (Application No. 2012-0007150) dated Apr. 19, 2018.

\* cited by examiner

»
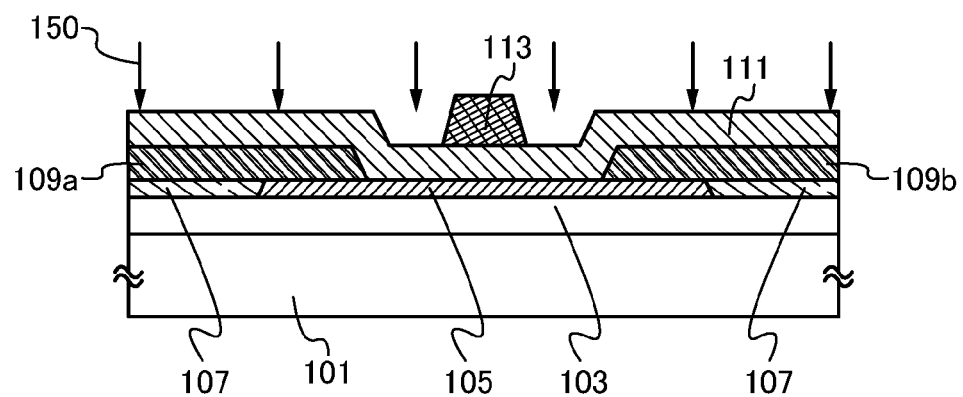
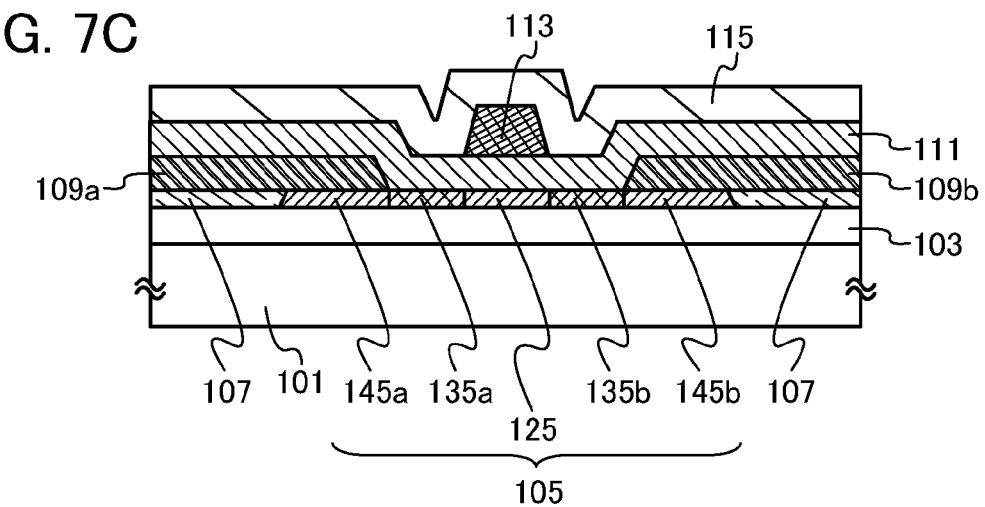

130

200

300

400

FIG. 24A
FIG. 24B
FIG. 24C
FIG. 24D
FIG. 24E
FIG. 24F
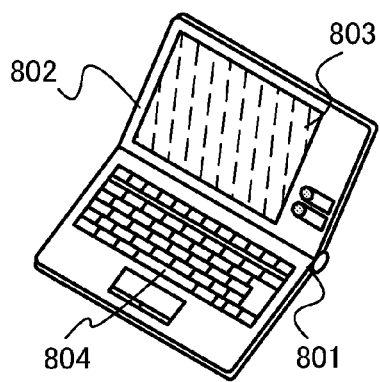
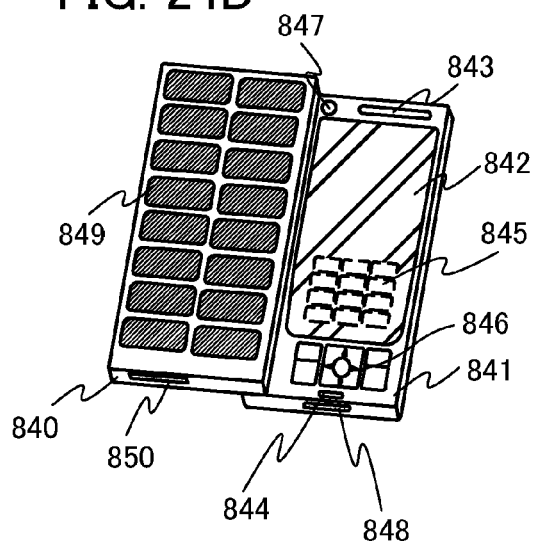
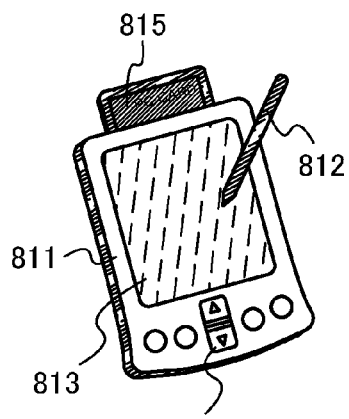
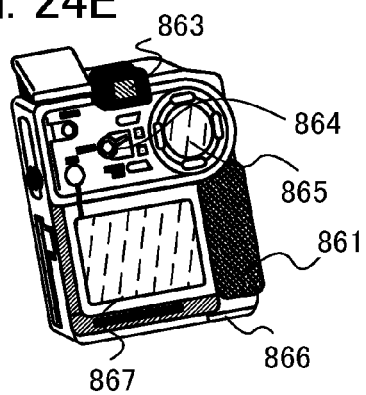
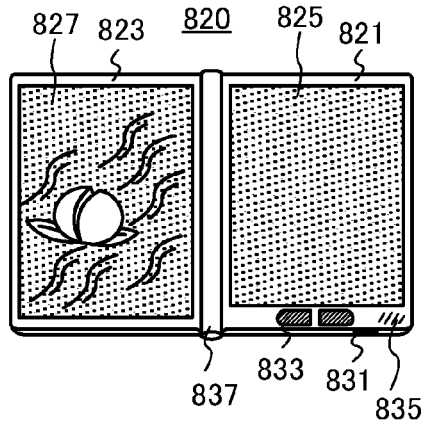
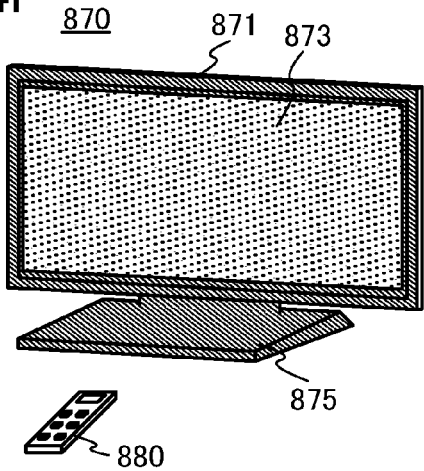

SEMICONDUCTOR DEVICE AND MANUFACTURING METHOD THEREOF

BACKGROUND OF THE INVENTION

1. Field of the Invention

The present invention relates to a semiconductor device formed using an oxide semiconductor and a method for manufacturing the semiconductor device.

In this specification, a semiconductor device refers to all the devices that operate by utilizing semiconductor characteristics. A transistor in this specification is a semiconductor device, and a display device, a semiconductor circuit, and an electronic device including the transistor are all semiconductor devices.

2. Description of the Related Art

Transistors used for most flat panel displays typified by a liquid crystal display device and a light-emitting display device are formed using silicon semiconductors such as amorphous silicon, single crystal silicon, and polycrystalline silicon provided over glass substrates. Further, transistors formed using such silicon semiconductors are used in integrated circuits (ICs) and the like.

Attention has been directed to a technique in which, instead of the above silicon semiconductors, metal oxides exhibiting semiconductor characteristics are used for transistors. Note that in this specification, a metal oxide exhibiting semiconductor characteristics is referred to as an oxide semiconductor.

For example, a technique is disclosed in which a transistor is formed using zinc oxide or an In—Ga—Zn-based metal oxide as an oxide semiconductor and such a transistor is used as a switching element or the like in a pixel of a display device (see Patent Documents 1 and 2).

It is pointed out that hydrogen contained in an oxide semiconductor serves as a carrier supply source. Therefore, some measures need to be taken to prevent hydrogen from entering the oxide semiconductor at the time of depositing the oxide semiconductor. Further, shift of the threshold voltage of a transistor formed using an oxide semiconductor is suppressed by reducing the amount of hydrogen contained in not only the oxide semiconductor but also a gate insulating film in contact with the oxide semiconductor (see Patent Document 3).

REFERENCE

Patent Document

[Patent Document 1] Japanese Published Patent Application No. 2007-123861
[Patent Document 2] Japanese Published Patent Application No. 2007-096055
[Patent Document 3] Japanese Published Patent Application No. 2009-224479

SUMMARY OF THE INVENTION

Moreover, as a carrier supply source other than hydrogen contained in an oxide semiconductor, oxygen deficiency in the oxide semiconductor can be given. Part of the oxygen deficiency serves as a donor to generate an electron that is a carrier in the oxide semiconductor. Therefore, in a semiconductor device formed using an oxide semiconductor, oxygen deficiency in the oxide semiconductor including a channel formation region generates an electron therein and thus is a factor in causing negative shift of the threshold voltage of the semiconductor device.

When side surfaces of an oxide semiconductor are processed into a desired shape in order to manufacture a semiconductor device in which the oxide semiconductor is used, the side surfaces of the oxide semiconductor are exposed to a reduced-pressure atmosphere or a reducing atmosphere in a reaction chamber while they are in an active state. Therefore, oxygen is extracted from the side surfaces of the oxide semiconductor to the reaction chamber and oxygen deficiency is caused. Part of the oxygen deficiency decreases the resistance of a region where the oxygen deficiency exists as a donor, which causes leakage current between a source electrode and a drain electrode.

In view of the foregoing, an object of one embodiment of the present invention is to provide a semiconductor device having electric characteristics which are favorable and less likely to fluctuate.

In order to achieve the above object, a semiconductor device is manufactured in a process in which oxygen deficiency in an oxide semiconductor including a channel formation region is reduced.

In one embodiment of the present invention, a first insulating film is formed over a substrate; a first oxide semiconductor film is formed over the first insulating film; a second oxide semiconductor film is formed by performing heat treatment after the first oxide semiconductor film is formed; a third oxide semiconductor film is formed by selectively etching the second oxide semiconductor film; a second insulating film is formed over the first insulating film and the third oxide semiconductor film; a third insulating film is formed in contact with at least a side surface of the third oxide semiconductor film by polishing a surface of the second insulating film so that a surface of the third oxide semiconductor film is exposed; a conductive film is formed over the third insulating film and the third oxide semiconductor film; a source electrode and a drain electrode are formed by selectively etching the conductive film; a fourth insulating film is formed over the third oxide semiconductor film, the source electrode, and the drain electrode; and a gate electrode overlapping with the third oxide semiconductor film is formed over the fourth insulating film.

In the above, when the second oxide semiconductor film is selectively etched, part of the first insulating film may also be selectively etched so as to have a projection in a region where the first insulating film is in contact with the third oxide semiconductor film.

In the above, the second insulating film can be formed by stacking two or more different insulating films. In this case, the third insulating film formed by polishing the surface of the second insulating film also has a stacked-layer structure.

In the above, in the case where the second insulating film is formed using two or more different insulating films, the third insulating film may be formed in such a manner that part of the second insulating film is polished so that a surface of the insulating film in contact with the third oxide semiconductor film is exposed, and the polished second insulating film is anisotropically etched so that the surface of the third oxide semiconductor film is exposed.

In the above, after the gate electrode is formed, a dopant may be added to the third oxide semiconductor film and heating may be performed. In this manner, a first oxide semiconductor region overlapping with the gate electrode, a pair of second oxide semiconductor regions between which the first oxide semiconductor region is sandwiched, and a pair of third oxide semiconductor regions which is provided in regions overlapping with the source electrode and the drain electrode can be formed in a self-aligned manner.

Since the dopant is added to the third oxide semiconductor film with the use of the gate electrode, the source electrode, and the drain electrode as masks, regions to which the dopant is added serve as the pair of second oxide semiconductor regions. Note that the dopant may be one or more of nitrogen, phosphorus, arsenic, hydrogen, helium, neon, argon, krypton, and xenon.

Further, regions having a small thickness are formed at side edges of the source electrode and the drain electrode, whereby after the gate electrode is formed, the dopant can be added to portions of the third oxide semiconductor film, which overlap with the regions having the small thickness. In addition, two kinds of regions having different dopant concentrations can be formed in the third oxide semiconductor film.

In another embodiment of the present invention, a first insulating film is formed over a substrate; a first oxide semiconductor film is formed over the first insulating film; a second oxide semiconductor film is formed by performing heat treatment after the first oxide semiconductor film is formed; a third oxide semiconductor film is formed by selectively etching the second oxide semiconductor film; a second insulating film is formed over the first insulating film and the third oxide semiconductor film; a third insulating film is formed by polishing a surface of the second insulating film so that a surface of the third oxide semiconductor film is exposed; a conductive film is formed over the third insulating film and the third oxide semiconductor film; a resist mask is formed over the conductive film; a pair of conductive films is formed by selectively etching the conductive film with the use of the resist mask; a second resist mask is formed and at least part of regions which are in the pair of conductive films and overlap with the third oxide semiconductor film is exposed by shrinking the resist mask; a source electrode and a drain electrode which each include a region having a first thickness and a region having a second thickness that is smaller than the first thickness are formed by etching part of the pair of conductive films with the use of the second resist mask; a fourth insulating film is formed over the third oxide semiconductor film, the source electrode, and the drain electrode; a gate electrode overlapping with the third oxide semiconductor film is formed over the fourth insulating film; and a first oxide semiconductor region overlapping with the gate electrode, a pair of second oxide semiconductor regions between which the first oxide semiconductor region is sandwiched, a pair of third oxide semiconductor regions overlapping with at least the regions having the first thickness, and a pair of fourth oxide semiconductor regions overlapping with the regions having the second thickness are formed by adding a dopant to the third oxide semiconductor film and performing heating.

Also in the above, when the second oxide semiconductor film is selectively etched, part of the first insulating film can also be selectively etched so as to have a projection in a region where the first insulating film is in contact with the third oxide semiconductor film.

Also in the above, the second insulating film can be formed by stacking two or more different insulating films. In this case, the third insulating film formed by polishing the surface of the second insulating film also has a stacked-layer structure.

Also in the another embodiment of the present invention, in the case where the second insulating film is formed using two or more different insulating films, the third insulating film may be formed in such a manner that part of the second insulating film is polished so that a surface of the insulating film in contact with the third oxide semiconductor film is exposed, and the polished second insulating film is anisotropically etched so that the surface of the third oxide semiconductor film is exposed.

In the another embodiment of the present invention, regions to which the dopant is added serve as the pair of second oxide semiconductor regions and the pair of fourth oxide semiconductor regions overlapping with only the regions having the second thickness, which are at side edges of the source electrode and the drain electrode. Note that the dopant may be one or more of nitrogen, phosphorus, arsenic, hydrogen, helium, neon, argon, krypton, and xenon.

In the above, at least one of the first to fourth insulating films may be formed using an oxide insulating film from which part of oxygen is released by heating; for example, an oxide insulating film containing more oxygen than the stoichiometric proportion may be formed.

In the above, the heat treatment is performed at a temperature at which hydrogen is released from the first oxide semiconductor film and oxygen contained in the first insulating film is diffused to the first oxide semiconductor film so that the second oxide semiconductor film is formed. For example, the temperature of the heat treatment is higher than or equal to 150° C. and lower than a strain point of the substrate.

In the above, the first to third oxide semiconductor films contain one or more elements selected from In, Ga, Sn, and Zn.

In the above, each of the first to third oxide semiconductor films is a non-single-crystal and includes a c-axis aligned crystalline region.

In the above, after the third oxide semiconductor film is formed, heat treatment may be further performed. Note that by the heat treatment, hydrogen is released from the third oxide semiconductor film and oxygen contained in the first insulating film and the third insulating film is diffused to the third oxide semiconductor film, so that a fourth oxide semiconductor film is formed.

A fifth insulating film may be formed over the fourth insulating film and the gate electrode, and then heat treatment may be further performed.

According to one embodiment of the present invention, a semiconductor device having electric characteristics which are favorable and less likely to fluctuate can be manufactured.

According to one embodiment of the present invention, a semiconductor device can be manufactured while oxygen sufficiently exists on side surfaces of an oxide semiconductor.

According to one embodiment of the present invention, a semiconductor device in which the amount of oxygen deficiency in an oxide semiconductor is sufficiently small and leakage current between a source electrode and a drain electrode is suppressed can be manufactured.

BRIEF DESCRIPTION OF THE DRAWINGS

In the accompanying drawings:

FIGS. 7A to 7C are cross-sectional views which illustrate an example of a method for manufacturing a semiconductor device according to one embodiment of the present invention;

FIGS. 24A to 24F are perspective views which illustrate examples of electronic devices each including a semiconductor device according to one embodiment of the present invention;

DETAILED DESCRIPTION OF THE INVENTION

Figure 1A:
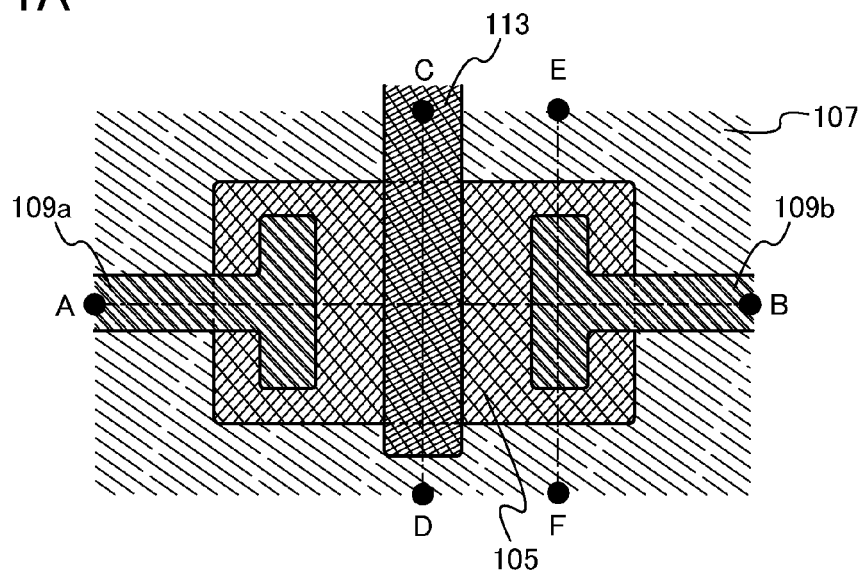
FIGS. 1A to 1D are a top view and cross-sectional views which illustrate an example of a semiconductor device according to one embodiment of the present invention.

Embodiments of the present invention will be described in detail with reference to the accompanying drawings. Note that the present invention is not limited to the description below, and it is easily understood by those skilled in the art that a variety of modifications can be made to the modes and details without departing from the spirit and scope of the present invention. Therefore, the present invention should not be construed as being limited to the description in the following embodiments. Note that in the structures of the present invention described below, the same portions or portions having similar functions are denoted by the same reference numerals in common in different drawings and repetitive description thereof will be omitted.

Note that in each drawing described in this specification, the size, the film thickness, or the region of each component is exaggerated for clarity in some cases. Therefore, embodiments of the present invention are not limited to such scales.

In this specification, the term "film" is used to denote the one which is entirely formed over a surface by a CVD method (including a plasma CVD method and the like), a sputtering method, or the like and the one which is entirely formed over a surface and is then subjected to treatment in a manufacturing process of a semiconductor device.

Note that terms such as "first", "second", and "third" in this specification are used in order to avoid confusion among components, and the terms do not limit the components numerically. Therefore, for example, the term "first" can be replaced with the term "second", "third", or the like as appropriate.

Note that in this specification, "on-state current" is current which flows between a source and a drain when a transistor is in a conducting state. For example, in the case of an n-channel thin film transistor, the on-state current is current which flows between a source and a drain when the gate voltage of the transistor is higher than the threshold voltage thereof. In addition, "off-state current" is current which flows between a source and a drain when a transistor is in a non-conducting state. For example, in the case of an n-channel thin film transistor, the off-state current is current which flows between a source and a drain when the gate voltage of the transistor is lower than the threshold voltage thereof. Note that "gate voltage" refers to a potential difference between a source and a gate when the potential of the source is used as a reference potential.

Functions of a "source" and a "drain" are sometimes replaced with each other when the direction of current flow is changed in circuit operation, for example. Therefore, the terms "source" and "drain" can be used to denote the drain and the source, respectively, in this specification.

Embodiment 1

In this embodiment, a semiconductor device which is one embodiment of the present invention and a method for manufacturing the semiconductor device will be described. Specifically, a transistor will be described as the semiconductor device.

Figure 1B:
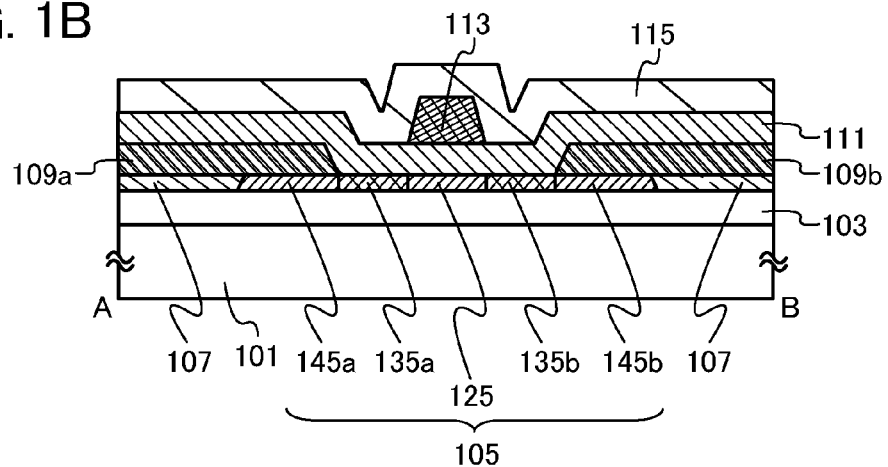
Figure 1C:
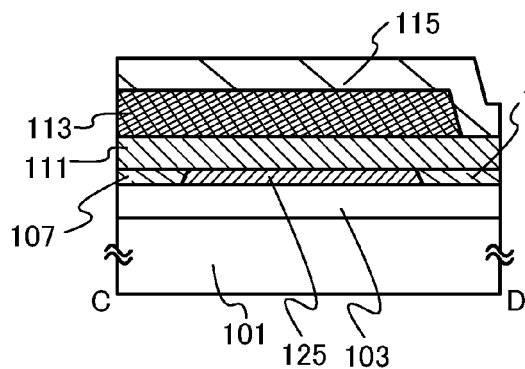
Figure 1D:
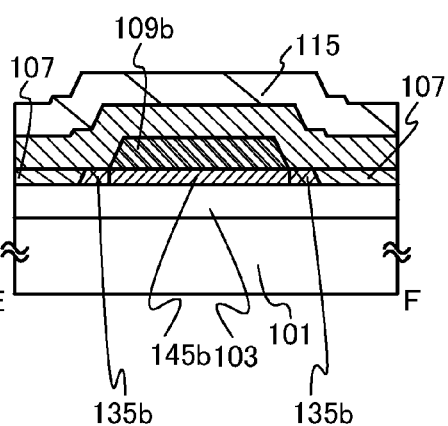

FIG. 1A is a top view illustrating a structure of a transistor 100 which is one embodiment of the present invention. FIG. 1B corresponds to a cross-sectional view along dashed-dotted line A-B in FIG. 1A. FIG. 1C corresponds to a cross-sectional view along dashed-dotted line C-D in FIG. 1A. FIG. 1D corresponds to a cross-sectional view along dashed-dotted line E-F in FIG. 1A. Note that a base insulating film 103, a gate insulating film 111, and a protective insulating film 115 are not illustrated in FIG. 1A for clarity.

In FIGS. 1A to 1D, the transistor 100 includes a substrate 101; the base insulating film 103 provided over the substrate 101; an oxide semiconductor film 105 provided over the base insulating film 103; a sidewall insulating film 107 which is provided over the base insulating film 103 and in contact with at least side surfaces of the oxide semiconductor film 105; a source electrode 109a and a drain electrode 109b which are provided over the oxide semiconductor film 105 and the sidewall insulating film 107; the gate insulating film 111 covering part of the oxide semiconductor film 105, the source electrode 109a, and the drain electrode 109b; and a gate electrode 113 which is over the gate insulating film 111 and overlaps with the oxide semiconductor film 105. That is, the transistor 100 has a top-gate top-contact structure.

Further, in the transistor 100, the oxide semiconductor film 105 includes a region to which a dopant is added and a region to which the dopant is not added. Specifically, the oxide semiconductor film 105 includes a first oxide semiconductor region 125 overlapping with the gate electrode 113, a pair of second oxide semiconductor regions 135a and 135b, and a pair of third oxide semiconductor regions 145a and 145b overlapping with the source electrode 109a and the drain electrode 109b. The pair of second oxide semiconductor regions 135a and 135b is provided with the first oxide semiconductor region 125 sandwiched therebetween. The pair of third oxide semiconductor regions 145a and 145b is provided in contact with side surfaces of the pair of second oxide semiconductor regions 135a and 135b. In addition, a dopant is added to the pair of second oxide semiconductor regions 135a and 135b, whereas the dopant is not added to the first oxide semiconductor region 125 and the pair of third oxide semiconductor regions 145a and 145b.

Since the dopant is added to the pair of second oxide semiconductor regions 135a and 135b, the pair of second oxide semiconductor regions 135a and 135b is referred to as lightly doped drain (LDD) regions in this specification. In the transistor 100, a region where a channel is formed is the first oxide semiconductor region 125 overlapping with the gate electrode 113, and the pair of third oxide semiconductor regions 145a and 145b serves as a source region and a drain region.

The transistor 100 may have a structure in which the protective insulating film 115 covering the gate insulating film 111 and the gate electrode 113 is additionally provided (see FIGS. 1B to 1D).

Figure 2A:
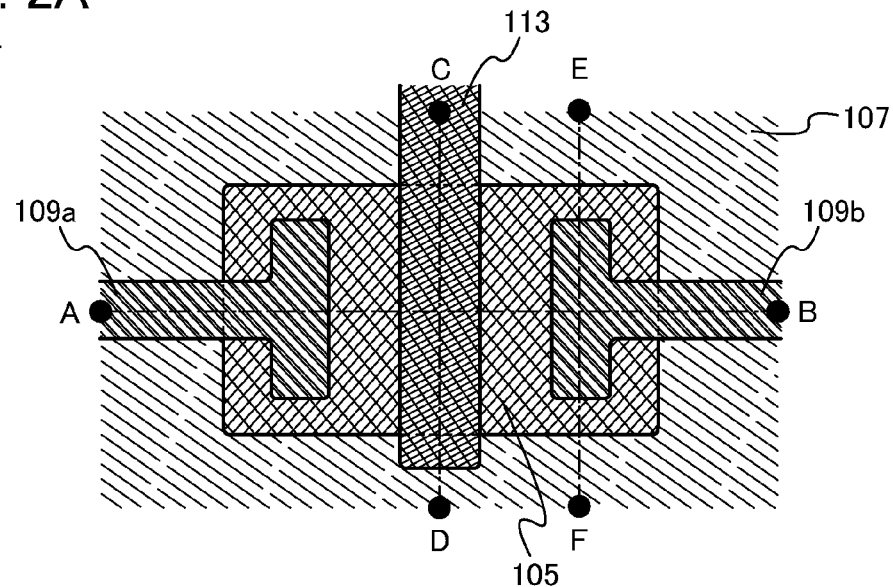
FIGS. 2A to 2D are a top view and cross-sectional views which illustrate an example of a semiconductor device according to one embodiment of the present invention.
Figure 2B:
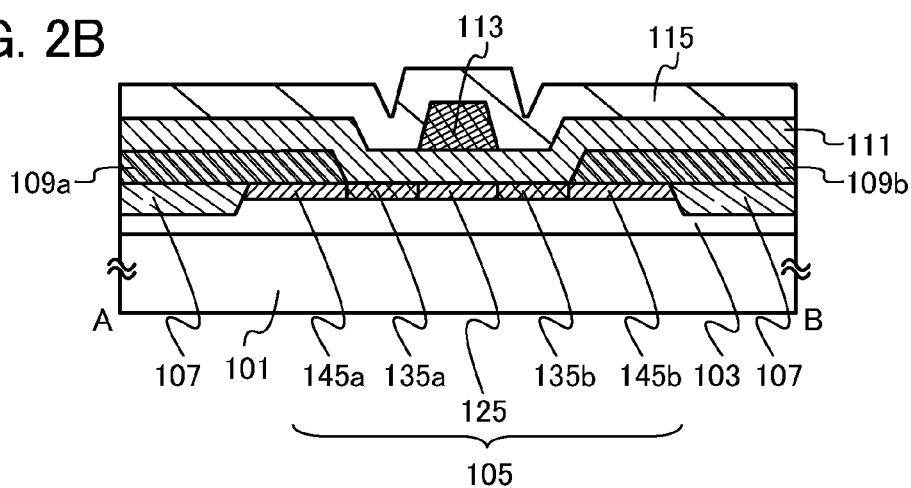
Figures 2C, 2D:
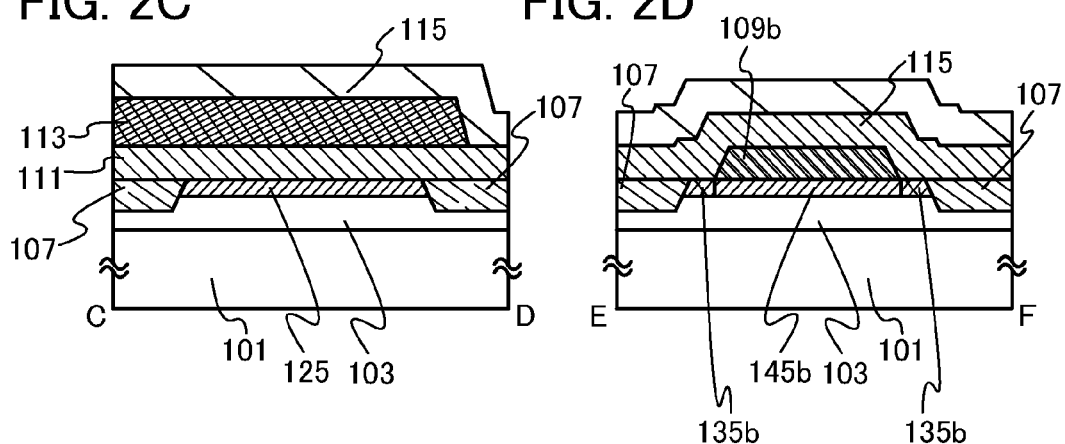

Next, a transistor 110 which is a modification example of the transistor 100 will be described. FIG. 2A is a top view illustrating a structure of the transistor 110. FIG. 2B corresponds to a cross-sectional view along dashed-dotted line A-B in FIG. 2A. FIG. 2C corresponds to a cross-sectional view along dashed-dotted line C-D in FIG. 2A. FIG. 2D corresponds to a cross-sectional view along dashed-dotted line E-F in FIG. 2A. Note that the base insulating film 103, the gate insulating film 111, and the protective insulating film 115 are not illustrated in FIG. 2A for clarity.

In FIGS. 2A to 2D, the shape of the base insulating film 103 of the transistor 110 is different from that of the transistor 100. The base insulating film 103 of the transistor 110 has a projection in a region where the base insulating film 103 is in contact with the oxide semiconductor film 105. Therefore, the sidewall insulating film 107 of the transistor 110 is provided over the base insulating film 103 and in contact with at least side surfaces of the oxide semiconductor film 105 and side surfaces of the projection of the base insulating film 103. The other components of the transistor 110 are similar to those of the transistor 100.

Figure 3A:
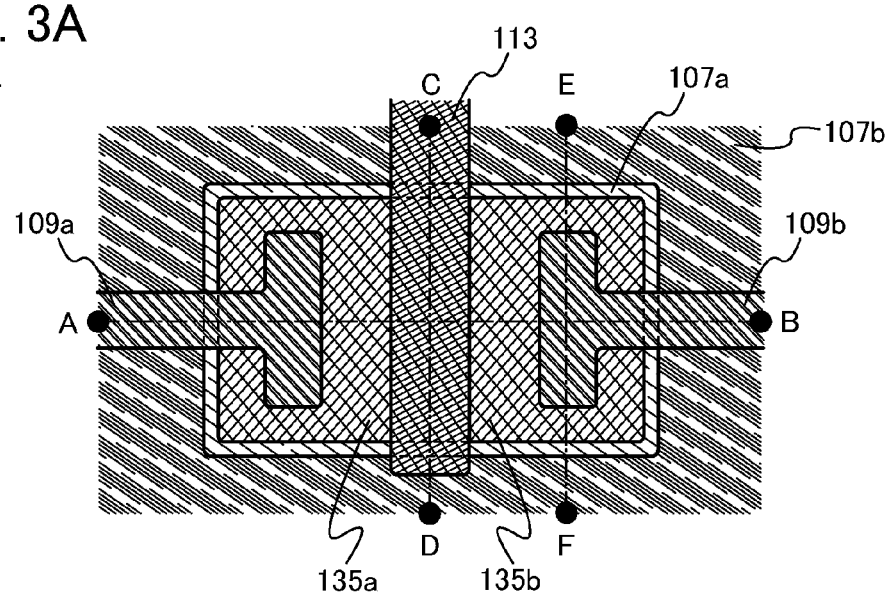
FIGS. 3A to 3D are a top view and cross-sectional views which illustrate an example of a semiconductor device according to one embodiment of the present invention.
Figure 3B:
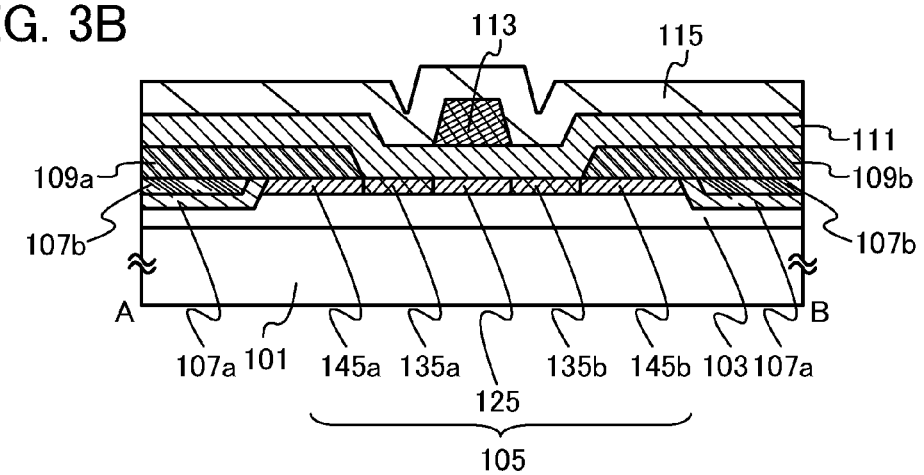
Figure 3C:
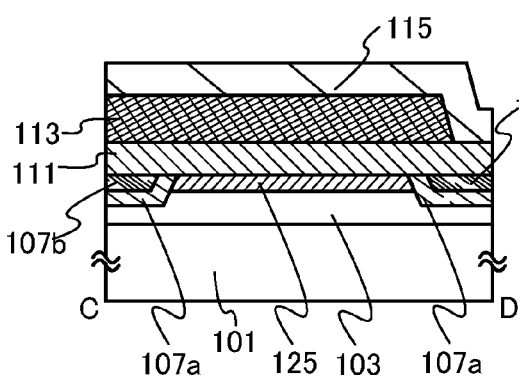
Figure 3D:
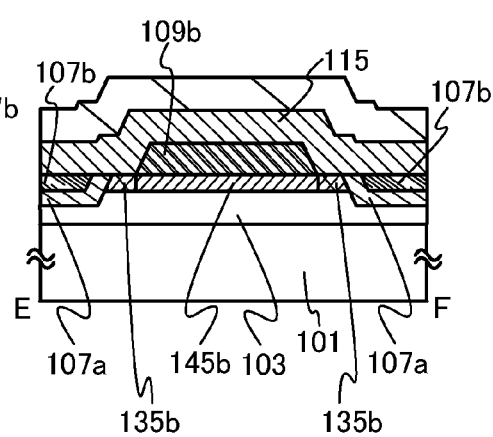

Next, a transistor 130 which is a modification example of the transistor 100 will be described. FIG. 3A is a top view illustrating a structure of the transistor 130. FIG. 3B corresponds to a cross-sectional view along dashed-dotted line A-B in FIG. 3A. FIG. 3C corresponds to a cross-sectional view along dashed-dotted line C-D in FIG. 3A. FIG. 3D corresponds to a cross-sectional view along dashed-dotted line E-F in FIG. 3A. Note that the base insulating film 103, the gate insulating film 111, and the protective insulating film 115 are not illustrated in FIG. 3A for clarity.

In FIGS. 3A to 3D, the shape of the base insulating film 103 of the transistor 130 is different from that of the transistor 100 as in the case of the transistor 110, and the base insulating film 103 of the transistor 130 has a projection in a region where the base insulating film 103 is in contact with the oxide semiconductor film 105. Further, the transistor 130 is provided with sidewall insulating films 107a and 107b which are formed by stacking two or more different insulating films. The sidewall insulating film 107a is provided over the base insulating film 103 and in contact with at least side surfaces of the oxide semiconductor film 105 and side surfaces of the projection of the base insulating film 103. The sidewall insulating film 107b is provided in contact with the sidewall insulating film 107a. Note that the other components of the transistor 130 are similar to those of the transistor 100.

Figure 25A:
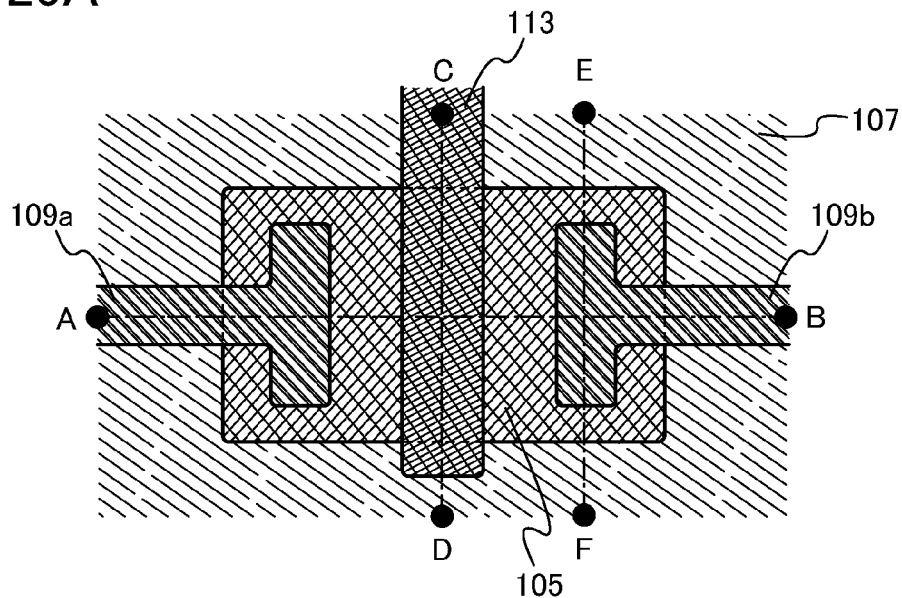
FIGS. 25A to 25D are a top view and cross-sectional views which illustrate an example of a semiconductor device according to one embodiment of the present invention.
Figure 25B:
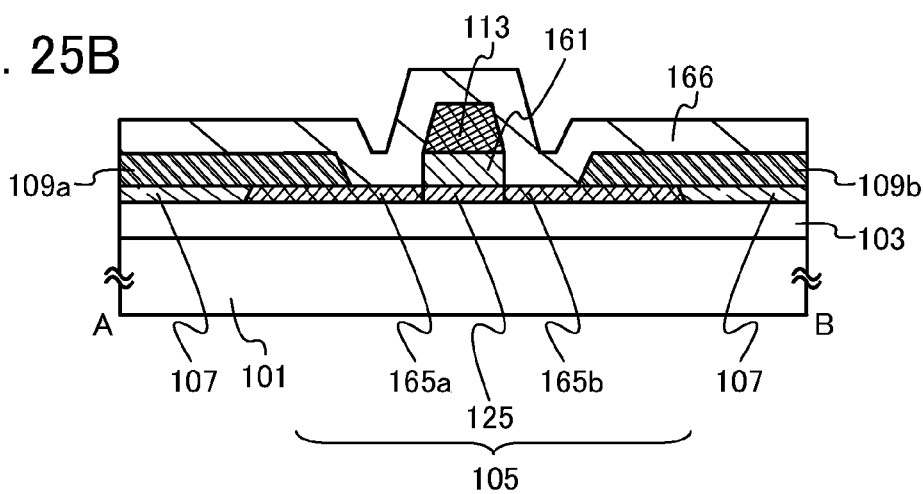
Figure 25C:
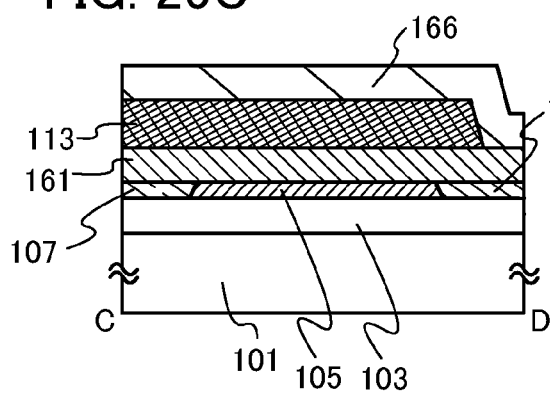
Figure 25D:
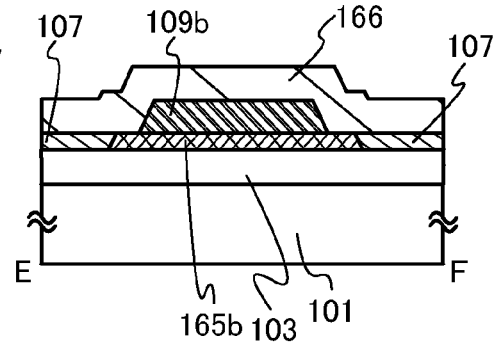

Next, a transistor 140 which is a modification example of the transistor 100 will be described. FIG. 25A is a top view illustrating a structure of the transistor 140. FIG. 25B corresponds to a cross-sectional view along dashed-dotted line A-B in FIG. 25A. FIG. 25C corresponds to a cross-sectional view along dashed-dotted line C-D in FIG. 25A. FIG. 25D corresponds to a cross-sectional view along dashed-dotted line E-F in FIG. 25A. Note that the base insulating film 103, a gate insulating film 161, and a protective insulating film 166 are not illustrated in FIG. 25A for clarity.

The transistor 140 in FIGS. 25A to 25D is different from the transistor 100 in the shape of a region of the oxide semiconductor film 105, to which a dopant is added, the shape of the gate insulating film 161, and the shape of the protective insulating film 166.

The oxide semiconductor film 105 of the transistor 140 includes the first oxide semiconductor region 125 overlapping with the gate electrode 113 and a pair of second oxide semiconductor regions 165a and 165b overlapping with part of the source electrode 109a and part of the drain electrode 109b. The pair of second oxide semiconductor regions 165a and 165b is provided with the first oxide semiconductor region 125 sandwiched therebetween. In addition, a dopant is added to the pair of second oxide semiconductor regions 165a and 165b.

The gate insulating film 161 of the transistor 140 is provided in only a region overlapping with the gate electrode 113. Therefore, part of the protective insulating film 166 is in contact with the oxide semiconductor film 105. Note that the other components of the transistor 140 are similar to those of the transistor 100.

(Method for Manufacturing Transistor 100)

Next, a method for manufacturing the transistor 100 illustrated in FIGS. 1A to 1D will be described with reference to FIGS. 4A to 4C, FIGS. 5A to 5C, FIGS. 6A to 6C, and FIGS. 7A to 7C. Note that FIGS. 4A to 4C, FIGS. 5A to 5C, FIGS. 6A to 6C, and FIGS. 7A to 7C are cross-sectional views illustrating the method for manufacturing the transistor 100 and correspond to cross-sectional views along dashed-dotted line A-B in FIG. 1A.

The base insulating film 103 is formed over the substrate 101 as a first insulating film.

There is no particular limitation on a material and the like of the substrate 101 as long as the material has heat resistance high enough to withstand at least heat treatment performed later. For example, a glass substrate, a ceramic substrate, a quartz substrate, or a sapphire substrate may be used as the substrate 101.

Alternatively, a single-crystal semiconductor substrate or a polycrystalline semiconductor substrate of silicon, silicon carbide, or the like; a compound semiconductor substrate of silicon germanium or the like; a conductive substrate of a conductor such as a metal or stainless steel; a substrate obtained by covering a surface of any of these semiconductor substrates and conductive substrate with an insulating material; or the like can be used. Still alternatively, a component in which a semiconductor element is provided over any of these substrates may be used as the substrate 101.

Still further alternatively, a flexible glass substrate or a flexible plastic substrate can be used as the substrate 101. As a plastic substrate, a substrate having low refractive index anisotropy is preferably used, and a polyether sulfone (PES) film, a polyimide film, a polyethylene naphthalate (PEN) film, a polyvinyl fluoride (PVF) film, a polyester film, a polycarbonate (PC) film, an acrylic resin film, a prepreg which includes a fibrous body in a partially-cured organic resin, or the like can be typically used.

The base insulating film 103 prevents diffusion of an impurity (e.g., an alkali metal such as Li or Na) from the substrate 101 and etching of the substrate 101 in an etching step in a manufacturing process of the transistor 100.

The base insulating film 103 is formed to have a single-layer structure or a stacked-layer structure with the use of any of oxide insulating film materials such as silicon oxide, gallium oxide, aluminum oxide, hafnium oxide, and yttrium oxide.

Further, in the manufacture of the transistor 100, the content of an alkali metal such as Li or Na, which is an impurity, is preferably low. In the case where a glass substrate containing an impurity such as an alkali metal is used as the substrate 101, it is preferable that the base insulating film 103 have a stacked-layer structure in which an insulating film in contact with the substrate 101 is formed using a nitride insulating film material such as silicon nitride or aluminum nitride in order to prevent entry of an alkali metal.

Furthermore, the base insulating film 103 is preferably formed using an oxide insulating film at least a surface of which contains oxygen and from which part of the oxygen is released by heat treatment. As the oxide insulating film from which part of oxygen is released by heat treatment, an oxide insulating film which contains more oxygen than the stoichiometric proportion can be used. This is because oxygen can be diffused to an oxide semiconductor film in contact with the base insulating film 103 by heat treatment.

The thickness of the base insulating film 103 is greater than or equal to 50 nm, preferably greater than or equal to 200 nm and less than or equal to 500 nm, further preferably greater than or equal to 500 nm and less than or equal to 800 nm. With the use of the thick base insulating film 103, the amount of oxygen released from the base insulating film 103 can be increased, and the interface state density at the interface between the base insulating film 103 and an oxide semiconductor film formed later can be reduced.

In this specification, silicon oxynitride refers to a substance that contains more oxygen than nitrogen and for example, silicon oxynitride includes oxygen, nitrogen, silicon, and hydrogen at concentrations ranging from greater than or equal to 50 at. % and less than or equal to 70 at. %, greater than or equal to 0.5 at. % and less than or equal to 15 at. %, greater than or equal to 25 at. % and less than or equal to 35 at. %, and greater than or equal to 0 at. % and less than or equal to 10 at. %, respectively. Further, silicon nitride oxide refers to a substance that contains more nitrogen than oxygen and for example, silicon nitride oxide includes oxygen, nitrogen, silicon, and hydrogen at concentrations ranging from greater than or equal to 5 at. % and less than or equal to 30 at. %, greater than or equal to 20 at. % and less than or equal to 55 at. %, greater than or equal to 25 at. % and less than or equal to 35 at. %, and greater than or equal to 10 at. % and less than or equal to 25 at. %, respectively. Note that the above ranges are obtained by measurement using Rutherford backscattering spectrometry (RBS) or hydrogen forward scattering spectrometry (HFS). In addition, the total of the percentages of the constituent elements does not exceed 100 at. %.

The expression "part of oxygen is released by heat treatment" means that the amount of released oxygen which is converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis.

A method for quantifying the amount of released oxygen which is converted into oxygen atoms, with the use of TDS analysis will be described below.

The amount of released gas in TDS analysis is proportional to the integral value of a spectrum. Therefore, the amount of released gas can be calculated from the ratio between the integral value of a spectrum of an insulating film and the reference value of a standard sample. The reference value of a standard sample refers to the ratio of the density of a predetermined atom contained in a sample to the integral value of a spectrum.

For example, the number of released oxygen molecules ($N_{O2}$) from an insulating film can be found according to Equation 1 with the TDS analysis results of a silicon wafer containing hydrogen at a predetermined density which is the standard sample and the TDS analysis results of the insulating film. Here, all spectra having a mass number of 32 which are obtained by the TDS analysis are assumed to originate from an oxygen molecule. $CH_3OH$, which is given as a gas having a mass number of 32, is not taken into consideration on the assumption that it is unlikely to be present. Further, an oxygen molecule including an oxygen atom having a mass number of 17 or 18 which is an isotope of an oxygen atom is not taken into consideration either because the proportion of such a molecule in the natural world is minimal.

[Formula 1]

$$N_{O2}=N_{H2}/S_{H2} \times S_{O2} \times \alpha \quad \text{(Equation 1)}$$

$N_{H2}$ is the value obtained by conversion of the number of hydrogen molecules released from the standard sample into density. $S_{H2}$ is the integral value of a spectrum of the standard sample which is analyzed by TDS. Here, the reference value of the standard sample is set to $N_{H2}/S_{H2}$. $S_{O2}$ is the integral value of a spectrum of the insulating film which is analyzed by TDS. $\alpha$ is a coefficient which influences the intensity of the spectrum in the TDS analysis. Japanese Published Patent Application No. H6-275697 can be referred to for details of Equation 1. Note that the above value of the amount of released oxygen is obtained by measurement with a thermal desorption spectroscopy apparatus produced by ESCO Ltd., EMD-WA1000S/W using a silicon wafer containing hydrogen atoms at $1 \times 10^{16}$ atoms/$cm^3$ as the standard sample.

Further, in the TDS analysis, part of oxygen is detected as an oxygen atom. The ratio between oxygen molecules and oxygen atoms can be calculated from the ionization rate of the oxygen molecules. Note that, since the above a includes the ionization rate of the oxygen molecules, the number of the released oxygen atoms can also be estimated through the evaluation of the number of the released oxygen molecules.

Note that $N_{O2}$ is the number of the released oxygen molecules. For the insulating film, the amount of released oxygen which is converted into oxygen atoms is twice the number of the released oxygen molecules.

As an example of the oxide insulating film from which part of oxygen is released by heat treatment, an oxide insulating film containing more oxygen than the stoichiometric proportion, specifically a film of oxygen-excess silicon oxide ($SiO_X$ (X>2)), is given. In the oxygen-excess silicon oxide ($SiO_X$ (X>2)), the number of oxygen atoms per unit volume is more than twice the number of silicon atoms per unit volume. The number of silicon atoms and the number of oxygen atoms per unit volume are measured by Rutherford backscattering spectrometry.

The oxide insulating film from which part of oxygen is released by heat treatment is used as the base insulating film 103, whereby oxygen can be diffused to the oxide semiconductor film formed later and the interface state density between the base insulating film 103 and the oxide semiconductor film can be reduced. Accordingly, charge or the like that can be generated owing to operation of the transistor 100 can be prevented from being trapped at the interface between the base insulating film 103 and the oxide semiconductor film, and thus the transistor 100 can be a transistor with little deterioration of electric characteristics.

The base insulating film 103 can be formed by a sputtering method, a CVD method, or the like. In the case of using a CVD method, it is preferable that hydrogen or the like contained in the base insulating film 103 be released and removed by heat treatment after the base insulating film 103 is formed. Note that in the case where the base insulating film 103 is formed using the oxide insulating film from which part of oxygen is released by heat treatment, a sputtering method is preferable, in which case the base insulating film 103 can be easily formed.

In the case of being formed by a sputtering method, the base insulating film 103 may be formed using a silicon target, a quartz target, an aluminum target, an aluminum oxide target, or the like in an atmosphere gas containing oxygen. The proportion of oxygen in the atmosphere gas is 6 vol. % or higher, preferably 50 vol. % or higher, to the whole atmosphere gas. By increasing the proportion of the oxygen gas in the atmosphere gas, an oxide insulating film from which part of oxygen is released by heat treatment can be formed.

Hydrogen in the target is preferably removed as much as possible. Specifically, an oxide target including an OH group at 100 ppm or lower, preferably 10 ppm or lower, further preferably 1 ppm or lower is used, whereby the hydrogen concentration of the base insulating film 103 can be reduced and the electric characteristics and reliability of the transistor 100 can be improved. For example, fused quartz is preferable because it is easily formed so as to include an OH group at 10 ppm or lower and is inexpensive. Needless to say, a target of synthetic quartz having a low OH group concentration may be used.

Figure 4A:
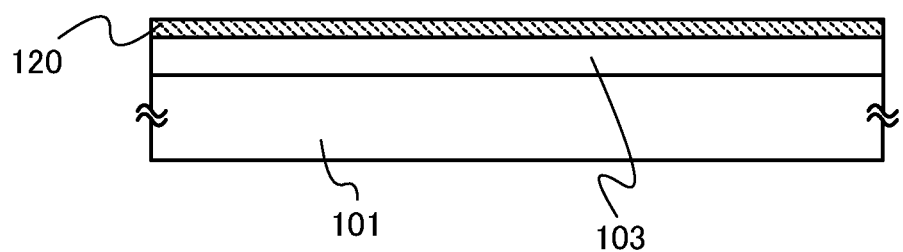
FIGS. 4A to 4C are cross-sectional views which illustrate an example of a method for manufacturing a semiconductor device according to one embodiment of the present invention.

Next, a first oxide semiconductor film 120 is formed over the base insulating film 103 (see FIG. 4A). The first oxide semiconductor film 120 can be formed over the base insulating film 103 by a sputtering method, a molecular beam epitaxy method, an atomic layer deposition method, or a pulsed laser deposition method. Here, the first oxide semiconductor film 120 is formed by a sputtering method. The thickness of the first oxide semiconductor film 120 may be greater than or equal to 1 nm and less than or equal to 50 nm.

The first oxide semiconductor film 120 can be formed using a metal oxide containing one or more elements selected from In, Ga, Sn, and Zn. Note that as the metal oxide, the one having a bandgap greater than or equal to 2 eV, preferably greater than or equal to 2.5 eV, further preferably greater than or equal to 3 eV, is used. The off-state current of the transistor 100 can be reduced by using such a metal oxide having a wide bandgap.

For the first oxide semiconductor film 120, for example, a four-component metal oxide such as an In—Sn—Ga—Zn-based oxide semiconductor; a three-component metal oxide such as an In—Ga—Zn-based oxide semiconductor, an In—Sn—Zn-based oxide semiconductor, an In—Al—Zn-based oxide semiconductor, a Sn—Ga—Zn-based oxide semiconductor, an Al—Ga—Zn-based oxide semiconductor, or a Sn—Al—Zn-based oxide semiconductor; a two-component metal oxide such as an In—Zn-based oxide semiconductor, a Sn—Zn-based oxide semiconductor, an Al—Zn-based oxide semiconductor, a Zn—Mg-based oxide semiconductor, a Sn—Mg-based oxide semiconductor, an In—Mg-based oxide semiconductor, or an In—Ga-based oxide semiconductor; or a single-component metal oxide such as indium oxide, tin oxide, or zinc oxide can be used.

Note that an n-component metal oxide includes n kinds of metal oxides. Here, for example, an In—Ga—Zn-based oxide semiconductor, which is a three-component metal oxide, means an oxide containing indium (In), gallium (Ga), and zinc (Zn), and there is no particular limitation on the composition ratio thereof. Further, the In—Ga—Zn-based oxide semiconductor may contain an element other than In, Ga, and Zn.

Note that it is preferable that oxygen (O) be excessively contained in the metal oxide as compared with oxygen in the stoichiometric proportion. When oxygen (O) is excessively contained, generation of carriers due to oxygen deficiency in the first oxide semiconductor film 120 to be formed can be prevented.

For the first oxide semiconductor film 120, an oxide semiconductor represented by the chemical formula, $InMO_3(ZnO)_m$ (m>0) can be used. Here, M represents one or more metal elements selected from Zn, Ga, Al, Mn, and Co. For example, M can be Ga, Ga and Al, Ga and Mn, or Ga and Co.

In the case where an In—Zn-based oxide semiconductor is used for the first oxide semiconductor film 120, a target has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=1.5:1 to 15:1 in an atomic ratio ($In_2O_3$:ZnO=3:4 to 15:2 in a molar ratio). For example, in a target used for formation of an In—Zn-based oxide semiconductor which has an atomic ratio of In:Zn:O=X:Y:Z, the relation Z>1.5X+Y is satisfied.

The first oxide semiconductor film 120 may be either an amorphous oxide semiconductor film or an oxide semiconductor film including a crystalline region.

Here, a sputtering apparatus used for formation of the first oxide semiconductor film 120 will be described in detail below.

The leakage rate of a treatment chamber in which the first oxide semiconductor film 120 is formed is preferably lower than or equal to $1\times10^{-10}$ Pa·m$^3$/s; thus, entry of an impurity into the film can be suppressed in the formation by a sputtering method.

In order to lower the leakage rate, internal leakage as well as external leakage needs to be reduced. The external leakage refers to inflow of gas from the outside of a vacuum system through a minute hole, a sealing defect, or the like. The internal leakage is due to leakage through a partition, such as a valve, in a vacuum system or due to released gas from an internal member. Measures need to be taken from both aspects of external leakage and internal leakage in order that the leakage rate be lower than or equal to $1\times10^{-10}$ Pa·m$^3$/s.

In order to reduce external leakage, an open/close portion of the treatment chamber is preferably sealed with a metal gasket. For the metal gasket, a metal material covered with iron fluoride, aluminum oxide, or chromium oxide is preferably used. The metal gasket realizes higher adhesion than an O-ring, and can reduce the external leakage. Further, by use of a metal material covered with iron fluoride, aluminum oxide, chromium oxide, or the like which is in the passive state, released gas containing hydrogen generated from the metal gasket is suppressed, so that the internal leakage can also be reduced.

As a member for an inner wall of the treatment chamber, aluminum, chromium, titanium, zirconium, nickel, or vanadium, from which a gas containing hydrogen is less likely to be released, or an alloy material which contains at least one of iron, chromium, nickel, and the like and is covered with any of these elements may be used. The alloy material containing at least one of iron, chromium, nickel, and the like is rigid, resistant to heat, and suitable for processing. Here, when surface unevenness of the member is reduced by polishing or the like to reduce the surface area of the inner wall of the treatment chamber, the released gas can be reduced. Alternatively, the member may be covered with iron fluoride, aluminum oxide, chromium oxide, or the like which is in the passive state.

Furthermore, it is preferable to provide a refiner for an atmosphere gas just in front of the treatment chamber. At this time, the length of a pipe between the refiner and the treatment chamber is less than or equal to 5 m, preferably less than or equal to 1 m. When the length of the pipe is less than or equal to 5 m or less than or equal to 1 m, an influence of the released gas from the pipe can be reduced accordingly.

Evacuation of the treatment chamber is preferably performed with a rough vacuum pump, such as a dry pump, and a high vacuum pump, such as a sputter ion pump, a turbo molecular pump, or a cryopump, in appropriate combination. The turbo molecular pump has outstanding capability in evacuating a large-sized molecule, whereas it has low capability in evacuating hydrogen or water. Hence, combination of a cryopump having high capability in evacuating water and a sputter ion pump having high capability in evacuating hydrogen is effective.

An adsorbate present in the treatment chamber does not affect the pressure in the treatment chamber because it is adsorbed on the inner wall, but the adsorbate leads to release of gas at the time of the evacuation of the treatment chamber. Therefore, although the leakage rate and the evacuation rate do not have a correlation, it is important that the adsorbate present in the treatment chamber be released as much as possible and evacuation be performed in advance with the use of a pump having high evacuation capability. Note that the treatment chamber may be subjected to baking for promotion of release of the adsorbate. By the baking, the rate of release of the adsorbate can be increased about tenfold. The baking may be performed at a temperature higher than or equal to 100° C. and lower than or equal to 450° C. At this time, when the adsorbate is removed while an inert gas is introduced, the rate of release of water or the like, which is difficult to release only by evacuation, can be further increased.

In a sputtering method, an RF power supply device, an AC power supply device, a DC power supply device, or the like can be used as appropriate as a power supply device for generating plasma.

As a target for formation of the first oxide semiconductor film 120 by a sputtering method, a metal oxide target containing one or more elements selected from In, Ga, Sn, and Zn can be used. As the target, a four-component metal oxide such as an In—Sn—Ga—Zn-based metal oxide, a three-component metal oxide such as an In—Ga—Zn-based metal oxide, an In—Sn—Zn-based metal oxide, an In—Al—Zn-based metal oxide, a Sn—Ga—Zn-based metal oxide, an Al—Ga—Zn-based metal oxide, or a Sn—Al—Zn-based metal oxide, a two-component metal oxide such as an In—Zn-based metal oxide or a Sn—Zn-based metal oxide, or the like can be used.

As an example of the target, a metal oxide target containing In, Ga, and Zn has a composition ratio of $In_2O_3$:$Ga_2O_3$:ZnO=1:1:1 [molar ratio]. Alternatively, a target having a composition ratio of $In_2O_3$:$Ga_2O_3$:ZnO=1:1:2 [molar ratio], a target having a composition ratio of $In_2O_3$:$Ga_2O_3$:

ZnO=1:1:4 [molar ratio], or a target having a composition ratio of $In_2O_3:Ga_2O_3:ZnO=2:1:8$ [molar ratio] can be used as the metal oxide target.

In the case where an In—Zn-based oxide semiconductor is used for the first oxide semiconductor film 120, a target has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=1.5:1 to 15:1 in an atomic ratio ($In_2O_3$:ZnO=3:4 to 15:2 in a molar ratio). For example, in a target used for formation of an In—Zn-based oxide semiconductor which has an atomic ratio of In:Zn:O=X:Y:Z, the relation Z>1.5X+Y is satisfied.

As the atmosphere gas, a rare gas (typically argon) atmosphere, an oxygen atmosphere, or a mixed gas of a rare gas and oxygen is used as appropriate. It is preferable that a high-purity gas from which impurities such as hydrogen, water, hydroxyl, and hydride are removed be used as the atmosphere gas.

With the use of the above sputtering apparatus, the first oxide semiconductor film 120 into which entry of hydrogen is suppressed can be formed. Note that even when the sputtering apparatus is used, the first oxide semiconductor film 120 contains more than a little nitrogen. For example, the nitrogen concentration of the first oxide semiconductor film 120 measured by secondary ion mass spectroscopy (SIMS) is lower than $5 \times 10^{18}$ atoms/cm$^3$.

The base insulating film 103 and the first oxide semiconductor film 120 may be successively formed in vacuum. For example, after impurities including hydrogen over the surface of the substrate 101 are removed by heat treatment or plasma treatment, the base insulating film 103 may be formed without exposure to the air, and the first oxide semiconductor film 120 may be successively formed without exposure to the air. In this manner, impurities including hydrogen over the surface of the substrate 101 can be reduced, and an atmospheric component can be prevented from attaching to the interface between the substrate 101 and the base insulating film 103 and the interface between the base insulating film 103 and the first oxide semiconductor film 120. Consequently, the transistor 100 can be a highly reliable transistor having favorable electric characteristics.

Further, during or after the formation of the first oxide semiconductor film 120, charge is generated owing to oxygen deficiency in the first oxide semiconductor film 120 in some cases. Part of oxygen deficiency in the first oxide semiconductor film 120 serves as a donor to generate an electron that is a carrier and thus the threshold voltage of the transistor 100 is negatively shifted.

Figure 4B:
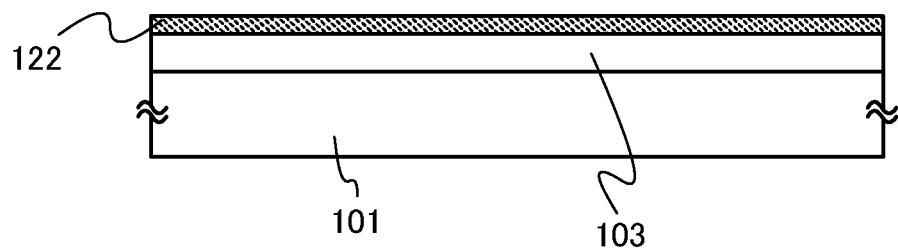
Figure 4C:
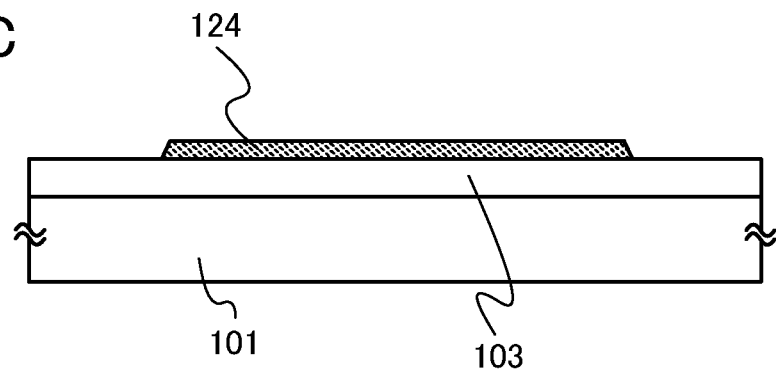

Therefore, after the formation of the first oxide semiconductor film 120, first heat treatment is performed to form a second oxide semiconductor film 122 (see FIG. 4B).

By the first heat treatment, hydrogen (including water, hydroxyl, and hydride) is released from the first oxide semiconductor film 120, part of oxygen contained in the base insulating film 103 is released, and the oxygen is diffused into the first oxide semiconductor film 120 and to the vicinity of the interface between the base insulating film 103 and the first oxide semiconductor film 120.

The first heat treatment is performed at a temperature at which the diffusion of oxygen can occur, specifically, higher than or equal to 150° C. and lower than the strain point of the substrate, preferably higher than or equal to 250° C. and lower than or equal to 450° C., further preferably higher than or equal to 300° C. and lower than or equal to 450° C., in an oxidation atmosphere or an inert atmosphere. Here, the oxidation atmosphere refers to an atmosphere including an oxidation gas such as oxygen, ozone, or nitrogen oxide at 10 ppm or higher. The inert atmosphere refers to an atmosphere which includes the oxidation gas at lower than 10 ppm and is filled with nitrogen or a rare gas. The treatment time is 3 minutes to 24 hours. Heat treatment for longer than 24 hours is not preferable because the productivity is decreased.

There is no particular limitation on a heat treatment apparatus used for the first heat treatment, and the apparatus may be provided with a device for heating an object to be processed by heat radiation or heat conduction from a heating element such as a resistance heating element. For example, an electric furnace, or a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas.

The first heat treatment enables part of oxygen contained in the base insulating film 103 to be released and the oxygen to be diffused into the first oxide semiconductor film 120 and to the vicinity of the interface between the base insulating film 103 and the first oxide semiconductor film 120, thereby compensating for oxygen deficiency in the first oxide semiconductor film 120. In other words, when oxygen is sufficiently diffused from the base insulating film 103 to the first oxide semiconductor film 120, oxygen deficiency in the first oxide semiconductor film 120, which might cause negative shift of threshold voltage, can be compensated for.

Further, hydrogen in the first oxide semiconductor film 120 serves as a donor to generate an electron that is a carrier. By the first heat treatment, the hydrogen concentration of the first oxide semiconductor film 120 is reduced, whereby the highly purified second oxide semiconductor film 122 is formed. Here, the hydrogen concentration of the second oxide semiconductor film 122 is lower than $5 \times 10^{18}$ atoms/cm$^3$, preferably lower than or equal to $1 \times 10^{18}$ atoms/cm$^3$, further preferably lower than or equal to $5 \times 10^{17}$ atoms/cm$^3$, still further preferably lower than or equal to $1 \times 10^{16}$ atoms/cm$^3$. Note that the hydrogen concentration of the second oxide semiconductor film 122 is measured by secondary ion mass spectroscopy (SIMS).

By the first heat treatment, the density of carriers generated due to a donor such as hydrogen in the second oxide semiconductor film 122, in which the hydrogen concentration is sufficiently reduced so that the oxide semiconductor is purified and in which defect states in an energy gap due to oxygen deficiency are reduced by sufficient supply of oxygen, becomes lower than or equal to $1 \times 10^{13}$/cm$^3$. The off-state current (per unit channel width (1 μm) here) at room temperature (25° C.) is less than or equal to 100 zA (1 zA (zeptoampere) is $1 \times 10^{-21}$ A), preferably less than or equal to 10 zA. The transistor 100 having excellent off-state current characteristics can be obtained with the use of the second oxide semiconductor film 122. Since an alkali metal such as Li or Na is an impurity, the content of such an alkali metal is preferably reduced. The concentration of the alkali metal in the second oxide semiconductor film 122 is lower than or equal to $2 \times 10^{16}$ cm$^{-3}$, preferably lower than or equal to $1 \times 10^{15}$ cm$^{-3}$. Further, the content of an alkaline earth metal is preferably low because it is also an impurity.

Thus, the first heat treatment enables the transistor 100 to have favorable electric characteristics and reliability.

Next, the second oxide semiconductor film 122 is subjected to a first photolithography step, so that a resist mask is formed over the second oxide semiconductor film 122. The second oxide semiconductor film 122 is processed using the resist mask in a first etching step, so that a third oxide semiconductor film 124 is formed (see FIG. 4C). Note that the resist mask can be formed by an ink-jet method, a printing method, or the like as appropriate, as well as through the photolithography step.

In the first etching step, etching is preferably performed so that an end portion of the third oxide semiconductor film 124 is tapered. When the third oxide semiconductor film 124 has a tapered end portion, the coverage with a second insulating film 117 which is to be the sidewall insulating film 107 later can be improved. In the case of using a photolithography step, the tapered shape can be obtained by performing etching while the resist mask is reduced in size.

The first etching step may be dry etching, wet etching, or combination thereof. As an etchant for wet etching, a mixed solution of phosphoric acid, acetic acid, and nitric acid, an ammonia hydrogen peroxide mixture (31 wt % hydrogen peroxide water:28 wt % ammonia water:water=5:2:2 (volume ratio)), or the like can be used. In addition, ITO07N (produced by KANTO CHEMICAL CO., INC.) may also be used.

As an etching gas for dry etching, a gas containing chlorine (chlorine-based gas such as chlorine ($Cl_2$), boron trichloride ($BCl_3$), silicon tetrachloride ($SiCl_4$), or carbon tetrachloride ($CCl_4$)) is preferably used.

Alternatively, a gas containing fluorine (fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

For dry etching, a parallel plate reactive ion etching (RIE) method or an inductively coupled plasma (ICP) etching method can be used. In order to process the film into a desired shape, etching conditions (the amount of power applied to a coil-shaped electrode, the amount of power applied to an electrode on a substrate side, the temperature of the electrode on the substrate side, and the like) are adjusted as appropriate.

After the third oxide semiconductor film 124 is formed, the resist mask is removed. At this time, although a chemical solution (resist stripper) may be used, the resist mask may be removed by oxygen plasma ashing. The removal of the resist mask is performed by oxygen plasma ashing, whereby contamination on a surface of the third oxide semiconductor film 124 due to the chemical solution can be prevented, and oxygen can be supplied to the third oxide semiconductor film 124 by the oxygen plasma.

A side surface of an oxide semiconductor film processed into a desired shape, such as the third oxide semiconductor film 124, is active. Note that the term "active" means an unstable bonding state with a dangling bond. The following phenomenon makes the side surface of the oxide semiconductor film active.

When an oxide semiconductor film is processed into a desired shape, for example, when dry etching is performed under the above conditions, if a side surface of the oxide semiconductor film is exposed to plasma including a chlorine radical, a fluorine radical, or the like, a metal atom exposed on the side surface of the oxide semiconductor film is bonded with the chlorine radical, the fluorine radical, or the like. At this time, the metal atom bonded with the chlorine atom or the fluorine atom is released, so that an oxygen atom that has been bonded with the metal atom in the oxide semiconductor film becomes active. The active oxygen atom is easily reacted and released. Therefore, oxygen deficiency is easily caused on the side surface of the oxide semiconductor film.

When the side surface of the oxide semiconductor film processed into a desired shape is active, oxygen is extracted in a reduced-pressure atmosphere or a reducing atmosphere, and oxygen deficiency is caused on the side surface of the oxide semiconductor film. The reduced-pressure atmosphere or the reducing atmosphere is a treatment atmosphere often used in manufacturing steps of a transistor, such as film formation, heat treatment, or dry etching. In particular, in an atmosphere subjected to heat treatment, oxygen deficiency is easily caused on the side surface of the oxide semiconductor film. Further, part of the oxygen deficiency serves as a donor to generate an electron that is a carrier, so that the side surface of the oxide semiconductor film has n-type conductivity.

A source electrode and a drain electrode of the transistor are in contact with the side surface of the oxide semiconductor film including the side surface having n-type conductivity, so that leakage current is generated between the source electrode and the drain electrode through the side surface of the oxide semiconductor film. The leakage current increases the off-state current of the transistor. Further, there is a possibility that current flowing through the side surface of the oxide semiconductor film causes formation of a transistor in which the side surface of the oxide semiconductor film serves a channel region.

In short, it can be said that side surfaces of the third oxide semiconductor film 124 are active and oxygen deficiency is caused thereon.

Figure 5A:
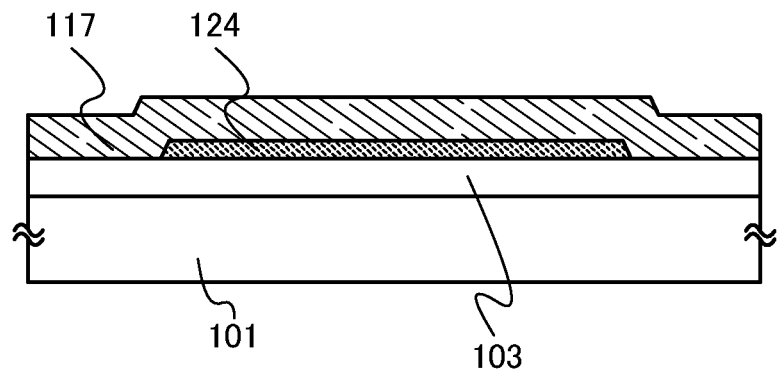
FIGS. 5A to 5C are cross-sectional views which illustrate an example of a method for manufacturing a semiconductor device according to one embodiment of the present invention.

Next, the second insulating film 117 is formed to cover the base insulating film 103 and the third oxide semiconductor film 124 (see FIG. 5A).

The second insulating film 117 may be formed using any of the materials given in the description of the base insulating film 103 in a manner similar to that of the base insulating film 103. It is particularly preferable to use an oxide insulating film at least a surface of which contains oxygen and from which part of the oxygen is released by heat treatment.

Figure 5B:
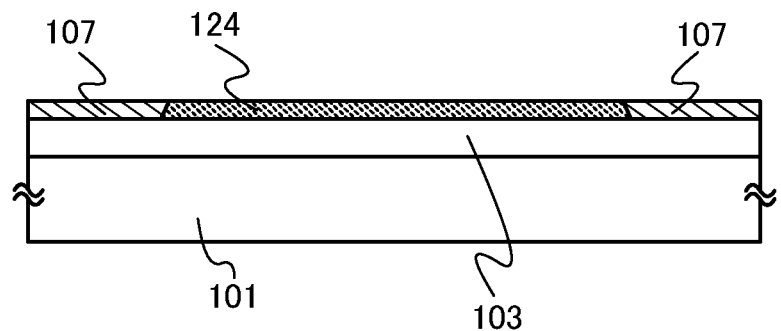

Then, a surface of the second insulating film 117 is polished so that the surface (top surface) of the third oxide semiconductor film 124 is exposed, so that the sidewall insulating film 107 in contact with at least the side surfaces of the third oxide semiconductor film 124 is formed as a third insulating film (see FIG. 5B).

As a method for polishing the surface of the second insulating film 117, chemical mechanical polishing (CMP) treatment can be given.

Here, the CMP treatment is a method for planarizing a surface of an object to be polished by combination of chemical and mechanical actions with the use of the surface as a reference. In general, the CMP method is a method in which a polishing cloth is attached to a polishing stage, the polishing stage and the object to be polished are each rotated or swung while slurry (abrasive) is supplied between the object to be polished and the polishing cloth, and the surface of the object to be polished is polished by chemical reaction between the slurry and the surface of the object to be polished and by action of mechanical polishing of the object to be polished with the polishing cloth.

The CMP treatment may be performed once or plural times. When the CMP treatment is performed plural times, first polishing is preferably performed with a high polishing rate followed by final polishing with a low polishing rate. By such combination of polishings with different polishing rates, the planarity of a surface of the sidewall insulating film 107 can be further improved.

For example, CMP treatment is performed on the surface of the second insulating film 117 under conditions where a polyurethane polishing cloth is used and silica slurry (grain size: 60 nm) is used as a chemical solution supplied as slurry. The other conditions of CMP are adjusted as appropriate as follows: the slurry flow rate is higher than or equal to 100 ml/min and lower than or equal to 300 ml/min; the polishing pressure is higher than or equal to 0.005 MPa and lower than or equal to 0.08 MPa; the spindle rotation speed is higher than or equal to 20 rpm and lower than or equal to 50 rpm; and the table rotation speed is higher than or equal to 20 rpm and lower than or equal to 50 rpm. In addition, treatment conditions can be changed depending on an apparatus used for the CMP treatment, and thus may be adjusted as appropriate without being limited to the above conditions.

In the method for manufacturing the transistor 100, the sidewall insulating film 107 can be formed through formation steps different from those described above. There is a possibility that the third oxide semiconductor film 124 is also polished to some extent in the CMP treatment on the second insulating film 117, resulting in size reduction of the third oxide semiconductor film 124. Physical polishing of the third oxide semiconductor film 124 can lead to modification of the third oxide semiconductor film 124, such as generation of a defect on the surface. Therefore, most part of the second insulating film 117 may be removed by CMP treatment and then the surface of the third oxide semiconductor film 124 may be exposed by dry etching.

By the CMP treatment, the sidewall insulating film 107 can be formed to have substantially the same thickness as the third oxide semiconductor film 124. Moreover, the planarity is high because a step which is formed between the top surface of the third oxide semiconductor film 124 and the top surface of the sidewall insulating film 107 is small and a difference between unevenness of the top surface of the third oxide semiconductor film 124 and unevenness of the top surface of the sidewall insulating film 107 is also small.

As a result, at least over a channel formation region in the oxide semiconductor film 105, the thickness of the gate insulating film 111 formed later can be reduced. By reducing the thickness of the gate insulating film 111 over the channel formation region, an influence of a short-channel effect caused by extremely reducing the channel length of the transistor 100 can be suppressed.

From the above description, it can be said that the side surfaces of the third oxide semiconductor film 124 are active and oxygen deficiency is caused thereon; therefore, second heat treatment may be performed after the sidewall insulating film 107 is formed. Part of oxygen contained in the sidewall insulating film 107 is released, and the oxygen is diffused into the third oxide semiconductor film 124 and to the side surfaces of the third oxide semiconductor film 124; thus, oxygen deficiency is compensated for. Oxygen is sufficiently diffused to the third oxide semiconductor film 124 by the second heat treatment, whereby oxygen deficiency in the third oxide semiconductor film 124, which might cause negative shift of threshold voltage, can be compensated for.

Further, by the second heat treatment, oxygen is diffused from the base insulating film 103 into the third oxide semiconductor film 124 and to the vicinity of the interface with the third oxide semiconductor film 124. A heating apparatus for the second heat treatment may be selected as appropriate from the heat treatment apparatuses given in the description of the first heat treatment. The second heat treatment may be performed at a temperature higher than or equal to 150° C. and lower than or equal to 450° C., preferably higher than or equal to 250° C. and lower than or equal to 325° C. In the second heat treatment, the temperature may be gradually increased to the aforementioned temperature or may be increased to the aforementioned temperature step-by-step. The second heat treatment may be performed in, but not limited to, an oxidation atmosphere or an inert atmosphere, or may be performed under reduced pressure.

By the second heat treatment, a fourth oxide semiconductor film in which oxygen deficiency is reduced can be formed. Note that the fourth oxide semiconductor film corresponds to the oxide semiconductor film 105 illustrated in FIGS. 1A to 1D (see FIG. 5C). Therefore, the same reference numeral and hatching pattern as the oxide semiconductor film 105 illustrated in FIGS. 1A to 1D are used in FIG. 5C. Note that the second heat treatment may be performed before the sidewall insulating film 107 is formed (before the surface of the second insulating film 117 is polished).

Next, a conductive film 119 which is to be the source electrode 109a and the drain electrode 109b is formed over the oxide semiconductor film 105 (fourth oxide semiconductor film) and the sidewall insulating film 107. After that, the conductive film 119 is subjected to a second photolithography step, so that resist masks 139a and 139b are formed over the conductive film 119 (see FIG. 6A). The conductive film 119 is processed using the resist masks 139a and 139b in a second etching step, so that the source electrode 109a and the drain electrode 109b are formed (see FIG. 6B).

Examples of a conductive material for the conductive film 119 include metals such as aluminum, titanium, chromium, nickel, copper, yttrium, zirconium, molybdenum, silver, tantalum, and tungsten and an alloy containing any of these metals as a main component. The conductive film 119 is formed to have a single-layer structure or a stacked-layer structure with the use of any of these conductive materials. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is formed over a copper-magnesium-aluminum alloy film, and a three-layer structure in which a titanium film, an aluminum film, and a titanium film are stacked in this order can be given. Note that a transparent conductive material containing indium oxide, tin oxide, or zinc oxide may be used. The source electrode 109a and the drain electrode 109b also function as a source wiring and a drain wiring.

As the conductive film 119, a conductive film may be formed using any of the above conductive materials by a sputtering method. The thicknesses of the source electrode 109a and the drain electrode 109b are not particularly limited and can be determined as appropriate in consideration of the electric resistance of a conductive material and the time for the formation step.

The second photolithography step may be similar to the first photolithography step. As the second etching step, dry etching may be performed. For example, a chlorine gas or a mixed gas of a boron trichloride gas and a chlorine gas may be used as an etching gas used for the dry etching. However, one embodiment of the present invention is not limited to this; wet etching may be used or another method capable of processing the conductive film 119 may be used.

After the source electrode 109a and the drain electrode 109b are formed, the resist masks 139a and 139b are removed. At this time, although a chemical solution (resist stripper) may be used, the resist masks 139a and 139b may be removed by oxygen plasma ashing. The removal of the resist masks 139a and 139b is performed by oxygen plasma ashing, whereby contamination on the surface of the oxide semiconductor film 105 due to the chemical solution can be prevented, and oxygen can be supplied to the oxide semiconductor film 105 by the oxygen plasma.

Further, between the source electrode 109a and the oxide semiconductor film 105 and between the drain electrode 109b and the oxide semiconductor film 105, a conductive film (not shown) having resistivity higher than that of the source electrode 109a and the drain electrode 109b and lower than that of the oxide semiconductor film 105 may be provided. Note that the conductive film is referred to as a low-resistance film in this specification. As the low-resistance film, a conductive metal oxide film of indium oxide ($In_2O_3$), tin oxide ($SnO_2$), zinc oxide (ZnO), indium oxide-tin oxide ($In_2O_3$—$SnO_2$, abbreviated to ITO), indium oxide-zinc oxide ($In_2O_3$—ZnO), or the like can be used. Alternatively, for the low-resistance film, indium gallium zinc oxide containing nitrogen, indium tin oxide containing nitrogen, indium gallium oxide containing nitrogen, indium zinc oxide containing nitrogen, tin oxide containing nitrogen, indium oxide containing nitrogen, or a metal nitride (such as InN or ZnN) may be used. Further alternatively, the low-resistance film may be formed using a material formed of one to ten graphene sheets. The low-resistance film is provided between the source electrode 109a and the oxide semiconductor film 105 and between the drain electrode 109b and the oxide semiconductor film 105 in this manner, the contact resistance between the source electrode 109a and the oxide semiconductor film 105 and between the drain electrode 109b and the oxide semiconductor film 105 can be reduced. In the second etching step for forming the source electrode 109a and the drain electrode 109b, the low-resistance film may be processed using the resist masks 139a and 139b successively to the processing of the conductive film 119 (see FIG. 6A).

Figure 6A:
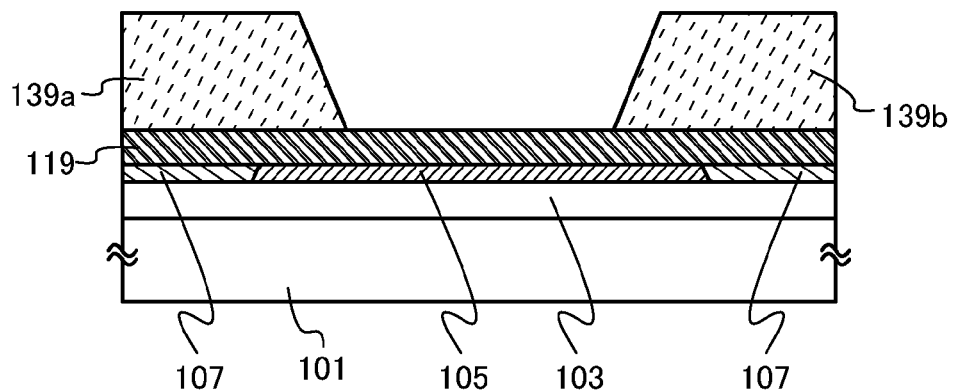
FIGS. 6A to 6C are cross-sectional views which illustrate an example of a method for manufacturing a semiconductor device according to one embodiment of the present invention.
Figure 6B:
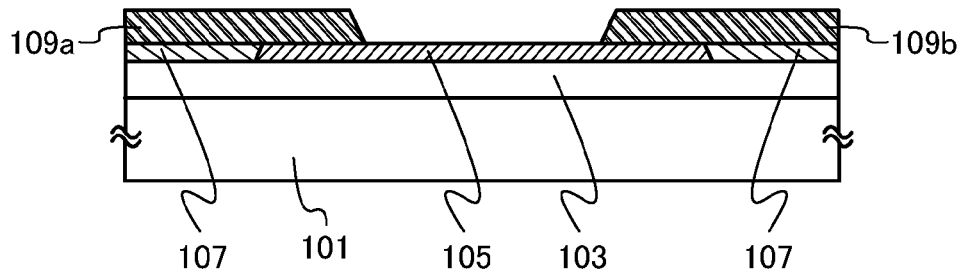
Figure 6C:
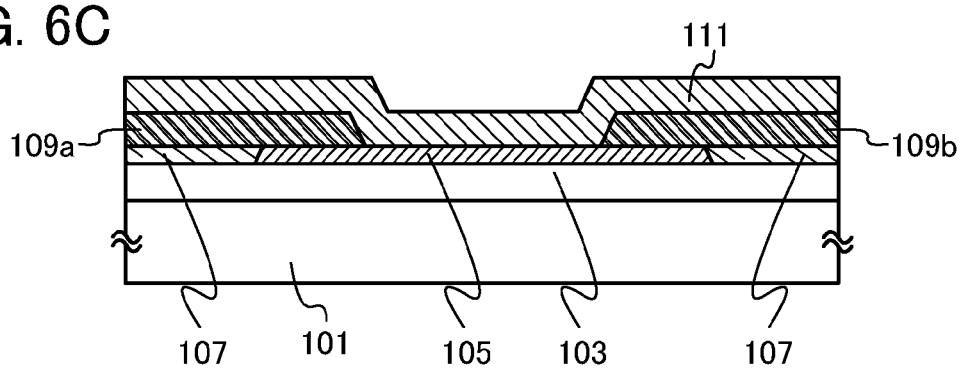

Next, the gate insulating film 111 is formed over the oxide semiconductor film 105, the source electrode 109a, and the drain electrode 109b as a fourth insulating film (see FIG. 6C). The gate insulating film 111 can be formed to have a single-layer structure or a stacked-layer structure with the use of any of the insulating film materials and methods given in the description of the base insulating film 103. The thickness of the gate insulating film 111 is preferably greater than or equal to 1 nm and less than or equal to 300 nm, further preferably greater than or equal to 5 nm and less than or equal to 50 nm. When the thickness of the gate insulating film 111 is greater than or equal to 5 nm, the gate leakage current of the transistor 100 can be particularly reduced.

The gate insulating film 111 preferably contains oxygen in a portion which is in contact with the oxide semiconductor film 105 and thus is preferably formed using an oxide insulating film at least a surface of which contains oxygen and from which part of the oxygen is released by heat treatment. An oxide insulating film from which part of oxygen is released by heat treatment is used as the gate insulating film 111, whereby oxygen deficiency caused in the oxide semiconductor film 105 can be compensated for by third heat treatment described later; accordingly, the transistor 100 can have favorable electric characteristics and reliability.

Alternatively, the gate insulating film 111 can be formed using a high-k material such as hafnium oxide, yttrium oxide, hafnium silicate ($HfSi_xO_y$ (x>0, y>0)), hafnium silicate to which nitrogen is added ($HfSi_xO_yN_z$ (x>0, y>0, z>0)), or hafnium aluminate ($HfAl_xO_y$ (x>0, y>0)). Since the high-k material has a high dielectric constant, the gate insulating film can have a larger physical thickness while maintaining the capacitance to be the same as that in the case where a silicon oxide film is used as the gate insulating film, for example; therefore, gate leakage current can be reduced.

Note that it is preferable that before the gate insulating film 111 is formed, the surface of the oxide semiconductor film 105 be exposed to plasma of an oxidation gas in order to reduce oxygen deficiency on the surface of the oxide semiconductor film 105.

Here, the third heat treatment may be performed. By the third heat treatment, oxygen is diffused from the base insulating film 103, the sidewall insulating film 107, and the gate insulating film 111 to the oxide semiconductor film 105. A heating apparatus for the third heat treatment may be selected as appropriate from the heat treatment apparatuses given in the description of the first heat treatment. The third heat treatment may be performed at a temperature higher than or equal to 150° C. and lower than or equal to 450° C., preferably higher than or equal to 250° C. and lower than or equal to 325° C. In the third heat treatment, the temperature may be gradually increased to the aforementioned temperature or may be increased to the aforementioned temperature step-by-step. The third heat treatment may be performed in, but not limited to, an oxidation atmosphere or an inert atmosphere, or may be performed under reduced pressure.

Although the second heat treatment is performed after the sidewall insulating film 107 is formed in this embodiment, one embodiment of the present invention is not limited to this. The third heat treatment may also serve as the second heat treatment, without performing the second heat treatment after the sidewall insulating film 107 is formed.

Next, a conductive film 123 which is to be the gate electrode 113 is formed over the gate insulating film 111. The conductive film 123 may be formed by a sputtering method with the use of any of the conductive materials given in the description of the conductive film 119 which is used for forming the source electrode 109a and the drain electrode 109b.

After that, the conductive film 123 is subjected to a third photolithography step, so that a resist mask 133 is formed over the conductive film 123 (see FIG. 7A). The conductive film 123 is processed using the resist mask 133 in a third etching step, so that the gate electrode 113 is formed. In addition, the gate electrode 113 also functions as a gate wiring.

The third photolithography step may be similar to the first photolithography step. As the third etching step, for example, dry etching may be performed. For example, a chlorine gas or a mixed gas of a boron trichloride gas and a chlorine gas may be used as an etching gas used for the dry etching. However, the third etching step is not limited to this; wet etching may be used or another method capable of processing the conductive film 123 may be used.

Note that it is preferable to provide a film formed using an In—Ga—Zn-based metal oxide containing nitrogen, an In—Sn-based metal oxide containing nitrogen, an In—Ga-based metal oxide containing nitrogen, an In—Zn-based metal oxide containing nitrogen, tin oxide containing nitrogen, indium oxide containing nitrogen, or a metal nitride (such as InN or ZnN) between the gate electrode 113 and the gate insulating film 111. The film has a work function higher than or equal to 5 eV, preferably higher than or equal to 5.5 eV, and thus the threshold voltage in electric characteristics of the transistor 100 can be positively shifted; consequently, the transistor 100 can be a so-called normally-off transistor. For example, in the case of using an In—Ga—Zn-based metal oxide containing nitrogen, an In—Ga—Zn—O film having a nitrogen concentration at least higher than that of the oxide semiconductor film 105 is used; specifically, an In—Ga—Zn—O film having a nitrogen concentration higher than or equal to 7 at. % is used. In the third etching step for forming the gate electrode 113, the film may be processed using the resist mask 133 successively to the processing of the conductive film 123 (see FIG. 7A).

Next, the first oxide semiconductor region 125, the pair of second oxide semiconductor regions 135a and 135b (LDD regions), and the pair of third oxide semiconductor regions 145a and 145b are formed in the oxide semiconductor film 105. These regions are formed in a self-aligned manner by adding a dopant 150 with the use of the gate electrode 113, the source electrode 109a, and the drain electrode 109b as masks (see FIG. 7B).

As the dopant 150 for addition, at least one of a Group 15 element such as nitrogen, phosphorus, or arsenic, a rare gas element such as helium, neon, argon, krypton, or xenon, and hydrogen may be selected. As a method for adding the dopant 150, an ion doping method or an ion implantation method can be used. When an ion doping method or an ion implantation method is used, the depth to which the dopant 150 is added (addition region) can be easily controlled and thus the dopant 150 can be added with high accuracy. The dopant 150 may be added by an ion doping method or an ion implantation method while the substrate 101 is heated.

Further, the addition of the dopant 150 may also be conducted using a method other than an ion doping method and an ion implantation method. For example, a dopant can be added in the following manner: plasma is generated in an atmosphere of a gas containing an element to be added and plasma treatment is performed on an object to which the dopant is added. As an apparatus for plasma treatment, a dry etching apparatus, a plasma CVD apparatus, a high-density plasma CVD apparatus, or the like can be used. At this time, in the case where portions of the oxide semiconductor film 105, which are to be the LDD regions, include crystalline regions, the crystallinity might be decreased in the portions because of damage due to the addition of the dopant 150 for forming the LDD regions, which causes the portions to be amorphous regions.

The conductivity of the LDD regions is higher than or equal to 10 S/cm and lower than or equal to 1000 S/cm, preferably higher than or equal to 100 S/cm and lower than or equal to 1000 S/cm. Note that when the conductivity is too low, the on-state current of the transistor 100 is decreased.

The carrier density can be increased by increasing the dopant concentration of the LDD regions; however, an excessively high dopant concentration may cause the dopant to inhibit transfer of carriers and the conductivity of the LDD regions to be decreased.

For that reason, the dopant concentration of the LDD regions is preferably higher than or equal to $5\times10^{18}$ atoms/$cm^3$ and lower than or equal to $1\times10^{22}$ atoms/$cm^3$. The dopant 150 is added through the gate insulating film 111. Since the dopant concentration depends on the thickness of the gate insulating film 111, the thickness of the gate insulating film 111 is determined so that the dopant concentration of the LDD regions is within the above range.

Further, heat treatment may be performed after the dopant 150 is added. The heat treatment may be performed in a manner similar to that of the first to third heat treatments and is preferably performed at a temperature at which the LDD regions are not crystallized.

The treatment for adding the dopant 150 may be performed plural times. In the case where the treatment for adding the dopant 150 is performed plural times, the kind of the dopant 150 may be the same in the plural treatments or different in every treatment.

On the basis of the above description, examples of conditions of the addition of the dopant 150 will be given. (1) Nitrogen is added as the dopant 150 at an acceleration voltage of 20 kV, for example. Alternatively, (2) phosphorus is added as the dopant 150 at an acceleration voltage of 40 kV. In addition, in the case where the dose of nitrogen or phosphorus used as the dopant 150 is less than or equal to $1\times10^{14}$ $cm^2$, the heat treatment is preferably performed at a temperature lower than 450° C. In this manner, the sheet resistance of the LDD regions can be lower than or equal to $1\times10^7$ Ω/sq.

In the case where the dose of nitrogen or phosphorus used as the dopant 150 is greater than or equal to $5\times10^{14}$ $cm^2$ and lower than $5\times10^{15}$ $cm^2$, the heat treatment is preferably performed at a temperature higher than or equal to 450° C. and lower than or equal to 600° C. In this manner, the sheet resistance of the LDD regions can be lower than or equal to $1\times10^5$ Ω/sq.

In the case where the dose of nitrogen or phosphorus used as the dopant 150 is higher than or equal to $5\times10^{15}$ $cm^2$, the heat treatment is preferably performed at a temperature higher than or equal to 600° C. In this manner, the sheet resistance of the LDD regions can be lower than or equal to $1\times10^5$ Ω/sq.

Next, the protective insulating film 115 is formed over the gate insulating film 111 and the gate electrode 113 as a fifth insulating film (see FIG. 7C).

The protective insulating film 115 is formed to have a single-layer structure or a stacked-layer structure with the use of any of the insulating film materials and methods given in the description of the base insulating film 103. The protective insulating film 115 is preferably formed using an oxide insulating film at least a surface of which contains oxygen and from which part of the oxygen is released by heat treatment. It is further preferable to form a stacked-layer structure by providing an insulating film material such as aluminum oxide, aluminum oxynitride, aluminum nitride, silicon nitride oxide, or silicon nitride over the oxide insulating film.

After that, fourth heat treatment may be performed on the structure obtained so far. When the protective insulating film 115 has such a stacked-layer structure, oxygen released from the oxide insulating film by the fourth heat treatment can be prevented (blocked) from being released to the outside of the transistor 100 and can be efficiently diffused to the oxide semiconductor film 105 (fourth oxide semiconductor film).

A heating apparatus for the fourth heat treatment may be selected as appropriate from the heat treatment apparatuses given in the description of the first heat treatment. The fourth heat treatment may be performed at a temperature higher than or equal to 150° C. and lower than or equal to 450° C., preferably higher than or equal to 250° C. and lower than or equal to 325° C. In the fourth heat treatment, the temperature may be gradually increased to the aforementioned temperature or may be increased to the aforementioned temperature step-by-step. The fourth heat treatment may be performed in, but not limited to, an oxidation atmosphere or an inert atmosphere, or may be performed under reduced pressure.

As needed, openings are formed in part of the gate electrode 113, part of the source electrode 109a, and part of the drain electrode 109b so that a gate wiring, a source wiring, and a drain wiring are partly exposed.

Through the above steps, the transistor 100 can be manufactured.

In the transistor 100, the LDD regions to which the dopant is added are provided on both sides of the first oxide semiconductor region 125 serving as the channel formation region, whereby an electric field applied to the first oxide semiconductor region 125 serving as the channel formation region can be relieved. An influence of a short-channel effect caused by extremely reducing the channel length of the transistor 100 can be suppressed.

(Method for Manufacturing Transistor 110)

Here, a method for manufacturing the transistor 110 (see FIGS. 2A to 2D) will be described; in particular, differences from the method for manufacturing the transistor 100 will be described.

The base insulating film 103 is formed over the substrate 101, and the first oxide semiconductor film 120 is formed over the base insulating film 103. First heat treatment is performed after the first oxide semiconductor film 120 is formed, so that the second oxide semiconductor film 122 in which oxygen deficiency is reduced is formed (see FIG. 4B). Note that steps up to and including this step may be performed as in the case of the transistor 100.

Next, the second oxide semiconductor film 122 is subjected to a first photolithography step, so that a resist mask is formed over the second oxide semiconductor film 122. The second oxide semiconductor film 122 is processed using the resist mask in a first etching step, so that the third oxide semiconductor film 124 is formed. Note that the resist mask can be formed by an ink-jet method, a printing method, or the like as appropriate, as well as through the photolithography step.

Figure 8A:
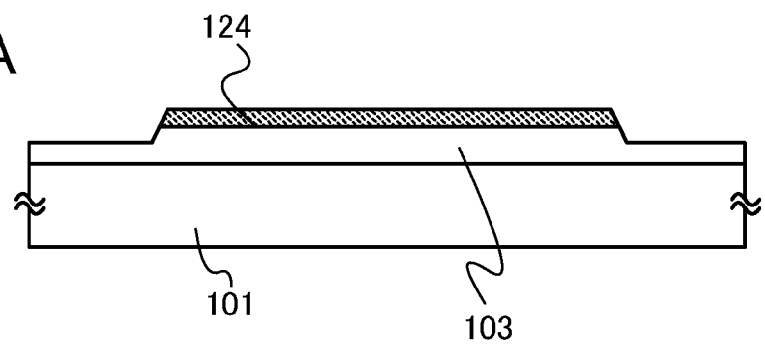
FIGS. 8A to 8C are cross-sectional views which illustrate an example of a method for manufacturing a semiconductor device according to one embodiment of the present invention.

In the manufacture of the transistor 110, the second oxide semiconductor film 122 is selectively etched and part of the base insulating film 103 is also selectively etched in the first etching step; thus, processing is performed so that the base insulating film 103 has a projection in a region which is in contact with the third oxide semiconductor film 124 (see FIG. 8A). At this time, an etching gas and etching time need to be considered in order to prevent loss of a region of the base insulating film 103, which is not in contact with the third oxide semiconductor film 124. It is preferable to form the base insulating film 103 to a thickness greater than or equal to 450 nm and then to etch the base insulating film 103 by approximately 100 nm in the first etching step.

For example, the first etching step may be performed using an ICP apparatus under the following conditions: the ICP power is 450 W; the bias power is 100 W; boron trichloride and chlorine are introduced as an etching gas at flow rates of 60 sccm and 20 sccm, respectively; and the pressure in a treatment chamber is 1.9 Pa.

Figure 8B:
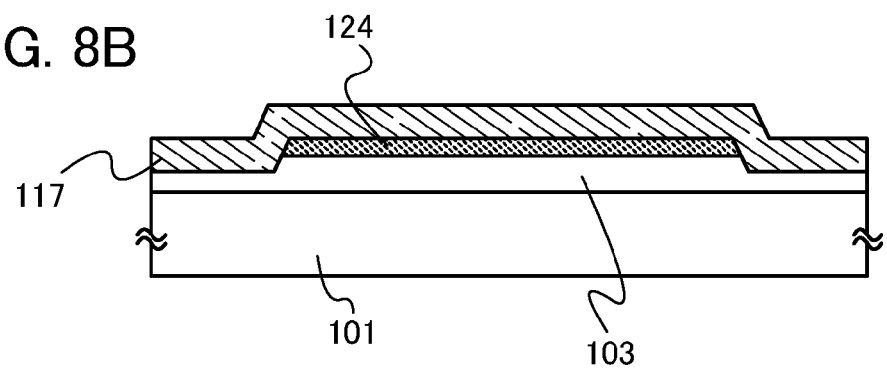

Next, the second insulating film 117 is formed over the base insulating film 103 and the third oxide semiconductor film 124 (see FIG. 8B). The second insulating film 117 may be formed as in the case of the transistor 100.

Figure 8C:
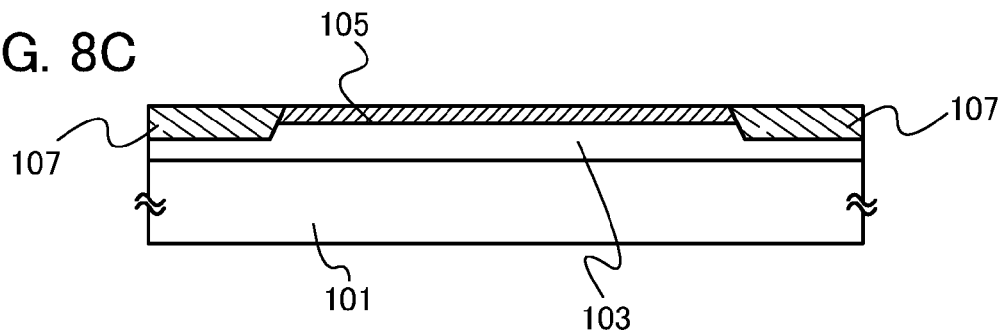

Then, a surface of the second insulating film 117 is subjected to CMP treatment so that a surface of the third oxide semiconductor film 124 is exposed, so that the sidewall insulating film 107 in contact with at least side surfaces of the third oxide semiconductor film 124 is formed as a third insulating film (see FIG. 8C). Note that conditions or the like of the CMP treatment performed on the surface of the second insulating film 117 may be similar to those of the transistor 100.

The base insulating film 103 is formed to have the projection in the region which is in contact with the third oxide semiconductor film 124, whereby the third oxide semiconductor film 124 is enclosed by the sidewall insulating film 107. Accordingly, part of oxygen contained in the sidewall insulating film 107 can be diffused to the side surfaces of the third oxide semiconductor film 124 and oxygen deficiency can be sufficiently compensated for by third heat treatment performed after the formation of the sidewall insulating film 107.

The following manufacturing steps can be performed as in the case of the transistor 100. In this manner, the transistor 110 can be manufactured (see FIG. 2B).

(Method for Manufacturing Transistor 130)

Here, a method for manufacturing the transistor 130 (see FIGS. 3A to 3D) will be described; in particular, differences from the methods for manufacturing the transistor 100 and the transistor 110 will be described.

In the manufacture of the transistor 130, steps up to and including a first etching step, through which the base insulating film 103 has a projection in a region in contact with the third oxide semiconductor film 124 (see FIG. 8A), are similar to those of the transistor 110.

Figure 9A:
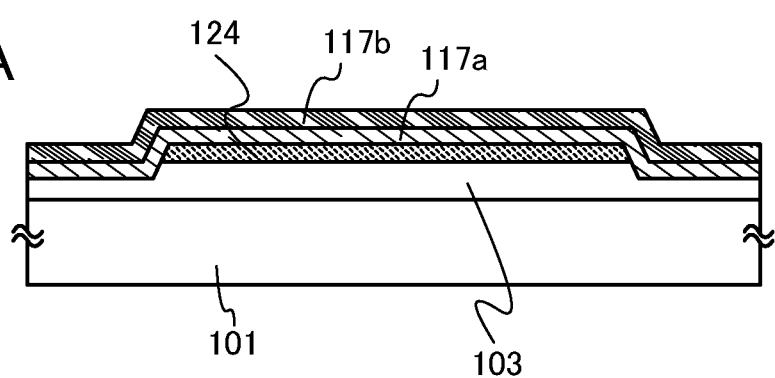
FIGS. 9A and 9B are cross-sectional views which illustrate an example of a method for manufacturing a semiconductor device according to one embodiment of the present invention.

Next, instead of the second insulating film 117, a stacked-layer structure of insulating films 117a and 117b is formed over the base insulating film 103 and the third oxide semiconductor film 124 (see FIG. 9A).

The insulating film 117a in contact with the third oxide semiconductor film 124 is formed using an oxide insulating film material which can be used for the base insulating film 103, such as silicon oxide, gallium oxide, aluminum oxide, hafnium oxide, or yttrium oxide, and is preferably formed using the above-described oxide insulating film at least a surface of which contains oxygen and from which part of the oxygen is released by heat treatment. Note that the insulating film 117a may have either a single-layer structure or a stacked-layer structure.

The insulating film 117b in contact with the insulating film 117a is formed using one selected from insulating film materials such as aluminum oxide, aluminum oxynitride, aluminum nitride, silicon nitride oxide, and silicon nitride. The insulating film 117b is preferably formed using one selected from aluminum oxide, aluminum oxynitride, and aluminum nitride.

Then, surfaces of the insulating films 117a and 117b are subjected to CMP treatment so that a surface of the third oxide semiconductor film 124 is exposed, so that the sidewall insulating films 107a and 107b in contact with at least side surfaces of the third oxide semiconductor film 124 are formed as a third insulating film. As conditions or the like of the CMP treatment performed on the surfaces of the insulating films 117a and 117b, the conditions given in the description of the method for manufacturing the transistor 100 may be employed as appropriate.

As in the case of the transistor 110, the base insulating film 103 is formed to have the projection in the region which is in contact with the third oxide semiconductor film 124, whereby the third oxide semiconductor film 124 is enclosed by the sidewall insulating films 107a and 107b. Further, second heat treatment may be performed. With the structure in which the sidewall insulating films 107a and 107b are stacked, oxygen released from the sidewall insulating film 107a by the second heat treatment can be prevented (blocked) from being released to the outside of the object to be processed. Accordingly, part of oxygen contained in the sidewall insulating film 107a can be efficiently diffused to the side surfaces of the third oxide semiconductor film 124 and oxygen deficiency can be sufficiently compensated for. In this manner, the oxide semiconductor film 105 (fourth oxide semiconductor film) can be formed (see FIG. 9B).

The following manufacturing steps can be performed as in the case of the transistor 100. In this manner, the transistor 130 can be manufactured (see FIG. 3B).

In addition, the sidewall insulating films 107a and 107b of the transistor 130 are preferably formed in the following manner: the insulating film 117b is subjected to CMP treatment so that the surface of the insulating film 117a is exposed; then, the insulating film 117a is etched by dry etching so that the surface of the third oxide semiconductor film 124 is exposed.

The etching rates in dry etching of aluminum oxide, aluminum oxynitride, and aluminum nitride in particular, which can be used for the insulating film 117b, are far lower than the etching rate of the oxide insulating film material used for the insulating film 117a; therefore, the sidewall insulating film 107b can be used as an etching mask for the insulating film 117a. In this manner, modification of the oxide semiconductor film due to physical polishing of the third oxide semiconductor film 124, such as generation of a defect on the surface of the third oxide semiconductor film 124 or degradation in alignment or crystallinity, can be suppressed.

Figure 10A:
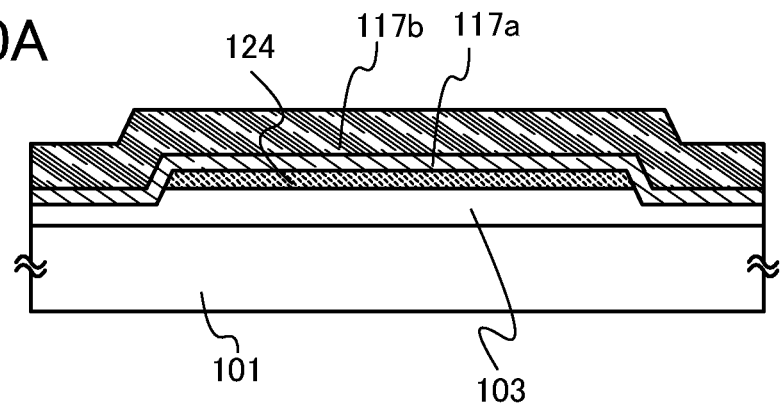
FIGS. 10A to 10C are cross-sectional views which illustrate an example of a method for manufacturing a semiconductor device according to one embodiment of the present invention.

In the formation method described above, the insulating film 117b may be formed to be thicker than the insulating film 117a as illustrated in FIG. 10A. Specifically, the insulating film 117b is formed so that a top surface of a region of the insulating film 117b, which does not overlap with the third oxide semiconductor film 124, is at a higher position than a top surface of a region of the insulating film 117a, which overlaps with the third oxide semiconductor film 124. For example, in the case where the insulating film 117a is formed to a thickness of approximately 20 nm, the insulating film 117b may be formed to a thickness of approximately 50 nm.

Figure 10B:
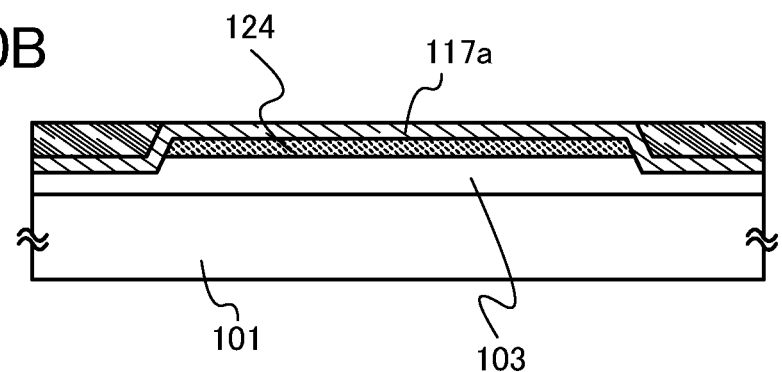
Figure 10C:
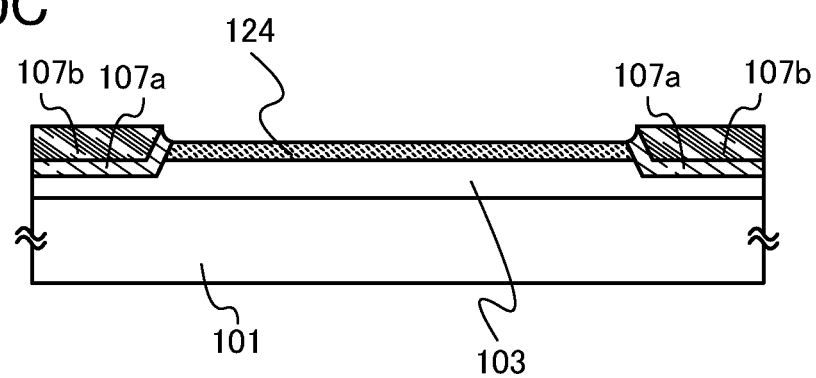

The insulating film 117b is subjected to CMP treatment so that the surface of the insulating film 117a is exposed (see FIG. 10B). After that, the insulating film 117a is subjected to dry etching so that the surface of the third oxide semiconductor film 124 is exposed. Thus, the sidewall insulating films 107a and 107b are formed (see FIG. 10C). The insulating film 117b is hardly etched while the insulating film 117a is etched, so that a step is formed by the insulating film 107a and the insulating film 107b at the periphery of the third oxide semiconductor film 124.

Note that there is a possibility that the third oxide semiconductor film 124 is also etched in the dry etching of the insulating film 117a. For that reason, it is necessary to employ etching conditions where the etching selectivity of the insulating film 117a to the third oxide semiconductor film 124 is high. Conditions of the dry etching here are as follows, for example: the ICP/bias power is 500/50 W; the pressure is 1.5 Pa; a mixed gas of $CF_4$ and $O_2$ is used as an etching gas; and the flow rate ratio of $CF_4$ to $O_2$ is 70:30 [sccm]. When such conditions are employed, the insulating film 117a can be selectively removed and the sidewall insulating films 107a and 107b can be formed. Moreover, in this manner, etching of the third oxide semiconductor film 124 and modification of the oxide semiconductor film can be suppressed. Note that the dry etching is preferably performed while entry of an impurity including hydrogen is prevented.

Figure 11:
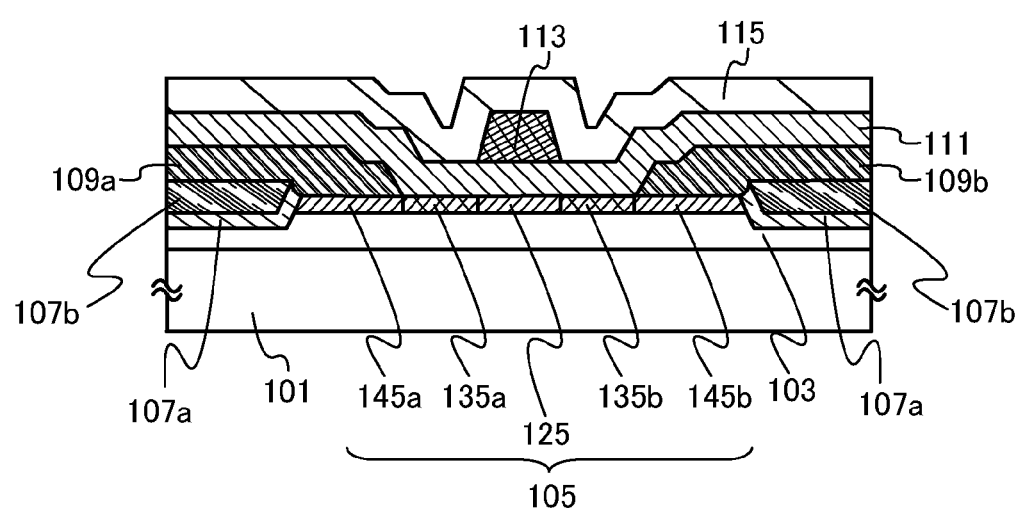
FIG. 11 is a cross-sectional view which illustrates an example of a semiconductor device according to one embodiment of the present invention.

Here, a cross section of the transistor 130 in the case where CMP treatment and dry etching are performed in this order in formation of the sidewall insulating films 107a and 107b is illustrated in FIG. 11.

(Method for Manufacturing Transistor 140)

Here, a method for manufacturing the transistor 140 (see FIGS. 25A to 25D) will be described; in particular, differences from the methods for manufacturing the transistor 100 and the transistor 110 will be described.

Figure 5C:
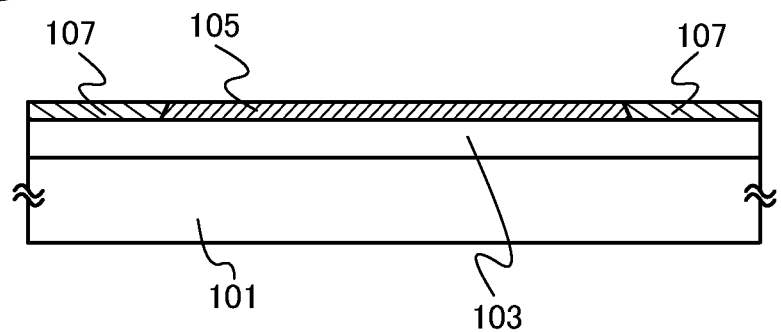

In the manufacture of the transistor 140, steps up to and including a step of forming the oxide semiconductor film 105 and the sidewall insulating film 107 are similar to those of the transistor 110 (see FIG. 5C).

Figure 26A:
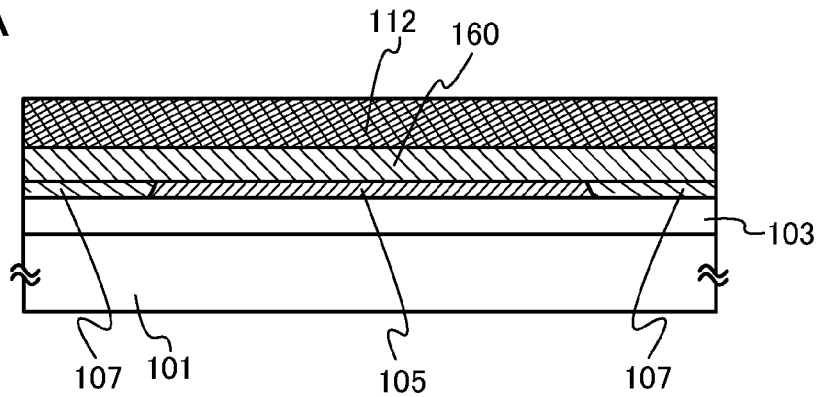
FIGS. 26A to 26D are cross-sectional views which illustrate an example of a method for manufacturing a semiconductor device according to one embodiment of the present invention.

Next, an insulating film 160 which is to be the gate insulating film 161 and a conductive film 112 which is to be the gate electrode 113 are formed over the oxide semiconductor film 105 and the sidewall insulating film 107 (see FIG. 26A). The insulating film 160 and the conductive film 112 may be formed using, as appropriate, any of the insulating materials given in the description of the gate insulating film 111 and any of the conductive materials given in the description of the gate electrode 113, respectively. After that, heat treatment may be performed.

Figure 26B:
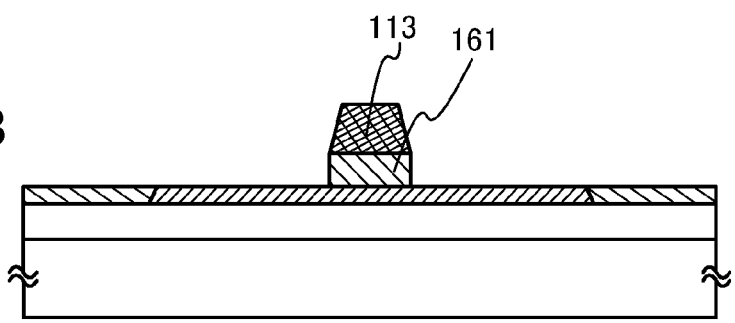

Next, a photolithography step is performed, so that a resist mask is formed over the conductive film 112. Then, with the use of the resist mask, the conductive film 112 and the insulating film 160 are etched, so that the gate electrode 113 and the gate insulating film 161 are formed (see FIG. 26B). In this etching step, part of the insulating film 160 is etched, and thus part of the oxide semiconductor film 105 is exposed.

Figure 26C:
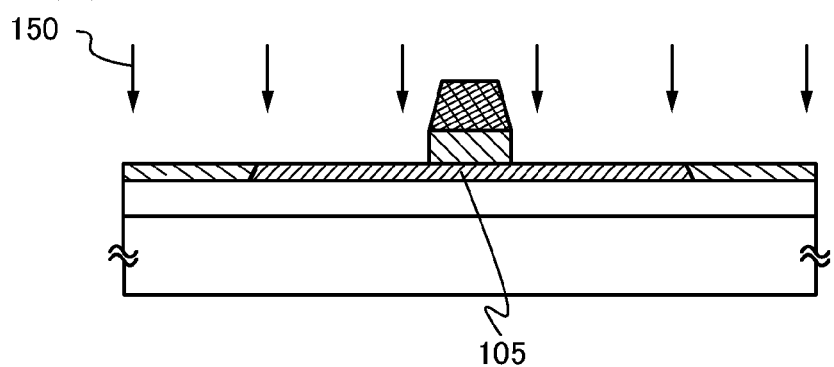
Figure 26D:
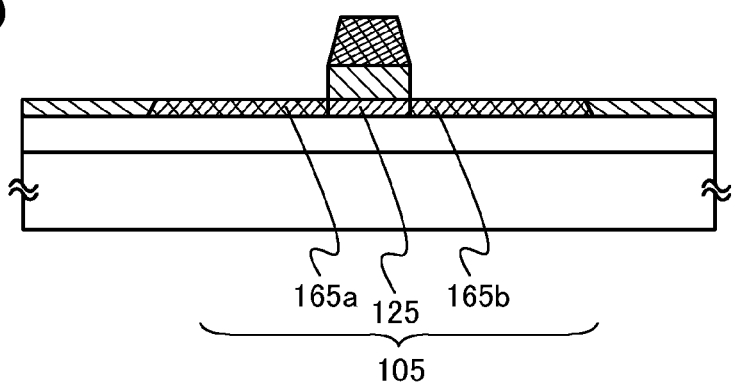

Next, the dopant 150 is added to the oxide semiconductor film 105 (see FIG. 26C). As a result, the first oxide semiconductor region 125 and the pair of second oxide semiconductor regions 165a and 165b are formed (see FIG. 26D). These regions are formed in a self-aligned manner by adding the dopant with the use of the gate electrode 113 and the gate insulating film 161 as masks. After that, heat treatment may be performed. In addition, the dopant may be added by a method similar to that of the transistor 100.

Figure 27A:
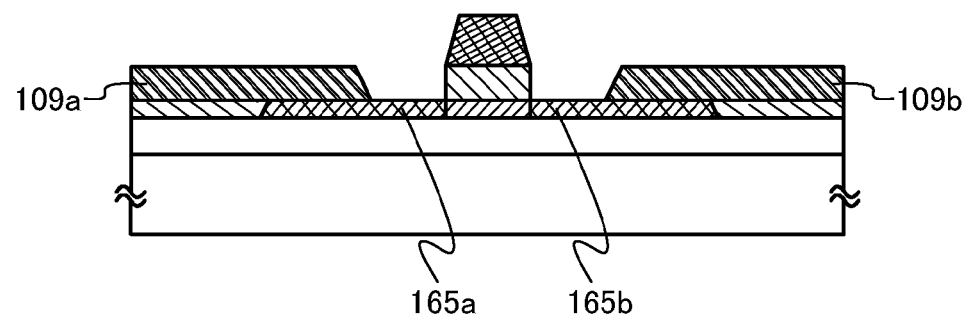
FIGS. 27A and 27B are cross-sectional views which illustrate an example of a method for manufacturing a semiconductor device according to one embodiment of the present invention.

Next, a conductive film which is to be a source electrode and a drain electrode is formed over the oxide semiconductor film 105, the sidewall insulating film 107, the gate insulating film 161, and the gate electrode 113. Then, a photolithography step is performed, so that a resist mask is formed over the conductive film. After that, the conductive film is etched using the resist mask. Thus, the source electrode 109a and the drain electrode 109b are formed (see FIG. 27A).

Note that the source electrode 109a and the drain electrode 109b are formed so as to be partly in contact with the second oxide semiconductor region 165a and the second oxide semiconductor region 165b, respectively. As a result, regions of the pair of second oxide semiconductor regions 165a and 165b, which are in contact with the source electrode 109a and the drain electrode 109b, function as a source region and a drain region; a region which is in contact with neither the source electrode 109a nor the drain electrode 109b functions as an LDD region. Since the dopant is added to the regions of the pair of second oxide semiconductor regions 165a and 165b, which are in contact with the source electrode 109a and the drain electrode 109b, the contact resistance between the second oxide semiconductor region 165a and the source electrode 109a and between the second oxide semiconductor region 165b and the drain electrode 109b can be reduced. Accordingly, the on-state current of the completed transistor 140 can be increased.

Figure 27B:
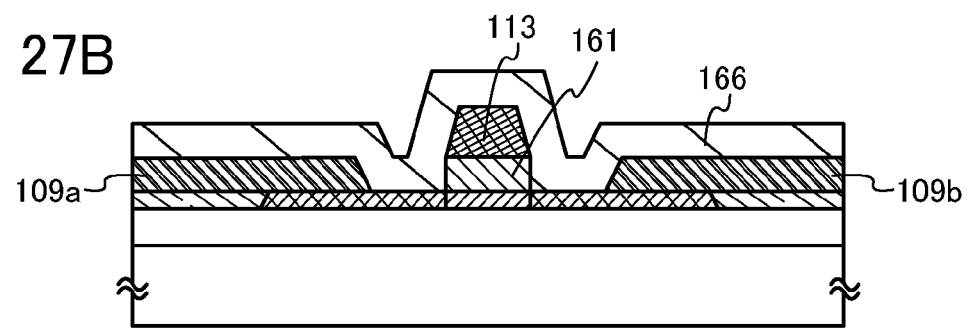

Next, the protective insulating film 166 is formed over the oxide semiconductor film 105, the source electrode 109a, the drain electrode 109b, the gate insulating film 161, and the gate electrode 113 (see FIG. 27B). The source electrode 109a, the drain electrode 109b, and the protective insulating film 166 may be formed as in the case of the transistor 100.

Through the above steps, the transistor 140 can be manufactured.

In the above-described manner, the transistor 100, the transistor 110, the transistor 130, and the transistor 140 each having electric characteristics which are favorable and less likely to fluctuate can be manufactured.

Note that the structures, methods, and the like described in this embodiment can be combined as appropriate with any of the structures, methods, and the like described in the other embodiments.

Embodiment 2

In this embodiment, a transistor having a structure which is partly different from the structures of the transistors described in Embodiment 1 and a method for manufacturing the transistor will be described.

Figure 12A:
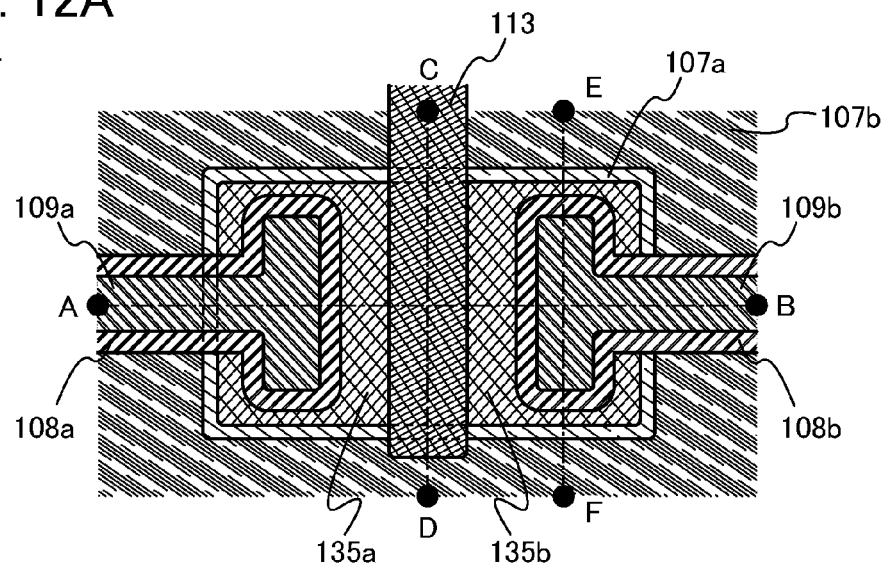
FIGS. 12A to 12D are a top view and cross-sectional views which illustrate an example of a semiconductor device according to one embodiment of the present invention.
Figure 12B:
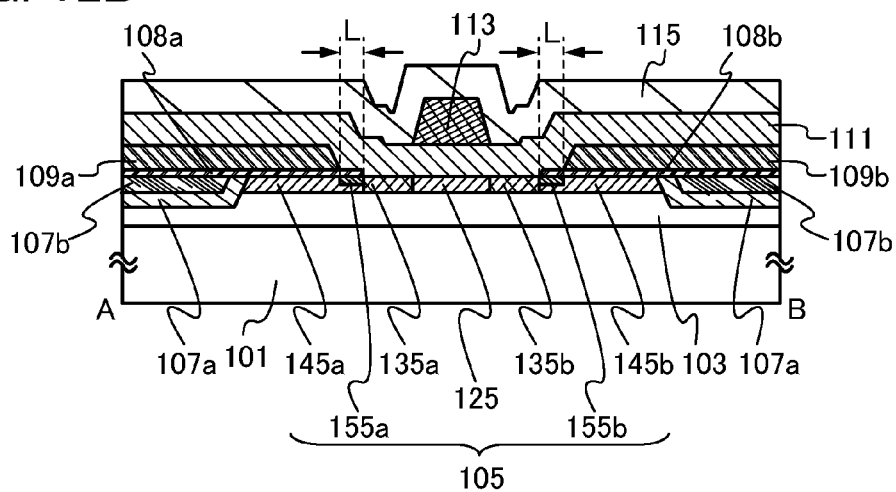
Figure 12C:
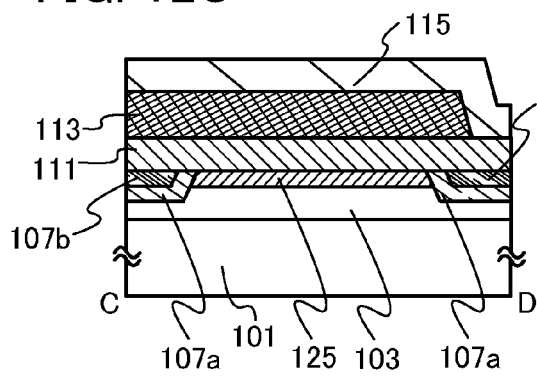
Figure 12D:
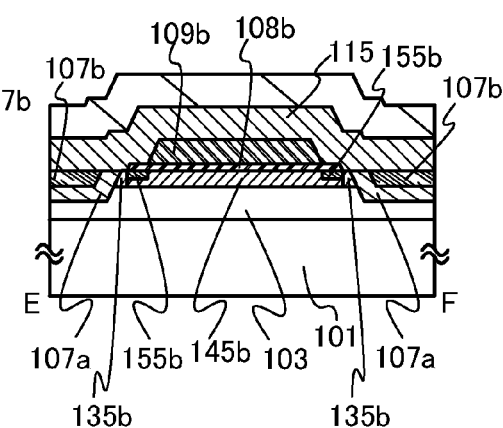

FIG. 12A is a top view illustrating a structure of a transistor 200 which is one embodiment of the present invention. FIG. 12B corresponds to a cross-sectional view along dashed-dotted line A-B in FIG. 12A. FIG. 12C corresponds to a cross-sectional view along dashed-dotted line C-D in FIG. 12A. FIG. 12D corresponds to a cross-sectional view along dashed-dotted line E-F in FIG. 12A. Note that the base insulating film 103, the gate insulating film 111, and the protective insulating film 115 are not illustrated in FIG. 12A for clarity.

In FIGS. 12A to 12D, the transistor 200 includes the substrate 101; the base insulating film 103 provided over the substrate 101; the oxide semiconductor film 105 provided over the base insulating film 103; the sidewall insulating films 107a and 107b which are provided over the base insulating film 103 and provided on at least side surfaces of the oxide semiconductor film 105; source electrodes 108a and 109a and drain electrodes 108b and 109b which are provided over the oxide semiconductor film 105 and the sidewall insulating films 107a and 107b; the gate insulating film 111 covering part of the oxide semiconductor film 105, the source electrodes 108b and 109a, and the drain electrodes 108a and 109b; and the gate electrode 113 which is over the gate insulating film 111 and overlaps with the oxide semiconductor film 105.

Note that the transistor 200 may have a structure in which the protective insulating film 115 covering the gate insulating film 111 and the gate electrode 113 is additionally provided.

As for the source electrodes 108a and 109a and the drain electrodes 108b and 109b, the source electrode 108a and the drain electrode 108b which are in contact with the oxide semiconductor film 105 are formed using a conductive material different from that for the source electrode 109a and the drain electrode 109b which are in contact with the source electrode 108a and the drain electrode 108b. Further, end portions of the source electrode 108a and the drain electrode 108b are located outside end portions of the source electrode 109a and the drain electrode 109b.

Thus, in the source electrodes 108a and 109a and the drain electrodes 108b and 109b, there are regions having a first thickness, which include the source electrodes 108a and 109a and the drain electrodes 108b and 109b, and regions having a second thickness that is smaller than the first thickness, which include the source electrode 108a and the drain electrode 108b. For example, the regions having the second thickness correspond to regions L in FIG. 12B where the source electrode 108a and the drain electrode 108b extend beyond the source electrode 109a and the drain electrode 109b.

The oxide semiconductor film 105 of the transistor 200 includes a region to which a dopant is added and a region to which the dopant is not added. Specifically, the oxide semiconductor film 105 of the transistor 200 includes the first oxide semiconductor region 125 overlapping with the gate electrode 113, the pair of second oxide semiconductor regions 135a and 135b, the pair of third oxide semiconductor regions 145a and 145b overlapping with at least the regions having the first thickness, and fourth oxide semiconductor regions 155a and 155b overlapping with only the regions having the second thickness (regions L).

The pair of second oxide semiconductor regions 135a and 135b is provided with the first oxide semiconductor region 125 sandwiched therebetween. The pair of third oxide semiconductor regions 145a and 145b is provided outside the pair of second oxide semiconductor regions 135a and 135b. The pair of fourth oxide semiconductor regions 155a and 155b is provided outside the pair of second oxide semiconductor regions 135a and 135b (see FIG. 12B).

A dopant is added to the pair of second oxide semiconductor regions 135a and 135b and the pair of fourth oxide semiconductor regions 155a and 155b, whereas the dopant is not added to the first oxide semiconductor region 125 and the pair of third oxide semiconductor regions 145a and 145b.

As for the regions to which the dopant is added, there is a difference in dopant concentration between the pair of second oxide semiconductor regions 135a and 135b and the pair of fourth oxide semiconductor regions 155a and 155b; therefore, the pair of second oxide semiconductor regions 135a and 135b is referred to as first LDD regions and the pair of fourth oxide semiconductor regions 155a and 155b is referred to as second LDD regions in this embodiment.

In the transistor 200, a channel formation region is the first oxide semiconductor region 125 overlapping with the gate electrode 113.

(Method for Manufacturing Transistor 200)

A method for manufacturing the transistor 200 will be described; in particular, differences from the methods for manufacturing the transistors in Embodiment 1 will be described.

Figure 9B:
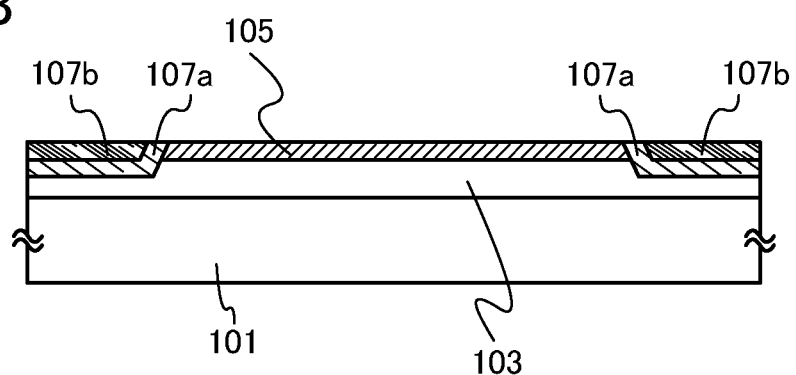

First, as in the method for manufacturing the transistor 130, steps up to and including a step of forming the oxide semiconductor film 105 are performed (see FIGS. 9A and 9B).

Figure 13A:
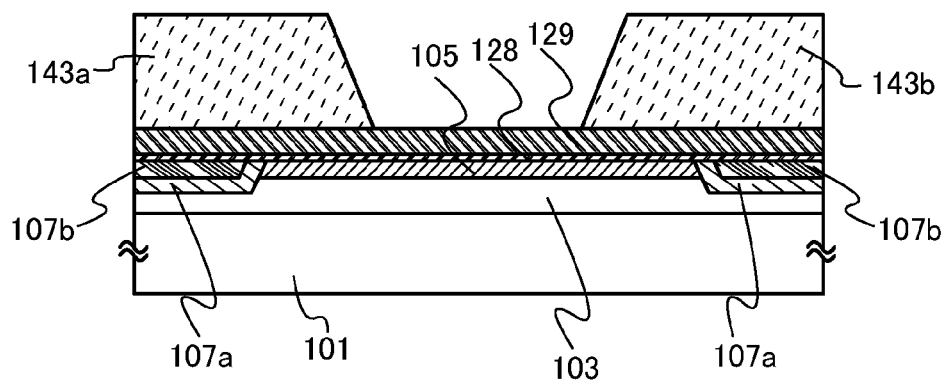
FIGS. 13A to 13C are cross-sectional views which illustrate an example of a method for manufacturing a semiconductor device according to one embodiment of the present invention.

Next, a conductive film 128 which is to be the source electrode 108a and the drain electrode 108b is formed over the oxide semiconductor film 105 and the sidewall insulating films 107a and 107b. A conductive film 129 which is to be the source electrode 109a and the drain electrode 109b is formed over the conductive film 128. Resist masks 143a and 143b for forming the source electrode 108a and the drain electrode 108b are formed over the conductive film 129 (see FIG. 13A). Note that the resist masks 143a and 143b may be formed in a photolithography step.

As a conductive material for the conductive film 128, a metal such as aluminum, titanium, chromium, nickel, yttrium, zirconium, molybdenum, silver, tantalum, or tungsten or an alloy containing any of these metals as a main component is used. The conductive film 128 is preferably formed to have a single-layer structure. Alternatively, a single-layer structure using a transparent conductive material containing indium oxide, tin oxide, or zinc oxide may be employed.

The conductive film 129 can be formed to have a single-layer structure with the use of a conductive material which is different from that used for the conductive film 128, such as a metal, an alloy containing the metal as a main component, or any of the above transparent conductive materials. Alternatively, the conductive film 129 may have a two-layer structure in which a titanium film is stacked over an aluminum film, a two-layer structure in which a titanium film is stacked over a tungsten film, a two-layer structure in which a copper film is stacked over a copper-magnesium-aluminum alloy film, or a three-layer structure in which a titanium film, an aluminum film, and a titanium film are stacked in this order.

The conductive film 128 is preferably formed to have a smaller thickness than the conductive film 129. The thickness of the conductive film 128 corresponds to the thickness of each of the source electrode 108a and the drain electrode 108b, and further corresponds to the second thickness in the source electrodes 108a and 109a and the drain electrodes 108b and 109b. Further, the dopant concentration of the second LDD regions described later depends on the thicknesses of the source electrode 108a and the drain electrode 108b; therefore, the thickness of the conductive film 128 is determined so that the dopant concentration of the pair of fourth oxide semiconductor regions 155a and 155b is within the range given below.

For example, the thickness of the conductive film 128 is preferably greater than or equal to 10 nm and less than or equal to 50 nm. By forming the conductive film 128 to be thin, in the case where dry etching is performed to process the conductive film 129 into the source electrode 109a and the drain electrode 109b, an etching gas can be prevented from reaching and etching side surfaces of the source electrode 108a and the drain electrode 108b which have already been formed. Thus, the source electrode 108a and the drain electrode 108b can be processed to be accurately aligned with the resist masks 143a and 143b. Accordingly, the first LDD regions and the second LDD regions can be formed even in a minute transistor having a small channel length.

The thicknesses of the second LDD regions to be formed can be controlled by adjusting the thickness of the conductive film 128. In other words, the addition depth (addition region) of the dopant which is added to the oxide semiconductor film 105 can be controlled. For example, in the transistor 200, the second LDD regions are formed in portions in the vicinity of a top surface of the oxide semiconductor film 105; when the thickness of the conductive film 128 is reduced as much as possible, the second LDD regions can be entirely formed in the thickness direction from the top surface to a bottom surface of the oxide semiconductor film 105 (not shown).

First, the conductive film 128 and the conductive film 129 are selectively etched using the resist masks 143a and 143b, so that the source electrode 108a, the drain electrode 108b, and a pair of conductive films 129a and 129b are formed.

For example, the conductive film 129 is etched using an ICP apparatus under etching conditions where the ICP power is 450 W; the bias power is 100 W; boron trichloride and chlorine are used as an etching gas at flow rates of 60 sccm and 20 sccm, respectively; and the pressure in the treatment chamber is 1.9 Pa. Thus, the pair of conductive films 129a and 129b is formed. After that, the conductive film 128 is etched using the ICP apparatus under etching conditions where the ICP power is 500 W; the bias power is 150 W; carbon tetrafluoride, chlorine, and oxygen are used as an etching gas at flow rates of 25 sccm, 25 sccm, and 10 sccm, respectively; and the pressure in the treatment chamber is 1.9 Pa. Thus, the source electrode 108a and the drain electrode 108b are formed.

Figure 13B:
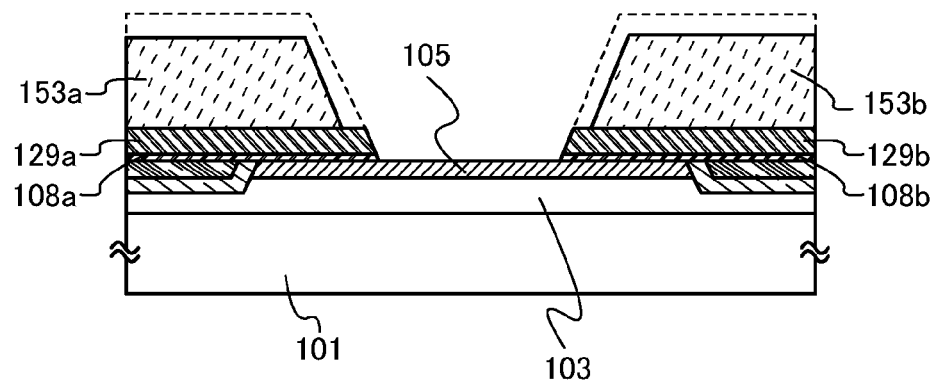

Next, the resist masks 143a and 143b are shrunk (reduced in size), so that resist masks 153a and 153b for processing the pair of conductive films 129a and 129b are formed (see FIG. 13B). The shrinking (reduction in size) of the resist masks 143a and 143b needs to be performed so that portions of the source electrode 108a and the drain electrode 108b, which have at least widths corresponding to those of the second LDD regions, are exposed. The resist masks 143a and 143b may be shrunk (reduced in size) by oxygen plasma ashing.

Figure 13C:
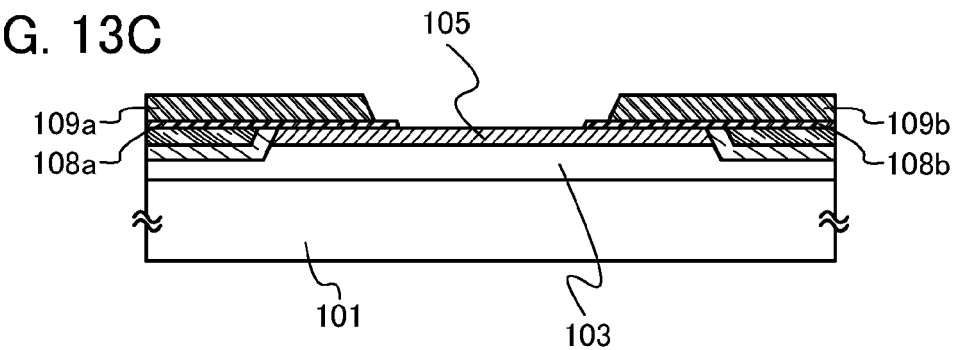

The pair of conductive films 129a and 129b is selectively etched using the resist masks 153a and 153b, and then the resist masks 153a and 153b are removed, so that the source electrode 109a and the drain electrode 109b are formed (see FIG. 13C).

When dry etching is performed at the time of selectively etching the pair of conductive films 129a and 129b, the oxide semiconductor film 105 might also be etched; therefore, the source electrode 109a and the drain electrode 109b are preferably formed under etching conditions where the etching selectivity of the pair of conductive films 129a and 129b (conductive film 129) to the oxide semiconductor film 105 is high. Note that in this step, part of the oxide semiconductor film 105 may be etched so that the oxide semiconductor film 105 has a depression.

Note that the following conditions can be employed as examples of the etching conditions for the pair of conductive films 129a and 129b: an ICP apparatus is used; the ICP power is 350 W; the bias power is 20 W; boron trichloride and chlorine are used as an etching gas at flow rates of 60 sccm and 20 sccm, respectively; and the pressure in a treatment chamber is 2.0 Pa.

By being formed in this manner, the source electrodes 108a and 109a and the drain electrodes 108b and 109b include the regions having the first thickness and the regions having the second thickness that is smaller than the first thickness.

Note that the resist masks 153a and 153b may be removed by oxygen plasma ashing as in Embodiment 1.

The following steps may also be employed: the conductive film 129 is etched using first resist masks (not shown), which are different from the resist masks 143a and 143b, so that the source electrode 109a and the drain electrode 109b are formed; the first resist masks are removed; second resist masks (not shown) are formed in a photolithography step; and the conductive film 128 is etched using the second resist masks, so that the source electrode 108a and the drain electrode 108b are formed. By formation in this manner, the number of times the surface of the oxide semiconductor film 105 is exposed to a reduced-pressure atmosphere or a reducing atmosphere in the treatment chamber can be reduced; thus, oxygen deficiency caused in the oxide semiconductor film 105 can be reduced. Accordingly, the transistor 200 can have favorable electric characteristics.

Figure 14A:
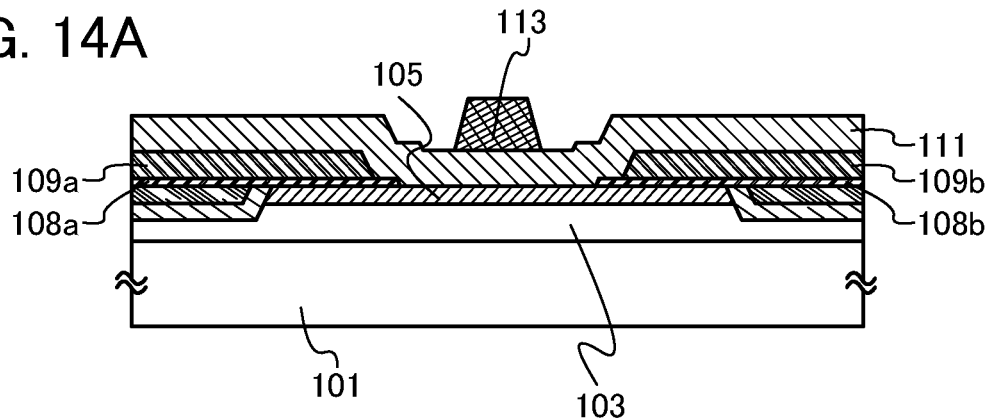
FIGS. 14A to 14C are cross-sectional views which illustrate an example of a method for manufacturing a semiconductor device according to one embodiment of the present invention.

Next, the gate insulating film 111 is formed over the oxide semiconductor film 105, the source electrodes 108a and 109a, and the drain electrodes 108b and 109b, and the gate electrode 113 is formed over the gate insulating film 111 (see FIG. 14A). The gate insulating film 111 and the gate electrode 113 may be formed as in the case of the transistor 130.

Figure 14B:
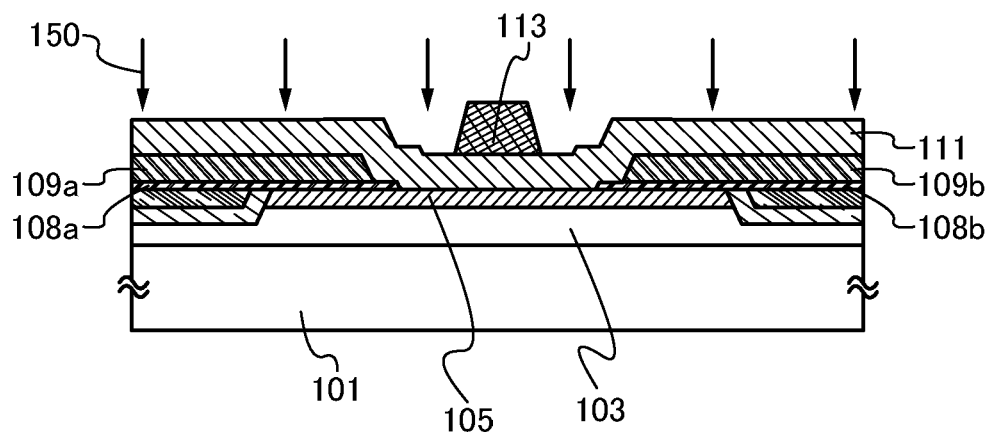

Next, the first oxide semiconductor region 125, the first LDD regions, the pair of third oxide semiconductor regions 145a and 145b, and the second LDD regions are formed in the oxide semiconductor film 105. These regions are formed in a self-aligned manner by adding the dopant 150 with the use of the gate electrode 113, the source electrodes 108a and 109a, and the drain electrodes 108b and 109b as masks (see FIG. 14B).

The step of adding the dopant 150 may be performed as in the case of the transistor 100. Note that the dopant concentration of the first LDD regions depends on the thickness of the gate insulating film 111; thus, the thickness of the gate insulating film 111 is determined so that the dopant concentration of the first LDD regions is within the range given below. At this time, in the case where portions of the oxide semiconductor film 105, which are to be the first LDD regions and the second LDD regions, include crystalline regions, the crystallinity might be decreased in the portions because of damage due to the addition of the dopant 150 for forming the first LDD regions and the second LDD regions, which causes the portions to be amorphous regions.

The dopant is added to the first LDD regions through the gate insulating film 111, and the dopant is added to the second LDD regions through the source electrode 108a and the drain electrode 108b. The dopant passes through the gate insulating film 111 more easily than through the source electrode 108a and the drain electrode 108b. Therefore, the dopant concentration of the first LDD regions is higher than the dopant concentration of the second LDD regions.

The conductivity of each of the first LDD regions and the second LDD regions is higher than or equal to 10 S/cm and lower than or equal to 1000 S/cm, preferably higher than or equal to 100 S/cm and lower than or equal to 1000 S/cm. Note that when the conductivity is too low, the on-state current of the transistor 200 is decreased.

The carrier density can be increased by increasing the dopant concentrations of the first LDD regions and the second LDD regions; however, an excessively high dopant concentration may cause the dopant to inhibit transfer of carriers and the conductivity of each of the first LDD regions and the second LDD regions to be decreased.

For that reason, the dopant concentration of each of the first LDD regions and the second LDD regions is preferably higher than or equal to $5 \times 10^{18}$ atoms/cm$^3$ and lower than or equal to $1 \times 10^{22}$ atoms/cm$^3$. Further, heat treatment may be performed after the dopant 150 is added.

Furthermore, the treatment for adding the dopant 150 may be performed plural times. In the case where the treatment for adding the dopant 150 is performed plural times, the kind of the dopant 150 may be the same in the plural treatments or different in every treatment.

As conditions of the addition of the dopant 150, the conditions described in Embodiment 1 can be employed.

Figure 14C:
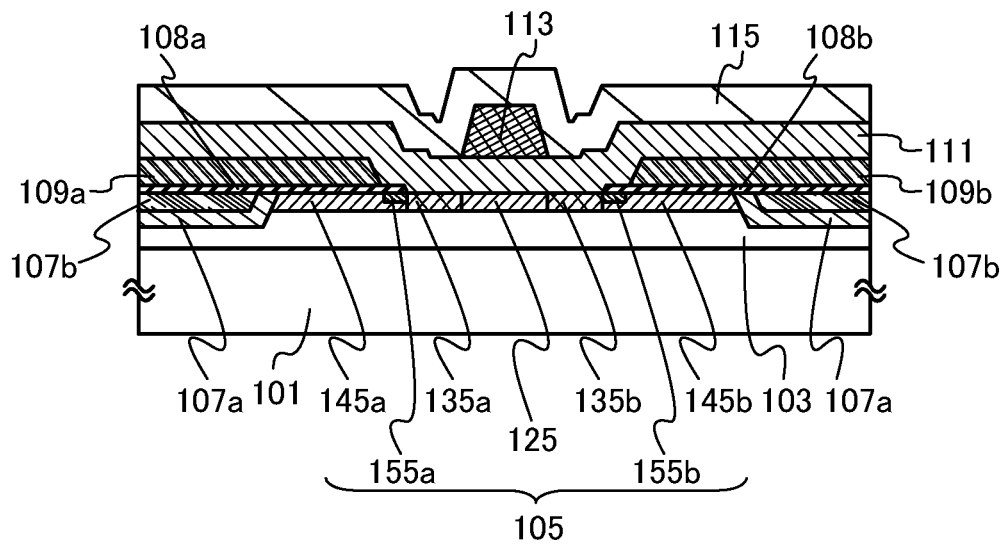
Figure 15:
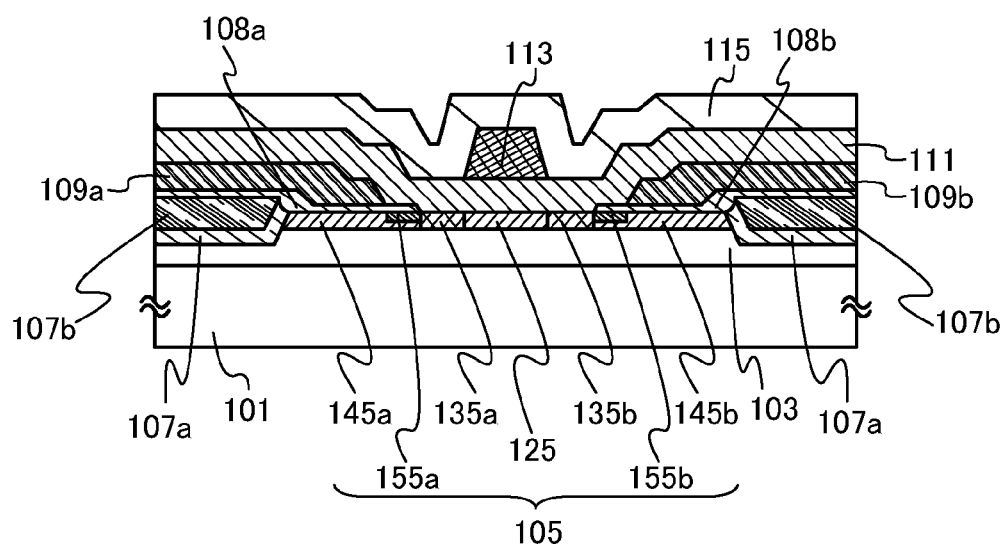
FIG. 15 is a cross-sectional view which illustrates an example of a semiconductor device according to one embodiment of the present invention.

The following manufacturing steps can be performed as in the case of the transistor 130. In this manner, the transistor 200 can be manufactured (see FIG. 14C). Note that a cross section of the transistor 200 in the case where CMP treatment and dry etching are performed in this order in formation of the sidewall insulating films 107a and 107b is illustrated in FIG. 15.

In the transistor 200, the first LDD regions and the second LDD regions to which the dopant is added are provided on both sides of the first oxide semiconductor region 125 serving as the channel formation region, whereby an electric field applied to the first oxide semiconductor region 125 serving as the channel formation region can be relieved. Accordingly, an influence of a short-channel effect caused by extremely reducing the channel length of the transistor 200 can be suppressed.

In addition, a conductive film having resistivity higher than that of the source electrodes 108a and 109a and the drain electrodes 108b and 109b and lower than that of the oxide semiconductor film 105, like the low-resistance film described in Embodiment 1, may be provided between the oxide semiconductor film 105 and the source electrode 108a and between the oxide semiconductor film 105 and the drain electrode 108b.

As in Embodiment 1, a film formed using an In—Ga—Zn-based metal oxide containing nitrogen, an In—Sn-based metal oxide containing nitrogen, an In—Ga-based metal oxide containing nitrogen, an In—Zn-based metal oxide containing nitrogen, tin oxide containing nitrogen, indium oxide containing nitrogen, or a metal nitride (such as InN or ZnN) may be provided between the gate electrode 113 and the gate insulating film 111.

As for the source electrodes 108a and 109a and the drain electrodes 108b and 109b, a stacked-layer structure of the conductive film 128 and the conductive film 129 is formed in this embodiment. However, a conductive film having a single-layer structure using a metal such as aluminum, titanium, chromium, nickel, copper, yttrium, zirconium, molybdenum, silver, tantalum, or tungsten or an alloy containing any of these metals as a main component may be formed instead of the stacked-layer structure, and processing may be performed so that the conductive film having the single-layer structure includes a region having a first thickness and a region having a second thickness that is smaller than the first thickness. In this manner, a source electrode and a drain electrode may be formed. Note that for the conductive film having a single-layer structure, aluminum containing silicon or a transparent conductive material containing indium oxide, tin oxide, or zinc oxide may be used.

Note that the transistor 200 is manufactured on the basis of the structure of transistor 130, in which the substrate 101, the base insulating film 103, the oxide semiconductor film 105, and the sidewall insulating films 107a and 107b are stacked; the manufacturing method described in this embodiment may be applied to the structures of the transistor 100 and the transistor 110, in which the substrate 101, the base insulating film 103, the oxide semiconductor film 105, and the sidewall insulating film 107 are stacked.

In the above-described manner, the transistor 200 having electric characteristics which are favorable and less likely to fluctuate can be manufactured.

Note that the structures, methods, and the like described in this embodiment can be combined as appropriate with any of the structures, methods, and the like described in the other embodiments.

Embodiment 3

In this embodiment, a transistor having a structure which is different from the structures of the transistors described in Embodiments 1 and 2 will be described.

Figure 16:
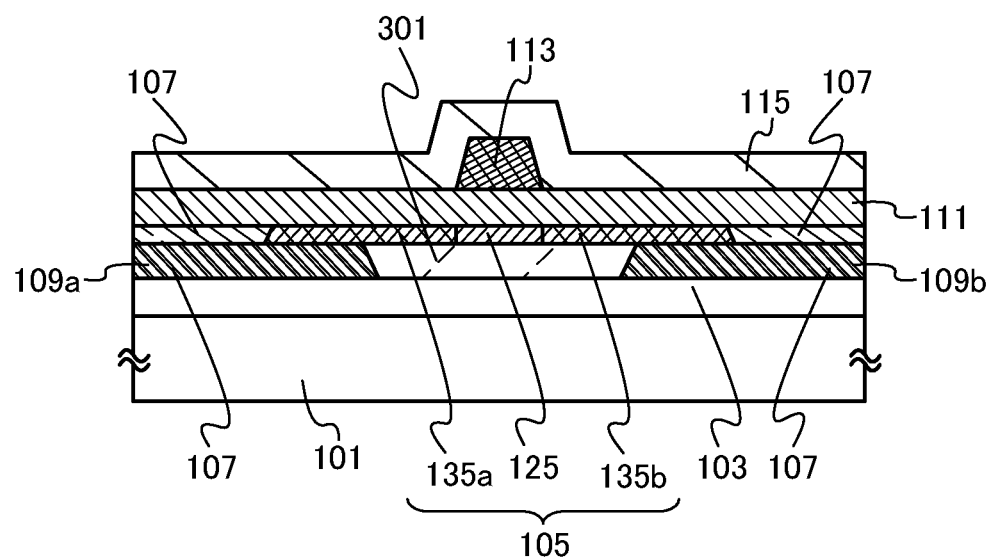
FIG. 16 is a cross-sectional view which illustrates an example of a semiconductor device according to one embodiment of the present invention.

FIG. 16 is a cross-sectional view illustrating a structure of a transistor 300 which is one embodiment of the present invention.

The transistor 300 illustrated in FIG. 16 has a structure in which the source electrode 109a and the drain electrode 109b are provided over the substrate 101; an insulating film 301 is provided between the source electrode 109a and the drain electrode 109b; the oxide semiconductor film 105 is provided over the source electrode 109a, the drain electrode 109b, and the insulating film 301; the sidewall insulating film 107 is provided on side surfaces of the oxide semiconductor film 105; the gate insulating film 111 is provided over the oxide semiconductor film 105 and the sidewall insulating film 107; the gate electrode 113 is provided over the gate insulating film 111; and the protective insulating film 115 is provided to cover the gate insulating film 111 and the gate electrode 113. That is, the transistor 300 has a top-gate bottom-contact structure.

Further, in the oxide semiconductor film 105 of the transistor 300, the first oxide semiconductor region 125 which overlaps with the gate electrode 113 and functions as a channel formation region, and the pair of second oxide semiconductor regions 135a and 135b between which the first oxide semiconductor region 125 is sandwiched and which functions as a source region and a drain region are formed. Note that the first oxide semiconductor region 125 does not contain a dopant, while the pair of second oxide semiconductor regions 135a and 135b contains the dopant.

The conductivity of the pair of second oxide semiconductor regions 135a and 135b is higher than or equal to 10 S/cm and lower than or equal to 1000 S/cm, preferably higher than or equal to 100 S/cm and lower than or equal to 1000 S/cm. Note that when the conductivity is too low, the on-state current of the transistor 300 is decreased.

The carrier density can be increased by increasing the dopant concentration of the pair of the second oxide semiconductor regions 135a and 135b; however, an excessively high dopant concentration may cause the dopant to inhibit transfer of carriers and the conductivity of the pair of the second oxide semiconductor regions 135a and 135b to be decreased.

For that reason, the dopant concentration of the pair of second oxide semiconductor regions 135a and 135b is preferably higher than or equal to $5\times10^{18}$ atoms/cm$^3$ and lower than or equal to $1\times10^{22}$ atoms/cm$^3$.

Furthermore, treatment for adding the dopant may be performed plural times. In the case where the treatment for adding the dopant is performed plural times, the kind of dopant may be the same in the plural treatments or different in every treatment.

As conditions of the addition of the dopant, the conditions described in Embodiment 1 can be employed.

Next, a method for manufacturing the transistor 300 will be described below. Here, description is made on the basis of the method for manufacturing the transistor in Embodiment 1; the method described in Embodiment 2 can also be applied as appropriate.

According to the method for manufacturing the transistor 300, the base insulating film 103, the source electrode 109a, and the drain electrode 109b are formed over the substrate 101. After that, the insulating film 301 is formed over the source electrode 109a and the drain electrode 109b by any of the methods described in the above embodiments as appropriate. The first oxide semiconductor film 120 is formed over the source electrode 109a, the drain electrode 109b, and the insulating film 301. First heat treatment is performed, so that the second oxide semiconductor film 122 is formed. The second oxide semiconductor film 122 is selectively etched, so that the third oxide semiconductor film 124 is formed. Then, the sidewall insulating film 107 which is in contact with at least side surfaces of the third oxide semiconductor film 124 is formed by any of the methods described in the above embodiments as appropriate. After the sidewall insulating film 107 is formed, second heat treatment is performed, so that a fourth oxide semiconductor film is formed. Then, the gate insulating film 111 is formed over the sidewall insulating film 107 and the fourth oxide semiconductor film, and the gate electrode 113 is formed over the gate insulating film 111.

After the gate electrode 113 is formed, the dopant is added to the fourth oxide semiconductor film with the use of the gate electrode 113 as a mask, whereby the oxide semiconductor film 105 including the first oxide semiconductor region 125 which does not contain the dopant and functions as the channel formation region and the pair of second oxide semiconductor regions 135a and 135b which contains the dopant and functions as the source region and the drain region can be formed in a self-aligned manner.

Next, the protective insulating film 115 is formed over the gate insulating film 111 and the gate electrode 113. Note that after formation of the gate insulating film 111, heat treatment similar to the second heat treatment is preferably performed; in a similar manner, after formation of the protective insulating film 115, heat treatment is preferably performed.

Through the above steps, the transistor 300 can be manufactured.

In the transistor 300, the insulating film 301 is provided between the source electrode 109a and the drain electrode 109b, and the sidewall insulating film 107 is provided on the side surfaces of the oxide semiconductor film 105; therefore, the gate insulating film 111 is provided in contact with only a top surface of the oxide semiconductor film 105. With such a structure, a step formed by a component provided below the gate insulating film 111 can be diminished and thus the thickness of the gate insulating film 111 can be reduced. By reducing the thickness of the gate insulating film 111 and by providing the pair of second oxide semiconductor regions 135a and 135b containing the dopant, an influence of a short-channel effect caused by extremely reducing the channel length of the transistor 300 can be suppressed.

Note that the structures, methods, and the like described in this embodiment can be combined as appropriate with any of the structures, methods, and the like described in the other embodiments.

Embodiment 4

In this embodiment, a transistor having a structure which is different from the structures of the transistors described in Embodiments 1 to 3 will be described.

Figure 17:
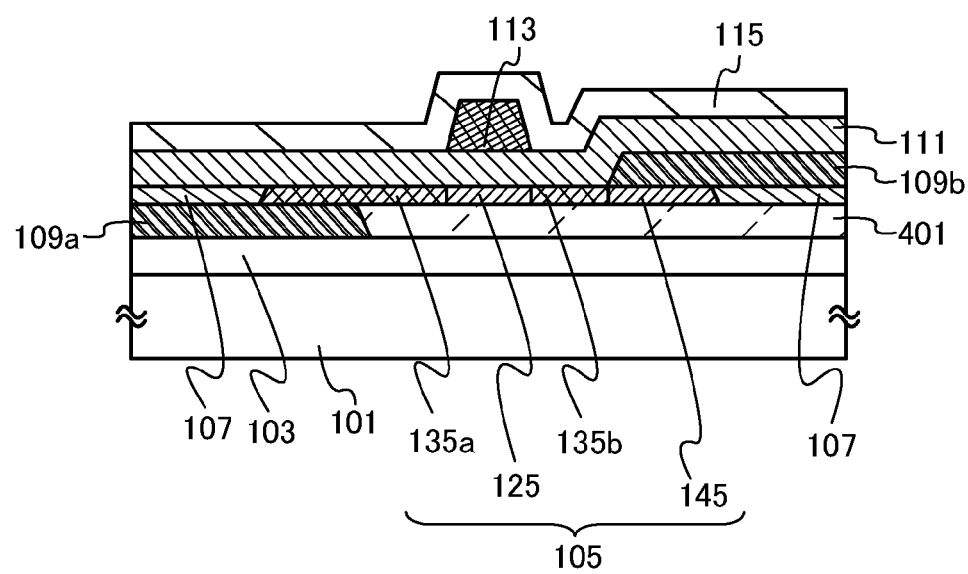
FIG. 17 is a cross-sectional view which illustrates an example of a semiconductor device according to one embodiment of the present invention.

FIG. 17 is a cross-sectional view illustrating a structure of a transistor 400 which is one embodiment of the present invention.

The transistor 400 illustrated in FIG. 17 includes the base insulating film 103 provided over the substrate 101; the source electrode 109a provided over the base insulating film 103; an insulating film 401 in contact with a side surface of the source electrode 109a; the oxide semiconductor film 105 in contact with the source electrode 109a and the insulating film 401; the sidewall insulating film 107 in contact with side surfaces of the oxide semiconductor film 105; the drain electrode 109b which is formed over the sidewall insulating film 107 and in contact with a top surface of the oxide semiconductor film 105; the gate insulating film 111 covering the sidewall insulating film 107, the oxide semiconductor film 105, and the drain electrode 109b; the gate electrode 113 which is over the gate insulating film 111 and overlaps with the oxide semiconductor film 105; and the protective insulating film 115 covering the gate insulating film 111 and the gate electrode 113.

Further, in the oxide semiconductor film 105 of the transistor 400, the first oxide semiconductor region 125 which overlaps with the gate electrode 113 and functions as a channel formation region, the pair of second oxide semiconductor regions 135a and 135b between which the first oxide semiconductor region 125 is sandwiched and which functions as a source region and a drain region, and a third oxide semiconductor region 145 which is in contact with part of the drain electrode 109b are formed. Note that the first oxide semiconductor region 125 and the third oxide semiconductor region 145 do not contain a dopant, while the pair of second oxide semiconductor regions 135a and 135b contains the dopant.

The conductivity of the pair of second oxide semiconductor regions 135a and 135b is higher than or equal to 10 S/cm and lower than or equal to 1000 S/cm, preferably higher than or equal to 100 S/cm and lower than or equal to 1000 S/cm. Note that when the conductivity is too low, the on-state current of the transistor 400 is decreased.

The carrier density can be increased by increasing the dopant concentration of the pair of the second oxide semiconductor regions 135a and 135b; however, an excessively high dopant concentration may cause the dopant to inhibit transfer of carriers and the conductivity of the pair of the second oxide semiconductor regions 135a and 135b to be decreased.

For that reason, in the transistor 400, the dopant concentration of the pair of second oxide semiconductor regions 135a and 135b is preferably higher than or equal to $5\times10^{18}$ atoms/cm$^3$ and lower than or equal to $1\times10^{22}$ atoms/cm$^3$.

Furthermore, treatment for adding the dopant may be performed plural times. In the case where the treatment for adding the dopant is performed plural times, the kind of dopant may be the same in the plural treatments or different in every treatment.

As conditions of the addition of the dopant, the conditions described in Embodiment 1 can be employed.

Next, a method for manufacturing the transistor 400 will be described below. Here, description is made on the basis of the method for manufacturing the transistor in Embodiment 1; the methods described in Embodiments 2 and 3 can also be applied as appropriate.

In the transistor 400, the source electrode 109a is formed before an oxide semiconductor film is formed over the base insulating film 103. Next, the insulating film 401 is formed by any of the methods described in the above embodiments as appropriate. A first oxide semiconductor film is formed and first heat treatment is performed, so that a second oxide semiconductor film is formed. The second oxide semiconductor film is selectively etched, so that a third oxide semiconductor film is formed. After the third oxide semiconductor film is formed, the sidewall insulating film 107 is formed by any of the methods described in the above embodiments as appropriate. Second heat treatment is performed, so that a fourth oxide semiconductor film is formed. Then, the drain electrode 109b is formed. After that, the gate insulating film 111 is formed over part of the sidewall insulating film 107, part of the oxide semiconductor film 105, and the drain electrode 109b, and the gate electrode 113 is formed over the gate insulating film 111.

After the gate electrode 113 is formed, the dopant is added to the fourth oxide semiconductor film with the use of the gate electrode 113 and the drain electrode 109b as masks, whereby the oxide semiconductor film 105 including the first oxide semiconductor region 125 which does not contain the dopant and functions as the channel formation region, the pair of second oxide semiconductor regions 135a and 135b which contains the dopant, and the third oxide semiconductor region 145 which does not contain the dopant can be formed in a self-aligned manner.

Next, the protective insulating film 115 is formed over the gate insulating film 111 and the gate electrode 113. Note that after formation of the gate insulating film 111, heat treatment similar to the second heat treatment is preferably performed; in a similar manner, after formation of the protective insulating film 115, heat treatment is preferably performed.

Since the transistor 400 includes the regions containing the dopant between the gate electrode 113 and the drain electrode 109b, an electric field applied to the first oxide semiconductor region 125 which functions as the channel formation region can be relieved. Accordingly, an influence of a short-channel effect caused by extremely reducing the channel length of the transistor 400 can be suppressed.

Through the above steps, the transistor 400 can be manufactured.

Note that the structures, methods, and the like described in this embodiment can be combined as appropriate with any of the structures, methods, and the like described in the other embodiments.

Embodiment 5

In this embodiment, a method for applying an oxide semiconductor including a crystalline region to the oxide semiconductor film 105 described in Embodiments 1 to 4 will be described.

The oxide semiconductor including a crystalline region described in this embodiment is non-single-crystal; specifically, the oxide semiconductor includes a crystalline portion in which atoms are arranged in a triangle, a hexagon, a regular triangle, or a regular hexagon when seen from the direction perpendicular to the a-b plane of the non-single-crystal and in which metal atoms or metal atoms and oxygen atoms are arranged in layers when seen from the direction perpendicular to the c-axis. Note that in this specification, the crystalline portion is referred to as c-axis-aligned crystal, and an oxide semiconductor including the c-axis-aligned crystal is referred to as a c-axis aligned crystalline oxide semiconductor (CAAC oxide semiconductor, CAAC-OS).

A CAAC oxide semiconductor film is used as the oxide semiconductor film 105 including the channel formation region, whereby shift of threshold voltage between before and after irradiation with visible light or ultraviolet light or between before and after a gate bias-temperature (BT) stress test can be suppressed, which leads to improvement in the reliability of the transistor.

The CAAC oxide semiconductor is not a single crystal, but this does not mean that the CAAC oxide semiconductor is composed of only an amorphous component. Although the CAAC oxide semiconductor includes a crystallized portion (crystalline portion), a boundary between one crystalline portion and another crystalline portion is not clear in some cases. Nitrogen may be substituted for part or all of oxygen included in the CAAC oxide semiconductor. The c-axes of individual crystalline portions included in the CAAC oxide semiconductor may be aligned in one direction (e.g., a direction perpendicular to a surface of a substrate over which the CAAC oxide semiconductor is formed or a surface, a film surface, an interface, or the like of the CAAC oxide semiconductor). Alternatively, the normals of the a-b planes of the individual crystalline portions included in the CAAC oxide semiconductor may be aligned in one direction (e.g., a direction perpendicular to the substrate surface or the surface, film surface, interface, or the like of the CAAC oxide semiconductor).

The CAAC oxide semiconductor becomes a conductor, a semiconductor, or an insulator, depending on its composition or the like. Further, the CAAC oxide semiconductor transmits or does not transmit visible light, depending on its composition or the like. As an example of such a CAAC oxide semiconductor, there is a material which is formed into a film shape and has a triangular or hexagonal atomic arrangement when observed from the direction perpendicular to a surface or an interface of the film or a surface of a substrate, and in which metal atoms are arranged in layers or metal atoms and oxygen atoms (or nitrogen atoms) are arranged in layers when a cross section of the film is observed.

As methods for forming the oxide semiconductor film 105 including the CAAC oxide semiconductor, a first method and a second method are given. First, the first method will be described.

In the method for forming the first oxide semiconductor film 120 in Embodiment 1, the first oxide semiconductor film 120 is formed by a sputtering method at a substrate temperature higher than or equal to 150° C. and lower than or equal to 450° C., preferably higher than or equal to 200° C. and lower than or equal to 350° C. This method enables the CAAC oxide semiconductor to be formed in the first oxide semiconductor film 120 while entry of moisture (including hydrogen) or the like into the first oxide semiconductor film 120 is prevented.

After the first oxide semiconductor film 120 is formed by the above formation method, the first heat treatment described in Embodiment 1 is performed, whereby hydrogen can be further released from the first oxide semiconductor film 120 and part of oxygen contained in the base insulating film 103 can be diffused into the first oxide semiconductor film 120 and the vicinity of the interface between the base insulating film 103 and the first oxide semiconductor film 120. Further, by the first heat treatment, the crystallinity of the CAAC oxide semiconductor in the first oxide semiconductor film 120 can be improved. In other words, the first heat treatment makes it possible to form the second oxide semiconductor film 122 which has higher crystallinity than the first oxide semiconductor film 120.

After that, the manufacturing steps described in Embodiments 1 to 4 are performed as appropriate; thus, the oxide semiconductor film 105 including the CAAC oxide semiconductor can be formed.

Next, the second method will be described below. In the second method, formation of an oxide semiconductor film is performed twice, and heat treatment is performed after each formation of the oxide semiconductor films; thus, a CAAC oxide semiconductor film is formed.

A first-layer oxide semiconductor film is formed over the base insulating film 103. The thickness of the first-layer oxide semiconductor film is greater than or equal to the thickness of one atomic layer and less than or equal to 10 nm, preferably greater than or equal to 2 nm and less than or equal to 5 nm.

In the formation of the first-layer oxide semiconductor film, the substrate temperature is preferably higher than or equal to 150° C. and lower than or equal to 450° C., further preferably higher than or equal to 200° C. and lower than or equal to 350° C. Accordingly, entry of an impurity such as moisture (including hydrogen) to be contained in the first oxide semiconductor film can be suppressed. Moreover, a crystalline region is formed in a region including a surface of the first-layer oxide semiconductor film. Improvement in the crystallinity of the first-layer oxide semiconductor film finally leads to formation of a CAAC oxide semiconductor film with high crystallinity.

Note that after formation of the first-layer oxide semiconductor film, heat treatment may be performed. Through the heat treatment, moisture (including hydrogen) can be further released from the first-layer oxide semiconductor film, and the crystallinity thereof can be improved. By the heat treatment, the ratio of a crystalline region to an amorphous region in the first-layer oxide semiconductor film can be increased, finally leading to formation of a CAAC oxide semiconductor film with high crystallinity. In addition, the heat treatment is performed at a temperature higher than or equal to 200° C. and lower than the strain point of the substrate, preferably higher than or equal to 250° C. and lower than or equal to 450° C.

For the heat treatment, a rapid thermal annealing (RTA) apparatus can be used. With the use of the RTA apparatus, only in a short time, the heat treatment can be performed at a temperature higher than or equal to the strain point of the substrate. Thus, the time required for formation of an oxide semiconductor film in which the ratio of a crystalline region to an amorphous region is high can be shortened.

The heat treatment can be performed in an inert gas atmosphere; typically, it is preferably performed in an atmosphere of a rare gas such as helium, neon, argon, xenon, or krypton or a nitrogen atmosphere. Alternatively, the heat treatment may be performed in an oxygen atmosphere or a reduced-pressure atmosphere. The treatment time is 3 minutes to 24 hours. The ratio of a crystalline region to an amorphous region in the oxide semiconductor film can be increased as the treatment time is increased. Note that heat treatment for longer than 24 hours is not preferable because the productivity is decreased.

Next, a second-layer oxide semiconductor film is formed over the first-layer oxide semiconductor film to be thicker than the first-layer oxide semiconductor film. The second-layer oxide semiconductor film can be formed by a method similar to that for the first-layer oxide semiconductor film.

When the second-layer oxide semiconductor film is formed while the substrate is heated, the second-layer oxide semiconductor film can be crystallized using the first-layer oxide semiconductor film as a seed crystal. At this time, homo-growth in which the first-layer oxide semiconductor film and the second-layer oxide semiconductor film are formed of the same element may be caused. Alternatively, hetero-growth in which the first-layer oxide semiconductor film and the second-layer oxide semiconductor film are formed of elements, at least one kind of which differs between the first-layer oxide semiconductor film and the second-layer oxide semiconductor film, may be caused.

Note that additional heat treatment may be performed after the second-layer oxide semiconductor film is formed. The heat treatment performed after the formation of the second-layer oxide semiconductor film may be performed by a method similar to that for the heat treatment performed after the formation of the first-layer oxide semiconductor film. By the heat treatment after the formation of the second-layer oxide semiconductor film, a CAAC oxide semiconductor film in which the ratio of a crystalline region to an amorphous region is high can be formed. Also this heat treatment allows homo-growth or hetero-growth of the second-layer oxide semiconductor film.

By the above method, the first oxide semiconductor film 120 including the CAAC oxide semiconductor can be formed.

After that, the manufacturing steps described in Embodiments 1 to 4 are performed as appropriate; thus, the oxide semiconductor film 105 including the CAAC oxide semiconductor can be formed.

In the second method, because of the heat treatment performed in the formation of the first oxide semiconductor film 120 including the CAAC oxide semiconductor, oxygen is diffused from the base insulating film 103 to the oxide semiconductor film in some cases. In this case, since oxygen deficiency in the first oxide semiconductor film 120 including the CAAC oxide semiconductor is reduced even without the first heat treatment described in Embodiments 1 to 4, the first oxide semiconductor film 120 including the CAAC oxide semiconductor which is formed by the second method can be used as the second oxide semiconductor film 122 described in Embodiments 1 to 4.

Note that the structures, methods, and the like described in this embodiment can be combined as appropriate with any of the structures, methods, and the like described in the other embodiments.

Embodiment 6

In this embodiment, an example of a circuit configuration and operation of a semiconductor device including any of the transistors described in the above embodiments will be described with reference to FIGS. 18A and 18B, FIGS. 19A and 19B, FIGS. 20A and 20B, and FIG. 21. Note that in each circuit diagram, in some cases, "OS" is written beside a transistor in order to indicate that the transistor is formed using an oxide semiconductor.

(Cross-Sectional Structure of Semiconductor Device)

First, an example of a cross-sectional structure of a semiconductor device will be described with reference to FIG. 18A. In a semiconductor device illustrated in FIG. 18A, a transistor 660 formed using a first semiconductor material is provided in a lower portion, and a capacitor 664 and a transistor 601 formed using a second semiconductor material are provided in an upper portion.

Figure 18A:
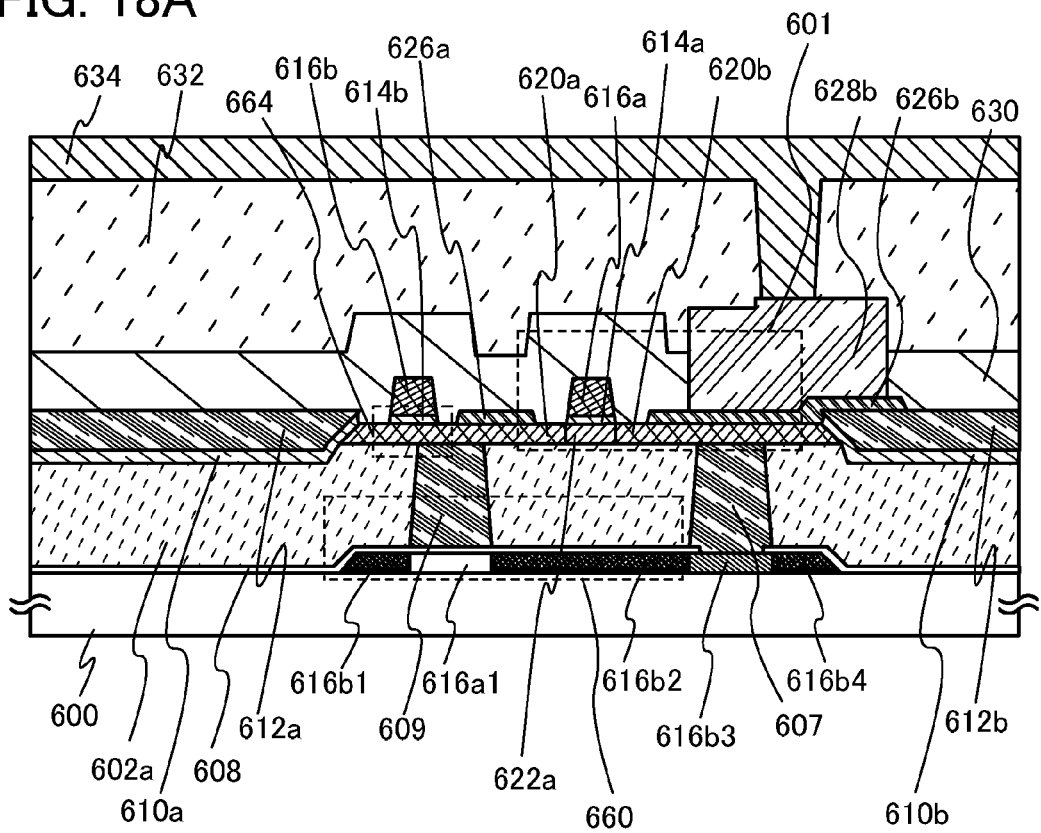
FIGS. 18A and 18B are a cross-sectional view and a circuit diagram which illustrate a semiconductor device according to one embodiment of the present invention.

The transistor 660 in FIG. 18A includes, over a substrate 600, a channel formation region 616a1 including a semiconductor material (e.g., silicon), an impurity region 616b1 and an impurity region 616b2 which are provided so that the channel formation region 616a1 is sandwiched therebetween, a gate insulating film 608 provided over the channel formation region 616a1, and a gate electrode 609 provided over the gate insulating film 608. Note that a transistor whose source electrode and drain electrode are not illustrated in a drawing may be referred to as a transistor for the sake of convenience. Further, in such a case, in description of connection of a transistor, a source region and a source electrode may be collectively referred to as a "source electrode", and a drain region and a drain electrode may be collectively referred to as a "drain electrode". That is, in this specification, the term "source electrode" may include a source region.

The impurity region 616b1 functions as one of a source electrode and a drain electrode of the transistor 660. The impurity region 616b2 functions as the other of the source electrode and the drain electrode of the transistor 660. Further, in FIG. 18A, the impurity region 616b2 is connected to a conductive film 626b through an impurity region 616b3, an opening formed in the gate insulating film 608, a wiring 607, and part of a region 620b to which a dopant is added. That is, the other of the source electrode and the drain electrode of the transistor 660 is electrically connected to one of a source electrode and a drain electrode of the transistor 601.

Note that one embodiment of the present invention is not limited to this. Electrical connection among a memory cell, a transistor, and a capacitor can be changed as appropriate. For example, the impurity region 616b2 may be electrically connected to an impurity region in another memory cell through the impurity region 616b3 and an impurity region 616b4. In that case, an opening does not need to be formed in the gate insulating film 608. Further, the wiring 607 is not necessarily formed. In other words, in the case where the other of the source electrode and the drain electrode of the transistor 660 is electrically connected to another memory cell, the other of the source electrode and the drain electrode of the transistor 660 is not necessarily electrically connected to the one of the source electrode and the drain electrode of the transistor 601.

The wiring 607 can be formed using a material and a step similar to those of the gate electrode 609. With the wiring 607, dishing caused in CMP can be prevented and top surfaces of the insulating film 602a, the gate electrode 609, and the wiring 607 can be planarized more.

Although the gate electrode 609 and the wiring 607 each have a single-layer structure in FIG. 18A, one embodiment of the present invention is not limited to this. The gate electrode 609 and the wiring 607 may each have a stacked-layer structure of two or more layers. For example, a structure in which a tungsten film is stacked over a tantalum nitride film may be employed. A tantalum nitride film suppresses diffusion of tungsten (W) in a tungsten film to the channel formation region 616a1; therefore, the transistor 660 having favorable electric characteristics can be manufactured. In addition, by using a chlorine gas as an etching gas for dry etching which is performed in formation of the gate electrode 609 of the transistor 660, the tantalum nitride film can be selectively etched. That is, even in the case where the gate insulating film 608 is thin, short circuit between the gate electrode 609 and the impurity regions 616b1 and 616b2 serving as the source electrode and the drain electrode of the transistor 660 can be suppressed.

For high integration, as illustrated in FIG. 18A, it is preferable that the transistor 660 do not include a sidewall insulating layer. On the other hand, when the importance is put on the characteristics of the transistor 660, sidewall insulating layers may be provided on side surfaces of the gate electrode 609 and the impurity region 616b1 and the impurity region 616b2 may include impurity regions having a different impurity concentration provided in regions overlapping with the sidewall insulating layers.

Figure 18B:
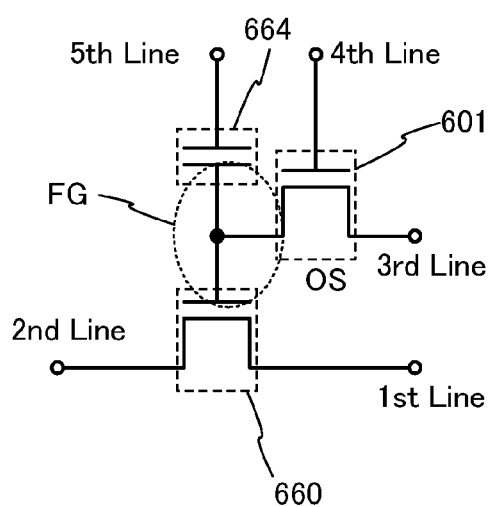

As the transistor 601 in FIGS. 18A and 18B, any of the transistors described in the above embodiments can be used. The transistor 601 includes a channel formation region 622a, regions 620a and 620b containing the dopant, conductive films 626a and 626b, a gate insulating film 614a, and a conductive film 616a.

For example, the transistor 601 corresponds to the transistor 140 described in Embodiment 1 (see FIGS. 25A to 25D). The channel formation region 622a corresponds to the first oxide semiconductor region 125, the regions 620a and 620b containing the dopant correspond to the pair of second oxide semiconductor regions 165a and 165b, the conductive films 626a and 626b correspond to the source electrode 109a and the drain electrode 109b, the gate insulating film 614a corresponds to the gate insulating film 161, and the conductive film 616a corresponds to the gate electrode 113.

In addition, insulating films 610a and 610b and insulating films 612a and 612b correspond to the sidewall insulating films 107a and 107b of the transistor 130 described in Embodiment 1 (see FIG. 11). Therefore, the method for manufacturing the transistor 130 can be applied to formation of the insulating films 610a and 610b and the insulating films 612a and 612b.

The capacitor 664 includes an insulating film 614b which is formed in the same step as the gate insulating film 614a of the transistor 601, an electrode 616b, part of the region 620a containing the dopant, and the gate electrode 609. In other words, the electrode 616b functions as one electrode of the capacitor 664, and the gate electrode 609 functions as the other electrode of the capacitor 664.

An insulating film 630 is provided so as to cover the transistor 601 and the capacitor 664, and an insulating film 632 is provided over the insulating film 630. A wiring 634 is connected to a conductive film 628b and the conductive film 626b through an opening formed in the insulating film 630 and the insulating film 632. Note that the conductive film 626b and the wiring 634 are connected to each other through the conductive film 628b in FIG. 18A; one embodiment of the invention disclosed herein is not limited to this. For example, the wiring 634 may be in direct contact with the conductive film 626b. Note that the insulating film 630 corresponds to the protective insulating film 115 of the transistor 130 described in Embodiment 1.

Note that both the transistor 601 and the transistor 660 are n-channel transistors here; needless to say, p-channel transistors can be used. The technical feature of the invention disclosed herein lies in the use of a semiconductor material with which off-state current can be sufficiently reduced, such as an oxide semiconductor, in the transistor 601 in order to hold data. Therefore, it is not necessary to limit specific conditions, such as a material, a structure, or the like of the semiconductor device, to those given here.

(Basic Circuit)

Next, a basic circuit configuration of the semiconductor device illustrated in FIG. 18A and its operation will be described with reference to FIG. 18B. In a semiconductor device illustrated in FIG. 18B, a first wiring (1st Line) is electrically connected to the source electrode or the drain electrode of the transistor 660. A second wiring (2nd Line) is electrically connected to the drain electrode or the source electrode of the transistor 660. A third wiring (3rd Line) is electrically connected to the source electrode or the drain electrode of the transistor 601, and a fourth wiring (4th Line) is electrically connected to a gate electrode of the transistor 601. In addition, the gate electrode of the transistor 660 and the drain electrode or the source electrode of the transistor 601 are electrically connected to one electrode of the capacitor 664, and a fifth wiring (5th Line) and the other electrode of the capacitor 664 are electrically connected to each other. Note that the first wiring (1st Line) may be electrically connected to the third wiring (3rd Line).

Here, as the transistor 601, for example, the transistor formed using an oxide semiconductor which is described in any of the above embodiments can be used. A transistor formed using an oxide semiconductor has a characteristic of extremely small off-state current. Therefore, a potential of the gate electrode of the transistor 660 can be held for an extremely long time by turning off the transistor 601. By providing the capacitor 664, holding of charge applied to the gate electrode of the transistor 660 and reading of stored data can be performed more easily.

Note that there is no particular limitation on the transistor 660. In terms of increasing the speed of reading data, it is preferable to use, for example, a transistor with high switching rate such as a transistor formed using single crystal silicon.

The semiconductor device illustrated in FIG. 18B utilizes a characteristic in which the potential of the gate electrode of the transistor 660 can be held, whereby writing, holding, and reading of data can be performed as follows.

Firstly, writing and holding of data will be described. First, the potential of the fourth wiring is set to a potential at which the transistor 601 is turned on, so that the transistor 601 is turned on. Accordingly, the potential of the third wiring is supplied to the gate electrode of the transistor 660 and the capacitor 664. In other words, predetermined charge is applied to the gate electrode of the transistor 660 (writing). Here, one of two kinds of charges for supply of different potentials (hereinafter, a charge supplied by a low potential $V_L$ is referred to as charge $Q_L$ and a charge supplied by a high potential $V_H$ is referred to as charge $Q_H$) is applied. Note that charges giving three or more different potentials may be used to improve storage capacity. After that, the potential of the fourth wiring is set to a potential at which the transistor 601 is turned off, so that the transistor 601 is turned off. Thus, the charge applied to the gate electrode of the transistor 660 is held (holding).

Since the off-state current of the transistor 601 is extremely small, the charge of the gate electrode of the transistor 660 is held for a long time.

Secondly, reading of data will be described. By supplying an appropriate potential (reading potential) to the fifth wiring with a predetermined potential (constant potential) supplied to the first wiring, the potential of the second wiring varies depending on the amount of charge held in the gate electrode of the transistor 660. This is generally because, when the transistor 660 is an n-channel transistor, the apparent threshold voltage $V_{th\_H}$ of the transistor 660 in the case where $Q_H$ is applied to the gate electrode of the transistor 660 is lower than the apparent threshold voltage $V_{th\_L}$ of the transistor 660 in the case where $Q_L$ is applied to the gate electrode of the transistor 660. Here, the apparent threshold voltage refers to the potential of the fifth wiring which is needed to turn on the transistor 660. Thus, the potential of the fifth wiring is set to a potential $V_0$ (e.g., $V_0$=ground potential GND) that is intermediate between $V_{th\_H}$ and $V_{th\_L}$, whereby charge applied to the gate electrode of the transistor 660 can be determined. For example, in the case where $Q_H$ is applied in writing, when the potential of the fifth wiring is set to $V_0$ ($>V_{th\_H}$), the transistor 660 is turned on. In the case where $Q_L$ is applied in writing, even when the potential of the fifth wiring is set to $V_0$ ($<V_{th\_L}$), the transistor 660 remains off. Therefore, the stored data can be read by measuring the potential of the second wiring.

Note that in the case where memory cells are arrayed to be used, only data of desired memory cells is needed to be read. Thus, in the case where data of predetermined memory cells is read and data of the other memory cells is not read, a potential at which the transistor 660 is turned off regardless of the state of the gate electrode, that is, a potential lower than $V_{th\_H}$ (e.g., $V_1$) may be supplied to fifth wirings of the memory cells whose data is not read.

Thirdly, rewriting of data will be described. Rewriting of data is performed in a manner similar to that of the writing and holding of data. That is, the potential of the fourth wiring is set to a potential at which the transistor 601 is turned on, so that the transistor 601 is turned on. Accordingly, the potential of the third wiring (potential for new data) is supplied to the gate electrode of the transistor 660 and the capacitor 664. After that, the potential of the fourth wiring is set to a potential at which the transistor 601 is turned off, so that the transistor 601 is turned off. Accordingly, charge for new data is applied to the gate electrode of the transistor 660.

In the semiconductor device according to one embodiment of the invention disclosed herein, data can be directly rewritten by another writing of data as described above. Therefore, extracting charge from a floating gate with the use of high voltage, which is needed in a flash memory or the like, is not necessary, and thus decrease in operation speed due to erasing operation can be suppressed. In other words, high-speed operation of the semiconductor device can be realized.

Note that the drain electrode (or the source electrode) of the transistor 601 is electrically connected to the gate electrode of the transistor 660 and therefore has a function similar to that of a floating gate of a floating-gate transistor used for a nonvolatile memory element. Hereinafter, a portion where the drain electrode (or the source electrode) of the transistor 601 and the gate electrode of the transistor 660 are electrically connected to each other is called a node FG in some cases. When the transistor 601 is off, the node FG can be regarded as being embedded in an insulator and charge is held in the node FG. The off-state current of the transistor 601 formed using an oxide semiconductor is smaller than or equal to $1/100000$ of the off-state current of a transistor formed using a silicon semiconductor or the like; thus, loss of charge accumulated in the node FG due to leakage current of the transistor 601 is negligible. That is, with the transistor 601 formed using an oxide semiconductor, a non-volatile memory device which can hold data without power supply can be realized.

For example, when the off-state current of the transistor 601 at room temperature (25° C.) is less than or equal to 10 zA (1 zA (zeptoampere) is $1 \times 10^{-21}$ A) and the capacitance of the capacitor 664 is approximately 10 fF, data can be held for $10^4$ seconds or longer. Needless to say, the holding time depends on transistor characteristics and the capacitance.

Further, the semiconductor device of one embodiment of the invention disclosed herein does not have a problem of deterioration of a gate insulating film (tunnel insulating film), which occurs in a conventional floating-gate transistor. That is, the problem of the deterioration of a gate insulating film due to injection of an electron into a floating gate, which has been regarded as a problem, can be solved. This means that there is no limit on the number of times of writing in principle. Furthermore, high voltage needed for writing or erasing in a conventional floating-gate transistor is not necessary.

In the semiconductor device described in this embodiment, the node FG has a function similar to that of a floating gate of a floating-gate transistor in a flash memory or the like, but the node FG of this embodiment has a feature which is essentially different from that of the floating gate in the flash memory or the like.

In a flash memory, since a potential supplied to a control gate is high, it is necessary to keep a proper distance between cells in order to prevent the potential from affecting a floating gate of the adjacent cell. This is one of inhibiting factors for high integration of the semiconductor device. The factor is attributed to a basic principle of a flash memory, in which tunneling current is generated by application of a high electric field.

In contrast, the semiconductor device according to this embodiment operates by switching of a transistor formed using an oxide semiconductor and does not use the above-described principle of charge injection by tunneling current. That is, a high electric field for charge injection is not necessary unlike a flash memory. Accordingly, it is not necessary to consider an influence of a high electric field from a control gate on an adjacent cell, which facilitates high integration.

In addition, it is also advantageous over a flash memory that a high electric field is unnecessary and a large peripheral circuit (such as a booster circuit) is unnecessary. For example, the highest voltage applied to the memory cell according to this embodiment (difference between the highest potential and the lowest potential supplied to terminals of the memory cell at the same time) can be 5 V or lower, preferably 3 V or lower in each memory cell in the case where two-level (one-bit) data is written.

Note that in addition to the increase in the degree of integration, a multilevel technique can be employed in order to increase the storage capacity of the semiconductor device. For example, three or more levels of data are written to one memory cell, whereby the storage capacity can be increased as compared with that in the case where two-level (one-bit) data is written. The multilevel technique can be achieved by, for example, applying charge Q, which is different from charge $Q_L$ for supply of a low potential and charge $Q_H$ for supply of a high potential, to a gate electrode of a first transistor, in addition to the charge $Q_L$ and the charge $Q_H$. In this case, sufficient storage capacity can be ensured even in a circuit configuration with a relatively large scale (e.g., 15 $F^2$ to 50 $F^2$; F is the minimum feature size).

Figure 19A:
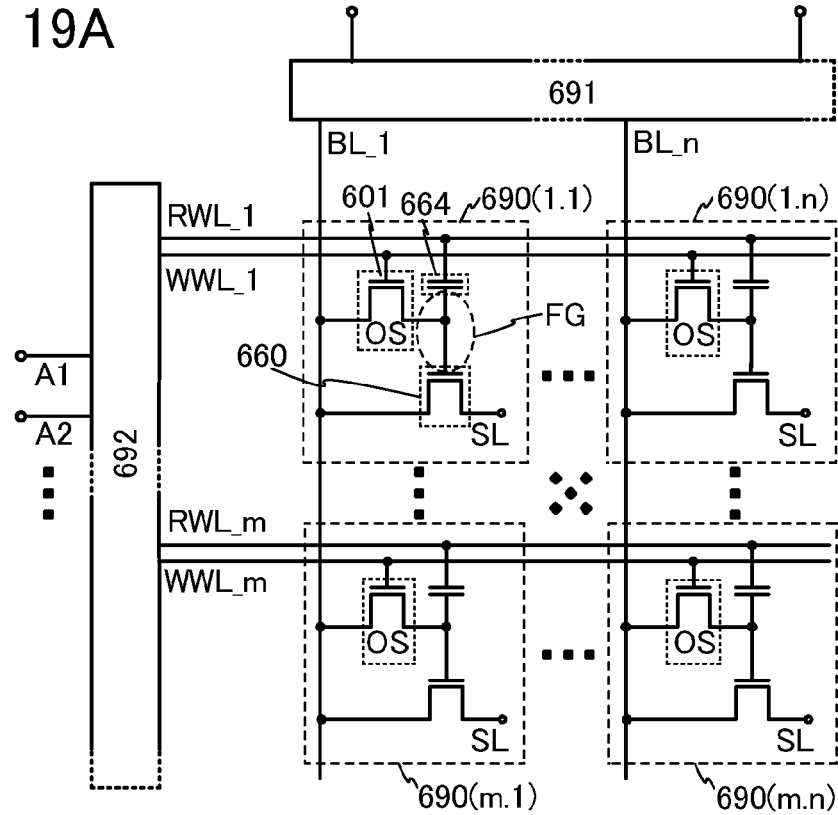
FIGS. 19A and 19B are each a circuit diagram which illustrates a semiconductor device according to one embodiment of the present invention.
Figure 19B:
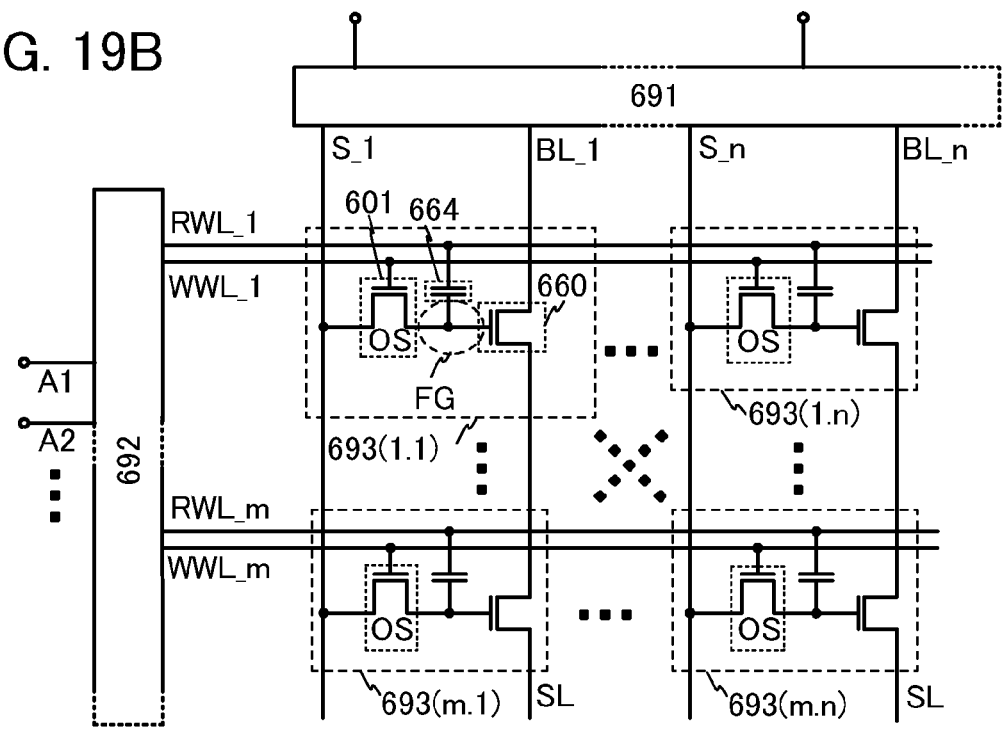

FIGS. 19A and 19B are each an example of a circuit diagram of a semiconductor device including (m×n) memory cells 690. The configuration of the memory cell 690 in FIGS. 19A and 19B is similar to that of the memory cell in FIGS. 18A and 18B. In other words, the first wiring and the third wiring in FIG. 18B are electrically connected to each other, which correspond to a bit line BL in FIGS. 19A and 19B; the second wiring in FIG. 18B corresponds to a source line SL in FIGS. 19A and 19B; the fourth wiring in FIG. 18B corresponds to a write word line WWL in FIGS. 19A and 19B; and the fifth wiring in FIG. 18B corresponds to a read word line RWL in FIGS. 19A and 19B (see FIGS. 19A and 19B).

The semiconductor device in FIG. 19A includes m (m is an integer greater than or equal to 2) write word lines WWL, m read word lines RWL, n (n is an integer greater than or equal to 2) bit lines BL, a memory cell array having the memory cells 690 arranged in a matrix of m (rows) (in the vertical direction)×n (columns) (in the horizontal direction), a first driver circuit 691 connected to the n bit lines BL, and a second driver circuit 692 connected to the m write word lines WWL and the m read word lines RWL. Note that the memory cell array in FIG. 19A is a NOR memory cell array in which memory cells are connected in parallel.

The semiconductor device in FIG. 19B includes m (m is an integer greater than or equal to 2) write word lines WWL, m read word lines RWL, n (n is an integer greater than or equal to 2) bit lines BL, n signal lines S, a memory cell array having the memory cells 690 arranged in a matrix of m (rows) (in the vertical direction)×n (columns) (in the horizontal direction), the first driver circuit 691 connected to the n bit lines BL and the n signal lines S, and the second driver circuit 692 connected to the m write word lines WWL and the m read word lines RWL. Note that the memory cell array in FIG. 19B is a NAND memory cell array in which memory cells are connected in series.

In FIGS. 19A and 19B, an address selection signal line A is connected to the second driver circuit 692. The address selection signal line A is a wiring which transmits a signal for selecting a row address of a memory cell.

Next, writing, holding, and reading of data in the semiconductor device illustrated in FIG. 19A will be described. Writing, holding, and reading of data in the semiconductor device illustrated in FIG. 19A are basically similar to those in the case of FIGS. 18A and 18B. Specific writing operation is described below. Note that as an example, the case where the potential $V_H$ (here, $V_H$ is lower than a power supply potential VDD, i.e., $V_H$<VDD) or $V_L$ is supplied to the node FG is described; however, the relation among potentials supplied to the node FG is not limited to this. Data that is held when the potential $V_H$ is supplied to the node FG is referred to as data "1", and data that is held when the potential $V_L$ is supplied to the node FG is referred to as data "0".

First, the memory cell 690 into which data is written is selected by setting the potentials of the read word line RWL and the write word line WWL, which are connected to the memory cell 690, to $V_0$ and VDD, respectively.

In the case where data "0" is written into the memory cell 690, $V_L$ is supplied to the bit line BL. In the case where data "1" is written into the memory cell 690, a potential higher than $V_H$ by the threshold voltage of the transistor 601 is supplied to the bit line BL in consideration of potential decrease in the transistor 601 by its threshold voltage.

Data is held by setting the potential of the read word line RWL to $V_1$ and the potential of the writing word line WWL to $V_0$ or $V_1$ (here, $V_1$ is lower than $V_0$. In other words, $V_1$<$V_0$, e.g., $V_1$ is lower than $V_0$ by VDD).

When the potential of the read word line RWL is lowered from $V_0$ to $V_1$, the potential in the node FG is lowered by $V_0$-$V_1$ due to capacitive coupling with the capacitor 664. Therefore, the transistor 660 is turned off regardless of whether data "1" or data "0" is written.

Since $V_0$ or $V_1$ is supplied to the writing word line WWL, the transistor 601 is in an off state. The off-state current of the transistor 601 is extremely small; thus, the charge in the node FG is held for a long time.

Data is read by setting the potential of the read word line RWL to $V_0$ and the potential of the write word line WWL to $V_0$ or $V_1$.

When the potential of the read word line RWL is raised from $V_1$ to $V_0$, the potential in the node FG is raised by $V_0$-$V_1$ due to capacitive coupling with the capacitor 664. Therefore, the potential in the node FG is $V_H$ in the case where the data "1" is written into the memory cell 690, whereas the potential in the node FG is $V_L$ in the case where the data "0" is written into the memory cell 690.

By the above reading operation, if data "1" is written into the memory cell 690, the transistor 660 is turned on and the potential of the bit line BL is lowered. If data "0" is written, the transistor 660 is turned off and the potential of the bit line BL is maintained at the level at the beginning of reading or is raised.

A semiconductor device which is one embodiment of the present invention is used as the transistor 601. The semiconductor device which is one embodiment of the present invention is a transistor in which a channel formation region is formed using an oxide semiconductor, and thus is characterized by having smaller off-state current than a transistor in which a channel formation region is formed using single crystal silicon. Therefore, in the case where such a transistor is used in the semiconductor devices illustrated in FIGS. 19A and 19B, stored data can be held for a long time even when power is not supplied, and a memory device which does not have limitation on the number of times of writing can be obtained.

(Cross-Sectional Structure of Semiconductor Device)

Next, an example of a semiconductor device having a structure corresponding to that of a so-called dynamic random access memory (DRAM) will be described with reference to FIG. 20A. The semiconductor device in FIG. 20A includes a transistor 602 and a capacitor 668.

Figure 20A:
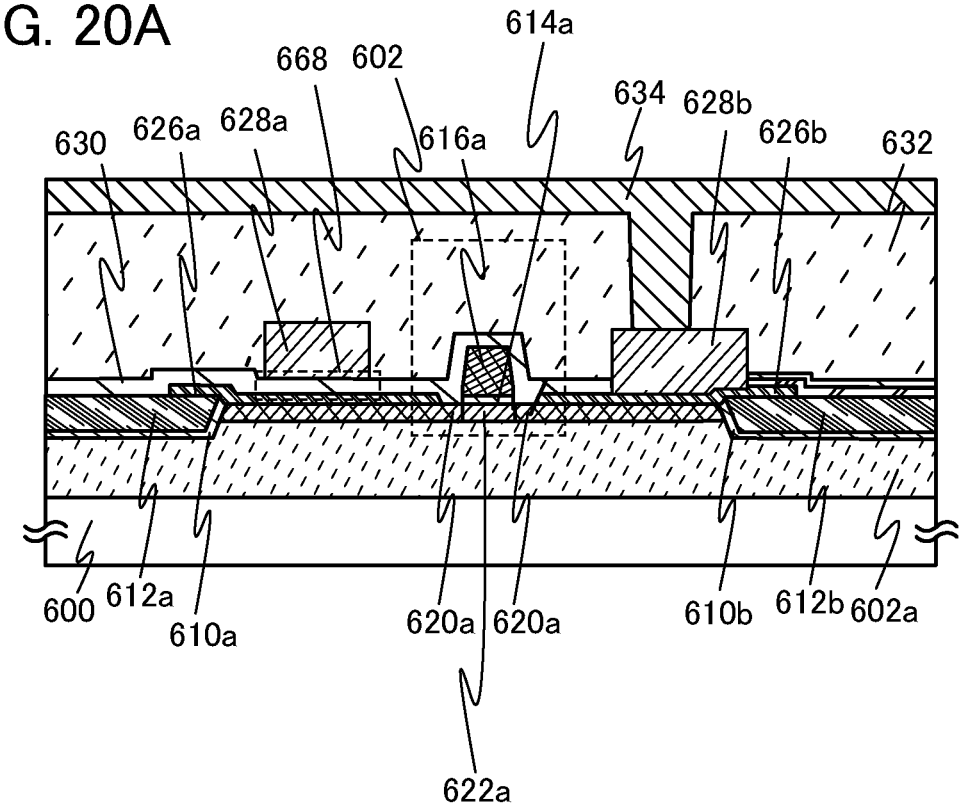
FIGS. 20A and 20B are a cross-sectional view and a circuit diagram which illustrate a semiconductor device according to one embodiment of the present invention.

As the transistor 602 in FIG. 20A, any of the transistors described in the above embodiments can be used. The transistor 602 includes the channel formation region 622a, the regions 620a and 620b containing a dopant, the conductive films 626a and 626b, the gate insulating film 614a, and the conductive film 616a.

For example, the transistor 602 corresponds to the transistor 140 described in Embodiment 1 (see FIGS. 25A to 25D). The channel formation region 622a corresponds to the first oxide semiconductor region 125, the regions 620a and 620b containing the dopant correspond to the pair of second oxide semiconductor regions 165a and 165b, the conductive films 626a and 626b correspond to the source electrode 109a and the drain electrode 109b, the gate insulating film 614a corresponds to the gate insulating film 161, and the conductive film 616a corresponds to the gate electrode 113.

In addition, the insulating films 610a and 610b and the insulating films 612a and 612b correspond to the sidewall insulating films 107a and 107b of the transistor 130 described in Embodiment 1 (see FIG. 11). Therefore, the method for manufacturing the transistor 130 can be applied to formation of the insulating films 610a and 610b and the insulating films 612a and 612b.

The capacitor 668 in FIG. 20A includes the insulating film 630, a conductive film 628a, and the conductive film 626a. In other words, the conductive film 628a functions as one electrode of the capacitor 664, and the conductive film 626a functions as the other electrode of the capacitor 664. Note that the insulating film 630 corresponds to the protective insulating film 115 of the transistor 130 described in Embodiment 1.

The insulating film 632 is provided so as to cover the transistor 602 and the capacitor 664. The wiring 634 is connected to the conductive film 626b through the conductive film 628b and an opening formed in the insulating film 630 and the insulating film 632. Note that the conductive film 626b and the wiring 634 are connected to each other through the conductive film 628b in FIG. 20A; one embodiment of the invention disclosed herein is not limited to this. For example, the wiring 634 may be in direct contact with the conductive film 626b.

(Basic Circuit)

Figure 20B:
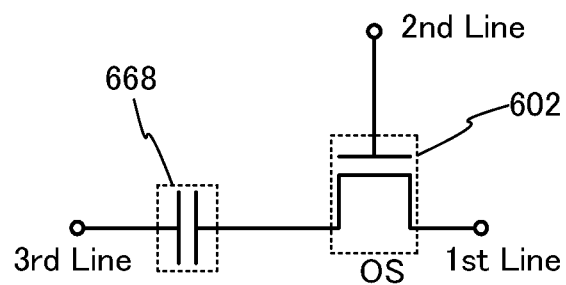

Next, a basic circuit configuration of the semiconductor device illustrated in FIG. 20A and its operation will be described with reference to FIG. 20B. In the semiconductor device illustrated in FIG. 20B, a first wiring (1st Line) is electrically connected to a source electrode or a drain electrode of the transistor 602, a second wiring (2nd Line) is electrically connected to a gate electrode of the transistor 602, and one electrode of the capacitor 668 is electrically connected to the drain electrode or the source electrode of the transistor 602. Further, a third wiring (3rd Line) is electrically connected to the other electrode of the capacitor 668.

Here, a transistor formed using an oxide semiconductor is used as the transistor 602, for example. A transistor formed using an oxide semiconductor has a characteristic of an extremely small off-state current. Therefore, the potential supplied to the capacitor 668 can be held for an extremely long time by turning off the transistor 602.

The semiconductor device illustrated in FIG. 20B utilizes a characteristic in which the potential supplied to the capacitor 668 can be held, whereby writing, holding, and reading of data can be performed as follows.

Firstly, writing and holding of data will be described. For simplicity, the potential of the third wiring is fixed here. First, the potential of the second wiring is set to a potential at which the transistor 602 is turned on, so that the transistor 602 is turned on. Accordingly, the potential of the first wiring is supplied to the one electrode of the capacitor 668. That is, predetermined charge is applied to the capacitor 668 (writing). After that, the potential of the second wiring is set to a potential at which the transistor 602 is turned off, so that the transistor 602 is turned off. Thus, the charge applied to the capacitor 668 is held (holding). The transistor 602 has extremely small off-state current as described above and thus can hold charge for a long time.

Secondly, reading of data will be described. By setting the potential of the second wiring to a potential at which the transistor 602 is turned on with a predetermined potential (constant potential) supplied to the first wiring, the potential of the first wiring varies depending on the amount of charge held in the capacitor 668. Therefore, the stored data can be read by measuring the potential of the first wiring.

Since the charge of the capacitor 668 is lost in the case where the data is read, it is to be noted that another writing is performed.

Thirdly, rewriting of data will be described. Rewriting of data is performed in a manner similar to that of the writing and holding of data. That is, the potential of the second wiring is set to a potential at which the transistor 602 is turned on, so that the transistor 602 is turned on. Accordingly, the potential of the first wiring (potential for new data) is supplied to the one electrode of the capacitor 668. After that, the potential of the second wiring is set to a potential at which the transistor 602 is turned off, so that the transistor 602 is turned off. Accordingly, charge for new data is applied to the capacitor 668.

In the semiconductor device according to one embodiment of the invention disclosed herein, data can be directly rewritten by another writing of data as described above. Therefore, high-speed operation of the semiconductor device can be realized.

Note that an n-channel transistor in which electrons are carriers is used in the above description; needless to say, a p-channel transistor in which holes are majority carriers can be used instead of the n-channel transistor.

Figure 21:
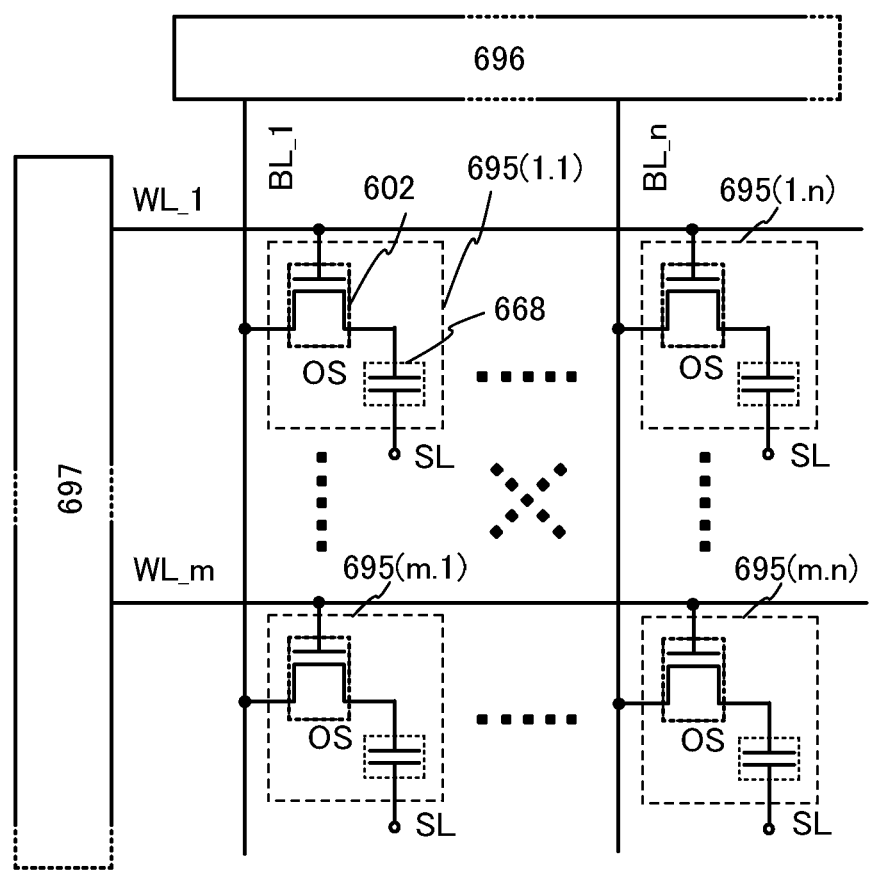
FIG. 21 is a circuit diagram which illustrates a semiconductor device according to one embodiment of the present invention.

FIG. 21 is an example of a circuit diagram of a semiconductor device including (m×n) memory cells 695. The configuration of the memory cells 695 in FIG. 21 is similar to that of the memory cell in FIGS. 20A and 20B. In other words, the first wiring in FIG. 20B corresponds to a bit line BL in FIG. 21; the second wiring in FIG. 20B corresponds to a word line WL in FIG. 21; and the third wiring in FIG. 20B corresponds to a source line SL in FIG. 21.

The semiconductor device illustrated in FIG. 21 includes n bit lines BL, m word lines WL, a memory cell array having the memory cells 695 arranged in a matrix of m (rows) (in the vertical direction)×n (columns) (in the horizontal direction), a first driver circuit 696 connected to the n bit lines BL, and a second driver circuit 697 connected to the m word lines WL.

The memory cell 695 includes the transistor 602 and the capacitor 668. The gate electrode of the transistor 602 is connected to the word line WL. Further, one of a source electrode and a drain electrode of the transistor 602 is connected to the bit line BL. The other of the source electrode and the drain electrode of the transistor 602 is connected to one electrode of the capacitor. The other electrode of the capacitor is connected to the source line SL and is supplied with a predetermined potential. Any of the transistors described in Embodiments 1 to 5 can be used as the transistor 602.

The semiconductor device which is one embodiment of the present invention is a transistor in which a channel formation region is formed using an oxide semiconductor, and thus is characterized by having smaller off-state current than a transistor in which a channel formation region is formed using single crystal silicon. Accordingly, when the transistor is applied to the semiconductor device illustrated in FIG. 21, which is regarded as a so-called DRAM, a memory in which an interval between refresh periods is extremely long can be obtained.

The structures, methods, and the like described in this embodiment can be combined as appropriate with any of the structures, methods, and the like described in the other embodiments.

Embodiment 7

A central processing unit (CPU) can be formed using a transistor in which a channel formation region is formed using an oxide semiconductor for at least part of the CPU.

Figure 22A:
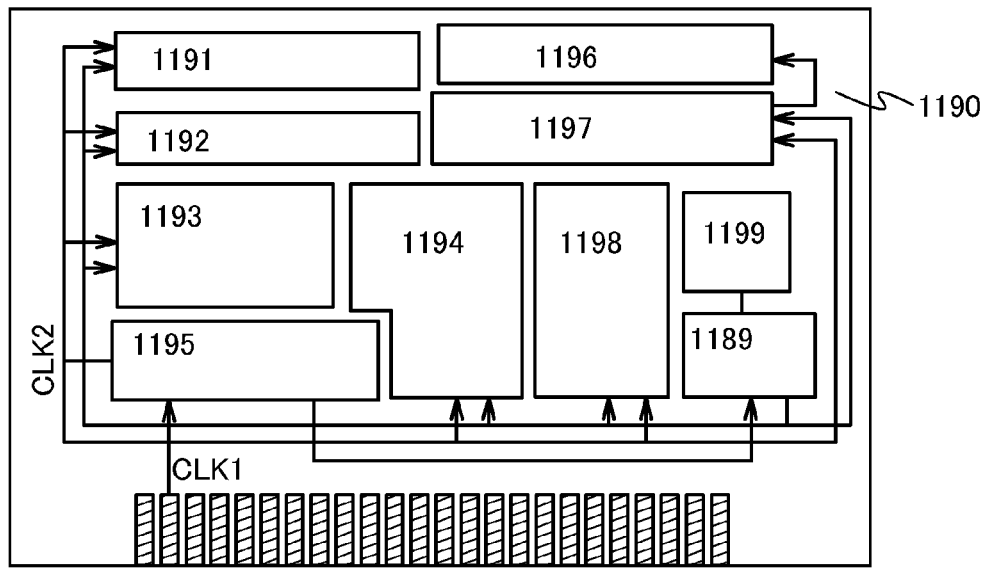
FIG. 22A is a block diagram which illustrates a specific example of a semiconductor device according to one embodiment of the present invention.

FIG. 22A is a block diagram illustrating a specific configuration of a CPU. The CPU illustrated in FIG. 22A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM I/F 1189 may be provided over a separate chip. Obviously, the CPU illustrated in FIG. 22A is just an example in which a configuration is simplified, and an actual CPU may have various configurations depending on the application.

An instruction that is input to the CPU through the Bus I/F 1198 is input to the instruction decoder 1193 and decoded therein, and then input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/into the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 on the basis of a reference clock signal CLK1, and supplies the clock signal CLK2 to the above circuits.

In the CPU illustrated in FIG. 22A, a memory element is provided in the register 1196. The memory element described in Embodiment 6 can be used as the memory element provided in the register 1196.

In the CPU illustrated in FIG. 22A, the register controller 1197 selects operation of holding data in the register 1196 in accordance with an instruction from the ALU 1191. That is, the register controller 1197 selects whether data is held by a phase-inversion element or a capacitor in the memory element included in the register 1196. When data holding by the phase-inversion element is selected, power supply voltage is supplied to the memory element in the register 1196. When data holding by the capacitor is selected, the data is rewritten in the capacitor, and supply of power supply voltage to the memory element in the register 1196 can be stopped.

Figure 22B:
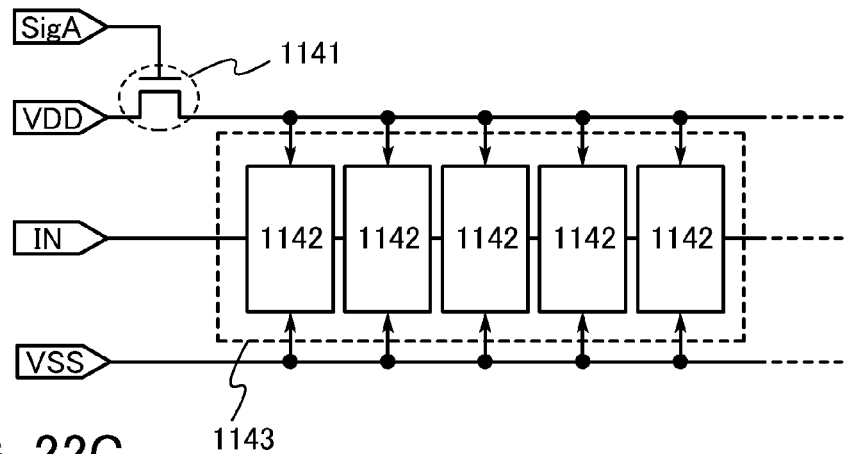
FIGS. 22B and 22C are circuit diagrams of part thereof.
Figure 22C:
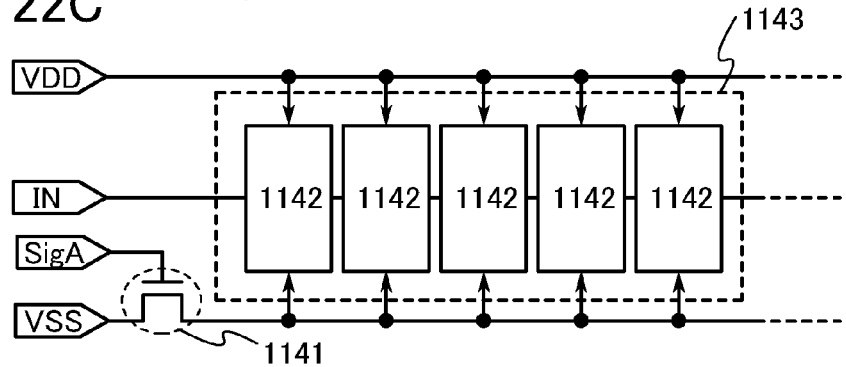

The power supply can be stopped by providing a switching element between a memory element group and a node to which a power supply potential VDD or a power supply potential VSS is supplied, as illustrated in FIG. 22B or FIG. 22C. Circuits illustrated in FIGS. 22B and 22C will be described below.

FIGS. 22B and 22C each illustrate an example of a configuration of a memory circuit including a transistor in which a channel formation region is formed using an oxide semiconductor as a switching element for controlling supply of a power supply potential to a memory element.

The memory device illustrated in FIG. 22B includes a switching element 1141 and a memory element group 1143 including a plurality of memory elements 1142. Specifically, as each of the memory elements 1142, the memory element described in Embodiment 6 can be used. Each of the memory elements 1142 included in the memory element group 1143 is supplied with the high-level power supply potential VDD via the switching element 1141. Further, each of the memory elements 1142 included in the memory element group 1143 is supplied with a potential of a signal IN and the low-level power supply potential VSS.

In FIG. 22B, a transistor in which a channel formation region is formed using an oxide semiconductor is used as the switching element 1141, and the switching of the transistor is controlled by a signal Sig A supplied to a gate electrode thereof.

Note that FIG. 22B illustrates the configuration in which the switching element 1141 includes only one transistor; however, without limitation thereto, the switching element 1141 may include a plurality of transistors. In the case where the switching element 1141 includes a plurality of transistors which serves as switching elements, the plurality of transistors may be connected to each other in parallel, in series, or in combination of parallel connection and series connection.

Although the switching element 1141 controls the supply of the high-level power supply potential VDD to each of the memory elements 1142 included in the memory element group 1143 in FIG. 22B, the switching element 1141 may control the supply of the low-level power supply potential VSS.

In FIG. 22C, an example of a memory device in which each of the memory elements 1142 included in the memory element group 1143 is supplied with the low-level power supply potential VSS via the switching element 1141 is illustrated. The supply of the low-level power supply potential VSS to each of the memory elements 1142 included in the memory element group 1143 can be controlled by the switching element 1141.

When a switching element is provided between a memory element group and a node to which the power supply potential VDD or the power supply potential VSS is supplied, data can be held even in the case where the operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

This embodiment can be combined as appropriate with any of the above embodiments.

Embodiment 8

A semiconductor device having an image sensor function for reading information on an object can be manufactured with the use of a semiconductor device which is one embodiment of the present invention.

Figure 23A:
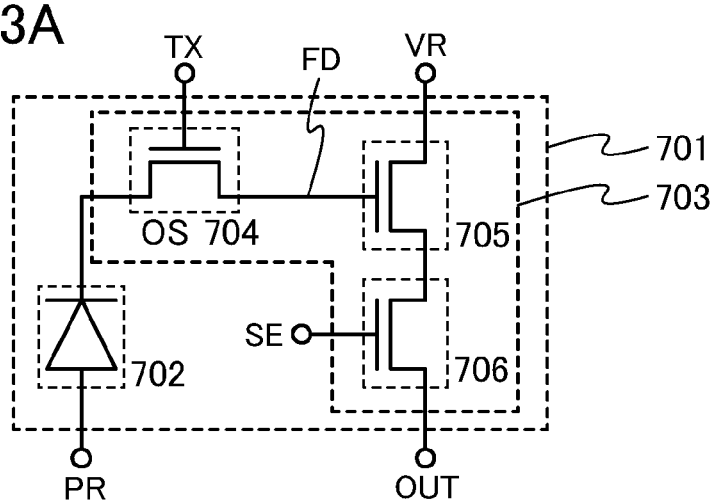
FIGS. 23A and 23B are a circuit diagram and a cross-sectional view which illustrate a semiconductor device according to one embodiment of the present invention.
Figure 23B:
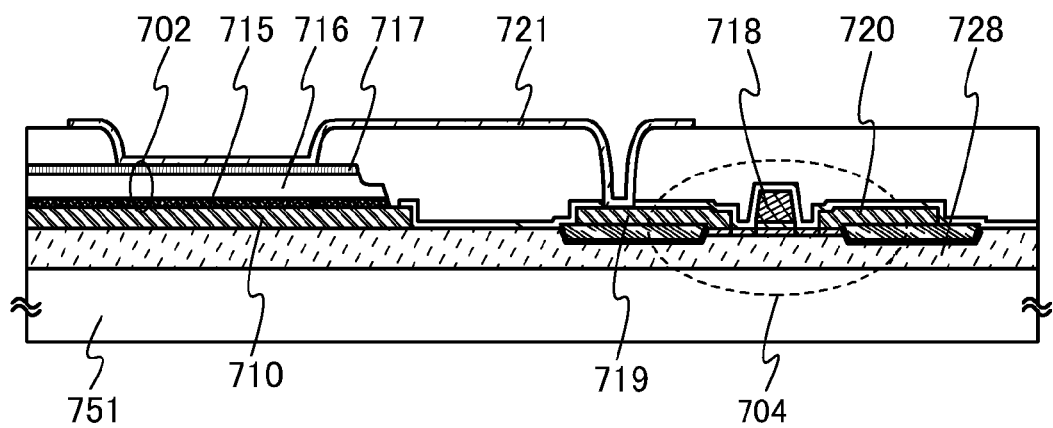

FIG. 23A illustrates an example of a semiconductor device having an image sensor function. FIG. 23A is an equivalent circuit of a photosensor, and FIG. 23B is a cross-sectional view illustrating part of the photosensor.

In FIG. 23A, a photosensor 701 includes a photodiode 702 and an amplifier circuit 703. The photodiode 702 is a photoelectric conversion element which generates current when a junction of semiconductors is exposed to light. The amplifier circuit 703 is a circuit which amplifies current obtained through light reception by the photodiode 702 or which holds charge accumulated due to the current. When light that enters the photodiode 702 is detected, the photosensor 701 can read information on an object to be detected. Note that a light source such as a backlight can be used at the time of reading information on the object to be detected.

The amplifier circuit 703 may have any configuration as long as it can amplify current generated in the photodiode 702; the amplifier circuit 703 includes at least a transistor 705 which amplifies current generated in the photodiode 702.

A specific configuration of the photosensor 701 in FIG. 23A will be described below, referring to one of a source electrode and a drain electrode as a first terminal and the other as a second terminal.

In the photosensor 701 in FIG. 23A, the amplifier circuit 703 includes a transistor 704, the transistor 705, and a transistor 706. The transistor 704 functions as a switching element which controls supply of the current to the amplifier circuit 703. The current value or the resistance value between a first terminal and a second terminal of the transistor 705 depends on a potential supplied to a second terminal of the transistor 704. The transistor 706 functions as a switching element for supplying the potential of an output signal, which is set in accordance with the current value or the resistance value, to a wiring OUT.

In this embodiment, any of the transistors described in Embodiments 1 to 5 can be applied to the transistor 704.

Specifically, in FIG. 23A, an anode of the photodiode 702 is connected to a wiring PR. A cathode of the photodiode 702 is connected to a first terminal of the transistor 704. The second terminal of the transistor 704 is connected to another semiconductor element included in the amplifier circuit 703, so that the connection of the second terminal of the transistor 704 differs depending on the configuration of the amplifier circuit 703; in FIG. 23A, the second terminal of the transistor 704 is connected to a gate electrode of the transistor 705. A gate electrode of the transistor 704 is connected to a wiring TX. The wiring TX is supplied with a potential of a signal for controlling the switching of the transistor 704. The first terminal of the transistor 705 is connected to a wiring VR which is supplied with a high-level power supply potential VDD. The second terminal of the transistor 705 is connected to a first terminal of the transistor 706. A second terminal of the transistor 706 is connected to the wiring OUT. A gate electrode of the transistor 706 is connected to a wiring SE, and the wiring SE is supplied with a potential of a signal for controlling the switching of the transistor 706. The wiring OUT is supplied with the potential of an output signal which is output from the amplifier circuit 703.

In FIG. 23A, a node where the second terminal of the transistor 704 and the gate electrode of the transistor 705 are connected to each other is denoted by a node FD. The potential of the output signal is determined by the amount of charge accumulated in the node FD. In order to hold charge in the node FD more reliably, a storage capacitor may be connected to the node FD.

Note that even when a circuit diagram illustrates independent components that are connected to each other, there is a case where one conductive film has functions of a plurality of components, such as the case where part of a wiring functions as an electrode. In this specification, the term "connection" also means such a case where one conductive film has functions of a plurality of components.

Note that FIG. 23A illustrates as an example the case where the wiring PR, the wiring TX, and the wiring OUT are connected to the photosensor 701; however, the number of wirings included in the photosensor 701 in one embodiment of the present invention is not limited to this. In addition to the above wirings, a wiring supplied with a power supply potential, a wiring supplied with a potential of a signal for resetting the amount of charge held by the amplifier circuit 703, or the like may be connected to the photosensor 701.

Note that although FIG. 23A illustrates the configuration of the photosensor 701 in which the amplifier circuit 703 includes only one transistor 704 functioning as a switching element, one embodiment of the present invention is not limited to this configuration. Although the configuration in which one transistor functions as one switching element is described in this embodiment, a plurality of transistors may function as one switching element. In the case where a plurality of transistors functions as one switching element, the plurality of transistors may be connected to each other in parallel, in series, or in combination of parallel connection and series connection.

In this specification, the state where transistors are connected to each other in series means, for example, the state where only one of a first terminal and a second terminal of a first transistor is connected to only one of a first terminal and a second terminal of a second transistor. Further, the state where transistors are connected to each other in parallel means a state where a first terminal of a first transistor is connected to a first terminal of a second transistor and a second terminal of the first transistor is connected to a second terminal of the second transistor.

Note that as the transistor 704 included in the amplifier circuit 703 in FIG. 23A, any of the transistors described in Embodiments 1 to 5 can be used. When an oxide semiconductor is used for the transistor 704, the off-state current of the transistor 704 can be significantly reduced. The transistor 704 functions as a switching element for holding charge accumulated in the photosensor 701; thus, leakage of the charge in a charge holding period can be suppressed.

FIG. 23B illustrates a cross section including the photodiode 702 and the transistor 704 in the photosensor 701.

The photodiode 702 included in the photosensor 701 includes, over a substrate 751, a p-type semiconductor film 715, an i-type semiconductor film 716, and an n-type semiconductor film 717 which are sequentially stacked. A conductive film 710 is connected to the p-type semiconductor film 715 functioning as the anode of the photodiode 702.

A conductive film 718 included in the photosensor 701 functions as the gate electrode of the transistor 704. A conductive film 719 included in the photosensor 701 functions as the first terminal of the transistor 704. A conductive film 720 included in the photosensor 701 functions as the second terminal of the transistor 704. A conductive film 721 included in the photosensor 701 is connected to the n-type semiconductor film 717 and the conductive film 719.

In FIG. 23B, the photosensor 701 includes the conductive film 710 functioning as the wiring PR. The conductive film 710, the conductive film 719, and the conductive film 720 can be formed by processing one conductive film formed over a base insulating film 728 into a desired shape.

Note that the cross-sectional view of the photosensor 701 in FIG. 23B shows a state after steps up to and including the step of forming the conductive film 721 are performed. In the case of a semiconductor display device, a display element as well as the photosensor 701 is provided; thus, practically, the display element is formed after the conductive film 721 is formed.

This embodiment can be combined as appropriate with any of the structures described in the other embodiments.

Embodiment 9

Figure 28:
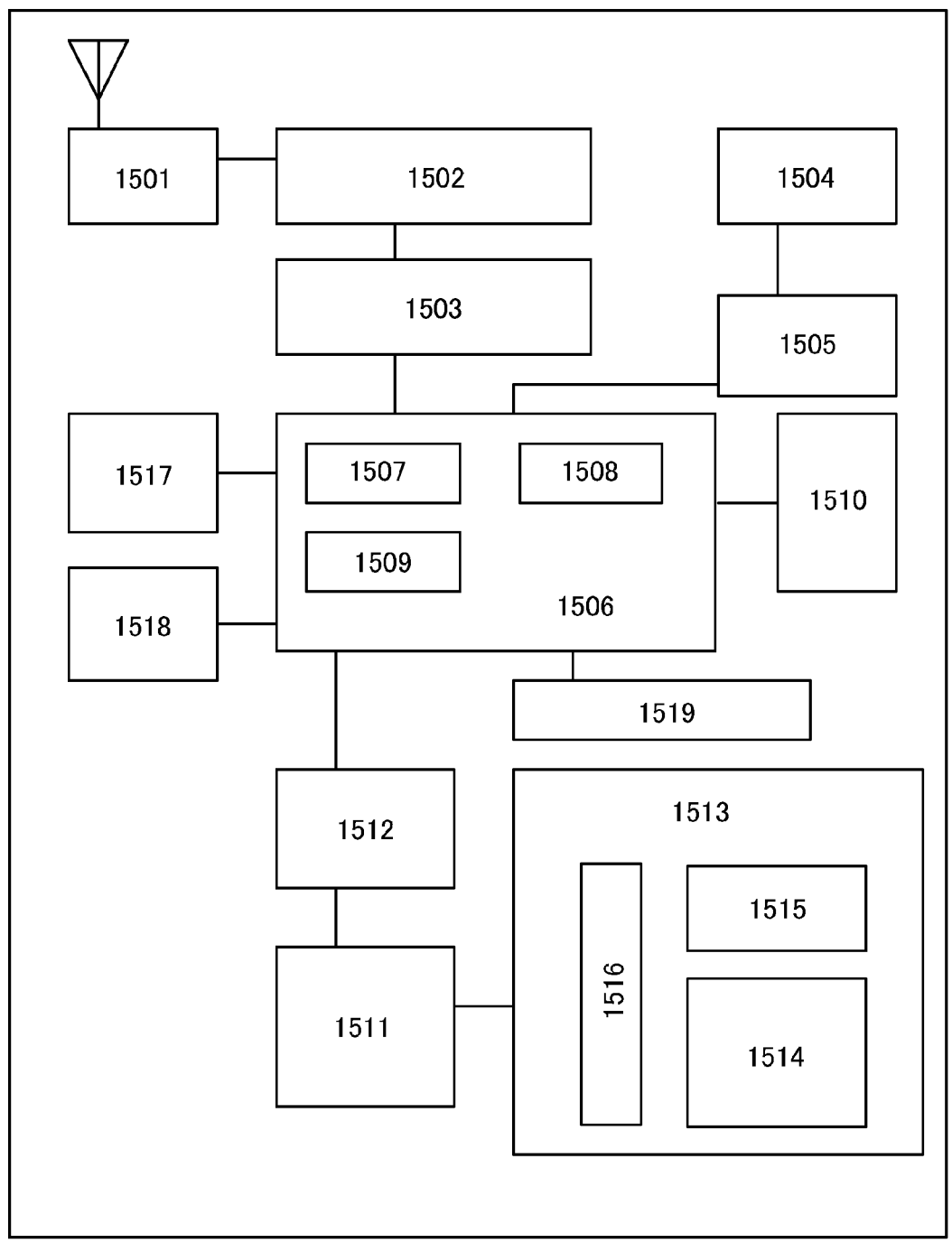
FIG. 28 is a block diagram which illustrates a specific example of a semiconductor device according to one embodiment of the present invention.

Next, FIG. 28 is a block diagram of a portable device. The portable device in FIG. 28 includes an RF circuit 1501, an analog base band circuit 1502, a digital base band circuit 1503, a battery 1504, a power supply circuit 1505, an application processor 1506, a flash memory 1510, a display controller 1511, a memory circuit 1512, a display 1513, a touch sensor 1519, an audio circuit 1517, a keyboard 1518, and the like. The display 1513 includes a display portion 1514, a source driver 1515, and a gate driver 1516. The application processor 1506 includes a CPU 1507, a DSP 1508, and an interface 1509 (I/F 1509). A memory circuit generally includes an SRAM or a DRAM, and the semiconductor device described in any of the above embodiments is used for the memory circuit 1512, whereby writing and reading of data can be performed at high speed, data can be stored for a long period, and power consumption can be sufficiently reduced.

Figure 29:
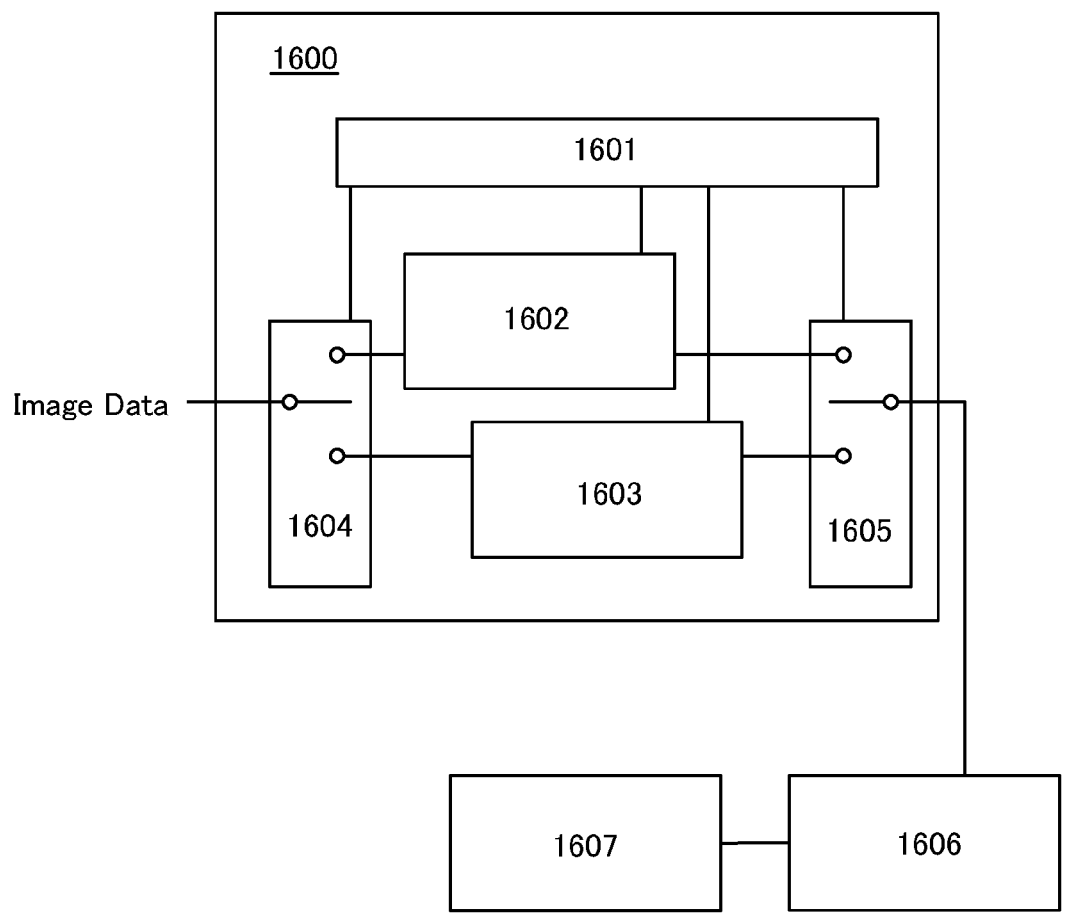
FIG. 29 is a block diagram which illustrates a specific example of a semiconductor device according to one embodiment of the present invention.

Next, FIG. 29 is an example in which the semiconductor device described in any of the above embodiments is used for a memory circuit 1600 of a display. The memory circuit 1600 in FIG. 29 includes a memory 1602, a memory 1603, a switch 1604, a switch 1605, and a memory controller 1601. The memory 1602 and the memory 1603 are formed using the semiconductor device described in any of the above embodiments.

First, image data is formed by an application processor (not shown). The formed image data (input image data 1) is stored in the memory 1602 through the switch 1604. Then, the image data stored in the memory 1602 (stored image data 1) is transmitted to a display 1607 through the switch 1605 and a display controller 1606.

In the case where the input image data is not changed, the stored image data 1 is read by the display controller 1606 from the memory 1602 through the switch 1605 at a frequency of approximately 30 Hz to 60 Hz in general.

Upon rewriting data on the screen (i.e., in the case where the input image data is changed), the application processor forms new image data (input image data 2). The input image data 2 is stored in the memory 1603 through the switch 1604. Also during this period, the stored image data 1 is read periodically from the memory 1602 through the switch 1605. After completion of storing the new image data (stored image data 2) in the memory 1603, reading of the stored image data 2 is started from the following frame of the display 1607; the stored image data 2 is transmitted to the display 1607 through the switch 1605 and the display controller 1606 to be displayed, which is repeated until the next new image data is stored in the memory 1602.

In this manner, data writing and data reading are performed alternately in the memory 1602 and the memory 1603, whereby display is performed on the display 1607. Note that the memory 1602 and the memory 1603 are not necessarily provided separately, and may be obtained by dividing one memory. The semiconductor device described in any of the above embodiments is used for the memory 1602 and the memory 1603, whereby writing and reading of data can be performed at high speed, data can be stored for a long period, and power consumption can be sufficiently reduced.

Figure 30:
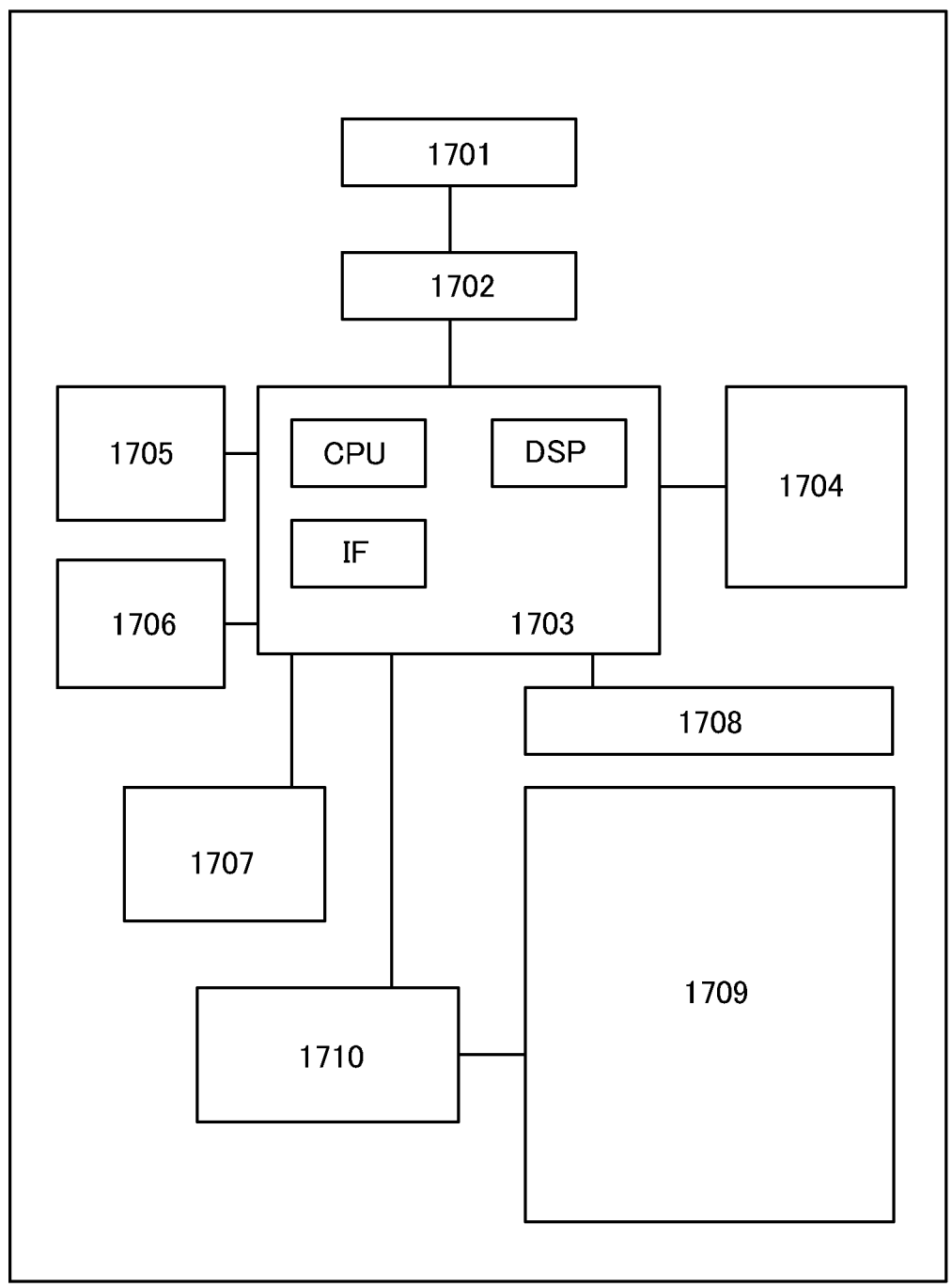
FIG. 30 is a block diagram which illustrates a specific example of a semiconductor device according to one embodiment of the present invention.

Next, FIG. 30 is a block diagram of an e-book reader. A battery 1701, a power supply circuit 1702, a microprocessor 1703, a flash memory 1704, an audio circuit 1705, a keyboard 1706, a memory circuit 1707, a touch panel 1708, a display 1709, and a display controller 1710 are shown in FIG. 30. One embodiment of the present invention can be applied to the memory circuit 1707. The memory circuit 1707 has a function of temporarily storing the content of a book. For example, a user uses a highlighting function in some cases. When a user reads an e-book, he or she sometimes wants to put a mark on a specific part in some cases. Such a marking function is called a highlighting function, by which characters are changed in color or type, underlined, or bold-faced, for example, so that a specific part is made to look distinct from the other part. In the function, information about the part specified by the user is stored and retained. In order to maintain the information for a long period, the information may be copied into the flash memory 1704. Also in such a case, the semiconductor device described in any of the above embodiments is used, whereby writing and reading of data can be performed at high speed, data can be stored for a long period, and power consumption can be sufficiently reduced.

Embodiment 10

In this embodiment, the case where the semiconductor device described in any of the above embodiments is applied to an electronic device will be described with reference to FIGS. 24A to 24F. In this embodiment, the case where the semiconductor device described in any of the above embodiments is applied to an electronic device such as a computer, a mobile phone (also referred to as a cellular phone or a mobile phone device), a portable information terminal (including a portable game console, an audio player, and the like), a digital camera, a digital video camera, electronic paper, or a television device (also referred to as a television or a television receiver) will be described.

FIG. 24A illustrates a laptop personal computer including a housing 801, a housing 802, a display portion 803, a keyboard 804, and the like. At least one of the housings 801 and 802 is provided with the semiconductor device described in any of the above embodiments. Therefore, a laptop personal computer in which writing and reading of data are performed at high speed, data is stored for a long period, and power consumption is sufficiently reduced can be realized.

FIG. 24B illustrates a personal digital assistant (PDA) including a display portion 813, an external interface 815, an operation button 814, and the like which are provided for a main body 811. Further, a stylus 812 or the like for operation of the personal digital assistant is provided. The semiconductor device described in any of the above embodiments is provided in the main body 811. Therefore, a personal digital assistant in which writing and reading of data are performed at high speed, data is stored for a long period, and power consumption is sufficiently reduced can be realized.

FIG. 24C illustrates an e-book reader 820 mounted with electronic paper, which includes two housings, a housing 821 and a housing 823. The housing 821 and the housing 823 are provided with a display portion 825 and a display portion 827, respectively. The housings 821 and 823 are connected by a hinge portion 837 and can be opened or closed using the hinge portion 837 as an axis. The housing 821 is provided with a power switch 831, an operation key 833, a speaker 835, and the like. The semiconductor device described in any of the above embodiments is provided in at least one of the housings 821 and 823. Therefore, an e-book reader in which writing and reading of data are performed at high speed, data is stored for a long period, and power consumption is sufficiently reduced can be realized.

FIG. 24D illustrates a mobile phone including two housings, a housing 840 and a housing 841. Further, the housings 840 and 841 in a state where they are developed as illustrated in FIG. 24D can be slid to overlap with each other; in this manner, the size of the mobile phone can be reduced, which makes the mobile phone suitable for being carried. In addition, the housing 841 is provided with a display panel 842, a speaker 843, a microphone 844, an operation key 845, a pointing device 846, a camera lens 847, an external connection terminal 848, and the like. The housing 840 is provided with a solar cell 849 for charging the mobile phone, an external memory slot 850, and the like. In addition, an antenna is incorporated in the housing 841. The semiconductor device described in any of the above embodiments is provided in at least one of the housings 840 and 841. Therefore, a mobile phone in which writing and reading of data are performed at high speed, data is stored for a long period, and power consumption is sufficiently reduced can be realized.

FIG. 24E illustrates a digital camera which includes a main body 861, a display portion 867, an eyepiece 863, an operation switch 864, a display portion 865, a battery 866, and the like. The semiconductor device described in any of the above embodiments is provided in the main body 861. Therefore, a digital camera in which writing and reading of data are performed at high speed, data is stored for a long period, and power consumption is sufficiently reduced can be realized.

FIG. 24F illustrates a television set 870 including a housing 871, a display portion 873, a stand 875, and the like. The television set 870 can be operated with a switch included in the housing 871 or with a remote controller 880. The semiconductor device described in any of the above embodiments is mounted on the housing 871 and the remote controller 880. Therefore, a television set in which writing and reading of data are performed at high speed, data is stored for a long period, and power consumption is sufficiently reduced can be realized.

As described above, the semiconductor device according to any of the above embodiments is mounted on each of the electronic devices described in this embodiment. Accordingly, electronic devices with low power consumption can be realized.

This application is based on Japanese Patent Application serial no. 2011-014620 filed with the Japan Patent Office on Jan. 26, 2011, the entire contents of which are hereby incorporated by reference.

What is claimed is:

1. A semiconductor device comprising:
a first insulating film over a substrate, the first insulating film comprising a depression;
an oxide semiconductor film over the first insulating film;
a second insulating film in contact with a side face of the oxide semiconductor film;
a third insulating film over the second insulating film;
a source electrode and a drain electrode over the oxide semiconductor film;
a gate insulating film over the oxide semiconductor film; and
a gate electrode over the gate insulating film,
wherein the second insulating film and the third insulating film are positioned inside the depression of the first insulating film, and
wherein the second insulating film and the third insulating film are not in contact with a top surface of the oxide semiconductor film.

2. The semiconductor device according to claim 1, wherein a lower surface of the second insulating film is provided on the substrate side with respect to an interface between the first insulating film and the oxide semiconductor film.

3. The semiconductor device according to claim 1, wherein the oxide semiconductor film comprises a c-axis aligned crystalline region.

4. The semiconductor device according to claim 1, wherein the oxide semiconductor film comprises one or more elements selected from In, Ga, Sn, and Zn.

5. The semiconductor device according to claim 1, wherein the first insulating film comprises more oxygen than a stoichiometric proportion.

6. The semiconductor device according to claim 1,
wherein the oxide semiconductor film comprises a first region, a second region, and a third region,
wherein the first region and the gate electrode overlap each other,
wherein the second region is positioned between the first region and the third region,
wherein the third region is in contact with one of the source electrode and the drain electrode, and
wherein the second region comprises a dopant while the first region and the third region do not comprise the dopant.

7. The semiconductor device according to claim 6, wherein the dopant is at least one of nitrogen, phosphorus and arsenic at a concentration of higher than or equal to $5 \times 10^{18}$ atoms/cm$^3$ and lower than or equal to $1 \times 10^{22}$ atoms/cm$^3$.

8. The semiconductor device according to claim 6, wherein the dopant is at least one of hydrogen, helium, neon, argon, krypton, and xenon at a concentration of higher than or equal to $5 \times 10^{18}$ atoms/cm$^3$ and lower than or equal to $1 \times 10^{22}$ atoms/cm$^3$.

9. The semiconductor device according to claim 1, wherein the top surface of the oxide semiconductor film and a top surface of the third insulating film are aligned with each other.

10. A semiconductor device comprising:
a first insulating film over a substrate, the first insulating film comprising a depression;
an oxide semiconductor film over the first insulating film;
a second insulating film in contact with a side face of the oxide semiconductor film;
a source electrode and a drain electrode over the oxide semiconductor film;
a gate insulating film over the oxide semiconductor film; and
a gate electrode over the gate insulating film,
wherein the second insulating film is positioned inside the depression of the first insulating film, and
wherein the second insulating film is not in contact with a top surface of the oxide semiconductor film.

11. The semiconductor device according to claim 10, wherein the oxide semiconductor film comprises a c-axis aligned crystalline region.

12. The semiconductor device according to claim 10, wherein the oxide semiconductor film comprises one or more elements selected from In, Ga, Sn, and Zn.

13. The semiconductor device according to claim 10, wherein the first insulating film comprises more oxygen than a stoichiometric proportion.

14. The semiconductor device according to claim 10, wherein the top surface of the oxide semiconductor film and a top surface of the second insulating film are aligned with each other.

15. A semiconductor device comprising:
a first insulating film over a substrate, the first insulating film comprising a depression;
an oxide semiconductor film over the first insulating film;
a second insulating film in contact with a side face of the oxide semiconductor film;
a source electrode and a drain electrode over the oxide semiconductor film;
a gate insulating film over the oxide semiconductor film; and
a gate electrode over the gate insulating film,
wherein the oxide semiconductor film comprises a first region, a second region, and a third region,
wherein the first region and the gate electrode overlap each other,
wherein the second region is positioned between the first region and the third region,
wherein the third region is in contact with one of the source electrode and the drain electrode,
wherein the second region comprises a dopant while the first region and the third region do not comprise the dopant,
wherein the second insulating film is positioned inside the depression of the first insulating film, and
wherein the second insulating film is not in contact with a top surface of the oxide semiconductor film.

16. The semiconductor device according to claim 15, wherein the oxide semiconductor film comprises a c-axis aligned crystalline region.

17. The semiconductor device according to claim 15, wherein the oxide semiconductor film comprises one or more elements selected from In, Ga, Sn, and Zn.

18. The semiconductor device according to claim 15, wherein the first insulating film comprises more oxygen than a stoichiometric proportion.

19. The semiconductor device according to claim 15, wherein the dopant is at least one of nitrogen, phosphorus and arsenic at a concentration of higher than or equal to $5\times10^{18}$ atoms/cm$^3$ and lower than or equal to $1\times10^{22}$ atoms/cm$^3$.

20. The semiconductor device according to claim 15, wherein the dopant is at least one of hydrogen, helium, neon, argon, krypton, and xenon at a concentration of higher than or equal to $5\times10^{18}$ atoms/cm$^3$ and lower than or equal to $1\times10^{22}$ atoms/cm$^3$.

21. The semiconductor device according to claim 15, wherein the top surface of the oxide semiconductor film and a top surface of the second insulating film are aligned with each other.

* * * * *